(12) United States Patent (10) Patent No.: US 8,895,974 B2
Sugimoto et al. (45) Date of Patent: Nov. 25, 2014

(54) ORGANIC EL DISPLAY DEVICE AND METHOD FOR MANUFACTURING THE SAME

(75) Inventors: Hiroshi Sugimoto, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/980,310

(22) PCT Filed: Jan. 31, 2012

(86) PCT No.: PCT/JP2012/000603
§ 371 (c)(1),
(2), (4) Date: Jul. 17, 2013

(87) PCT Pub. No.: WO2012/108142
PCT Pub. Date: Aug. 16, 2012

(65) Prior Publication Data
US 2013/0299808 A1 Nov. 14, 2013

(30) Foreign Application Priority Data
Feb. 7, 2011 (JP) .................. 2011-023987

(51) Int. Cl.
*H01L 29/08* (2006.01)
*H01L 21/00* (2006.01)
*H01L 51/56* (2006.01)
*H01L 27/32* (2006.01)
*H01L 51/52* (2006.01)

(52) U.S. Cl.
CPC ............ *H01L 51/5203* (2013.01); *H01L 51/56* (2013.01); *H01L 27/3258* (2013.01); *H01L 51/5271* (2013.01); *H01L 2251/5323* (2013.01)
USPC ............................................. 257/40; 438/82

(58) Field of Classification Search
CPC .......... H01L 51/52; H01L 51/56; H01L 27/32
USPC .............. 257/40, 72, 79, 89, 88; 438/149, 29; 313/500–506
See application file for complete search history.

(56) References Cited

U.S. PATENT DOCUMENTS

2002/0014628 A1* 2/2002 Koyama ........................ 257/72
2005/0062407 A1* 3/2005 Suh et al. ..................... 313/504
(Continued)

FOREIGN PATENT DOCUMENTS

| JP | 2005-340202 A | 12/2005 |
| JP | 2006-140127 A | 6/2006 |
| JP | 2007-73249 A | 3/2007 |

OTHER PUBLICATIONS

International Search Report received for PCT Patent Application No. PCT/JP2012/000603 mailed on May 1, 2012, 5 pages (2 pages of English Translation and 3 pages of ISR).

*Primary Examiner* — Chuong A Luu
*Assistant Examiner* — Sheikh Maruf
(74) *Attorney, Agent, or Firm* — Morrison & Foerster LLP

(57) ABSTRACT

In an organic EL display device (100), an insulating layer (113) includes a first insulating film (113*a*) and a second insulating film (113*b*) provided thereabove, a plurality of upper electrodes (115*c*) are each provided to cover a corresponding one of a plurality of organic EL layers (115*b*), and a reflection film (114) is provided between the first insulating film (113*a*) and the second insulating film (113*b*), corresponding to a region N other than the a light emission region. The reflection film (114) reflects toward a sealing substrate (120) a portion of light generated in each organic EL layer (115*b*) which is diffused into the region N other than the light emission region so that the portion of the light is transmitted through a separation wall portion (116) and the sealing substrate (120) to be viewed as an image on the sealing substrate.

17 Claims, 40 Drawing Sheets

(56) References Cited

U.S. PATENT DOCUMENTS

| | | | |
|---|---|---|---|
| 2005/0093434 A1* | 5/2005 | Suh et al. | 313/504 |
| 2005/0093435 A1* | 5/2005 | Suh et al. | 313/504 |
| 2005/0151830 A1* | 7/2005 | Yamazaki | 347/238 |
| 2005/0258740 A1 | 11/2005 | Kim | |
| 2006/0097251 A1* | 5/2006 | Kang | 257/40 |
| 2006/0097631 A1* | 5/2006 | Lee | 313/504 |
| 2008/0081105 A1* | 4/2008 | Suh et al. | 427/58 |
| 2009/0073093 A1* | 3/2009 | Yamazaki | 345/76 |

\* cited by examiner

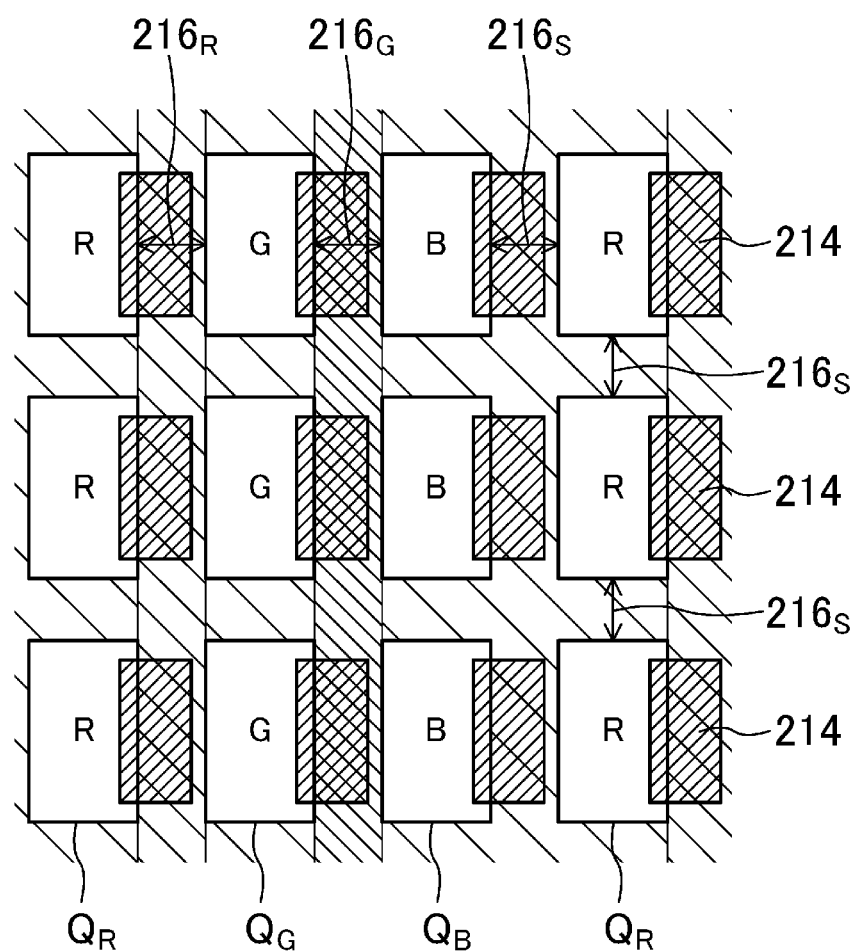

ORGANIC EL DISPLAY DEVICE AND METHOD FOR MANUFACTURING THE SAME

CROSS REFERENCE TO RELATED APPLICATIONS

This is a U.S. National Phase patent application of PCT/JP2012/000603, filed Jan 31, 2012, which claims priority to Japanese patent application no. 2011-023987, filed Feb. 7, 2011, each of which is hereby incorporated by reference in the present disclosure in its entirety.

TECHNICAL FIELD

The present invention relates to double-sided display type organic EL display devices which display an image on both sides of a panel thereof, and methods for manufacturing such display devices.

BACKGROUND ART

Organic electroluminescence (hereinafter also referred to as "organic EL") display devices have in recent years attracted attention as flat panel displays which are excellent in terms of low voltage drive, all solid state, high speed response, self-emission, etc. An organic EL display device includes an organic EL substrate on which organic EL elements are formed, and a sealing substrate which faces the organic EL substrate and seals the organic EL elements. The organic EL substrate has, for example, the following structure: thin film transistors (hereinafter also referred to as "TFTs") are formed on a glass substrate; a planarization film is formed for planarization and insulation of a surface of the glass substrate on which the TFTs are provided; and lower electrodes, an organic layer, and upper electrodes are successively formed, on top of one another, on the planarization film.

Organic EL display devices are roughly divided into the bottom emission type which allows light to be extracted through the side on which the lower electrodes are provided (see FIG. 44), and the top emission type which allows light to be extracted through the side on which the upper electrodes are provided (see FIG. 45). In a bottom emission type organic EL display device, the lower electrode is a transparent electrode of ITO etc., and the upper electrode is a light reflective metal electrode. On the other hand, in a typical top emission type organic EL display device, the lower electrode is a light reflective metal electrode, and the upper electrode is a semi-transparent electrode.

In recent years, on the mobile telephone market, there has been an increasing demand for display devices which can display an image on both front and back sides thereof, i.e., a primary screen (main display) and a secondary screen (sub-display). It has been desired to provide thin and light double-sided display devices having high display quality. In addition to the mobile telephone market, in the fields of display devices (mobile viewers) included in mobile devices, such as multimedia players etc., large-size information bulletin boards (digital signage), etc., the use of double-sided display devices has been expected to increase the range of design or expression or to provide the space saving effect.

Double-sided display devices currently in practical use have two display panels with their backs facing each other. Therefore, there is a limit on a reduction in thickness and weight of the double-sided display device, and at the same time, the use of two display panels is disadvantageous in terms of cost. Therefore, it is desirable that double-sided display be performed using a single display panel.

As a display device which performs double-sided display using a single display panel, a light emitting type display device is preferable. Attempts have been made to provide an organic EL display device which can perform double-sided display.

PATENT DOCUMENT 1 describes a double-sided organic EL display device in which bottom emission type organic EL elements and top emission type organic EL elements are formed, one on top of the other, on a single pixel circuit.

PATENT DOCUMENT 2 describes an organic EL display device in which each pixel region includes a first region which emits light downward and a second region which emits light upward.

PATENT DOCUMENT 3 describes an organic EL display device in which TFTs, a planarization film, a reflection film, lower electrodes, an organic EL layer, and upper electrodes are successively formed, on top of one another, on a glass substrate, and the reflection film has an opening in a light emission region or the reflection film is provided in an island-like pattern in a light emission region.

CITATION LIST

Patent Documents

PATENT DOCUMENT 1: Japanese Patent Publication No. 2007-073249
PATENT DOCUMENT 2: Japanese Patent Publication No. 2005-340202
PATENT DOCUMENT 3: Japanese Patent Publication No. 2006-140127

SUMMARY OF THE INVENTION

Technical Problem

However, in the double-sided organic EL display device of PATENT DOCUMENT 1, the bottom emission type organic EL elements and the top emission type organic EL elements are formed one on top of the other, and therefore, the number of layers significantly increases, or the step of patterning electrodes or an insulating film on the organic layer is required, leading to a complicated configuration or a decrease in yield. Also, in the double-sided organic EL display device of PATENT DOCUMENT 1, it is necessary to cause a large current to flow in order to provide a sufficient amount of light for front-side display and back-side display, disadvantageously leading to an increase in power consumption.

In the double-sided organic EL display device of PATENT DOCUMENT 2, each pixel region is divided into the upward emission region and the downward emission region in order to perform double-sided display. Therefore, the luminance of display on each side decreases. Therefore, it is necessary to cause a large current to flow in the organic EL element, disadvantageously leading to an increase in power consumption, a decrease in device life, and a degradation in reliability. Also, because organic EL elements for upward emission and organic EL elements for downward emission are formed, the manufacturing process is complicated, leading to a decrease in yield.

In the double-sided organic EL display device of PATENT DOCUMENT 3, similar to the configuration of PATENT DOCUMENT 2, each pixel region is divided into an upward emission region (a region with the reflection film) and a downward emission region (a region without the reflection film) in order to perform double-sided display. Therefore, the luminance of display on each side decreases. Therefore, it is necessary to cause a large current to flow in the organic EL element, disadvantageously leading to an increase in power consumption, a decrease in device life, and a degradation in reliability. Also, the lower electrode has an opening or is formed above the island-like pattern reflection film, and therefore, an uneven surface (a step-like portion) occurs in the lower electrode, so that it is difficult to form an organic layer having a uniform thickness on the lower electrode. As a result, a short circuit is likely to occur between the lower electrode and the upper electrode.

It is an object of the present invention to provide a double-sided display type organic EL display device which displays an image on both sides of a panel thereof, without an increase in power consumption and with good display quality.

Solution to the Problem

A first invention for achieving the above object is an organic EL display device including an organic EL substrate having a plurality of light emission regions arranged in a matrix, and a sealing substrate, the organic EL substrate and the sealing substrate facing each other, and having a frame-like non-display region provided at a circumferential portion of the substrates, and a display region provided on an inner side of the frame-like non-display region. The organic EL substrate includes an organic EL substrate body, a plurality of switching elements provided on the organic EL substrate body, each corresponding to one of the plurality of light emission regions, an insulating layer covering the organic EL substrate body and the plurality of switching elements and having a flat surface, a plurality of lower electrodes of a light transmissive material provided on the insulating layer, each corresponding to one of the plurality of light emission regions, a separation wall portion of a light transmissive material provided on the insulating layer, corresponding to a region other than the light emission regions, and configured to separate the plurality of light emission regions from each other, a plurality of organic EL layers each covering a corresponding one of the plurality of lower electrodes, and an upper electrode of a light reflective material covering the plurality of organic EL layers. Light generated in the organic EL layers is propagated to the organic EL substrate body to be viewed as an image on the organic EL substrate. The insulating layer includes a first insulating film and a second insulating film provided thereabove. There are a plurality of the upper electrodes each covering a corresponding one of the plurality of organic EL layers. A reflection film is provided between the first and second insulating films, corresponding to the region other than the light emission regions, and is configured to reflect toward the sealing substrate a portion of light generated in each of the organic EL layers which is diffused into the region other than the light emission regions so that the portion of the light is transmitted through the separation wall portion and the sealing substrate to be viewable as an image on the sealing substrate.

According to the first invention, the reflection film is provided between the first and second insulating films, corresponding to the region other than the light emission regions. The reflection film is disposed to reflect toward the sealing substrate a portion of light generated in each of the organic EL layers which is diffused into the region other than the light emission regions so that the portion of the light is transmitted through the separation wall portion and the sealing substrate to be viewable as an image on the sealing substrate. Therefore, light generated in the organic EL layers is propagated to the organic EL substrate body to be viewed as an image on the organic EL substrate, while light which is propagated toward the organic EL substrate body and is diffused in a diagonal direction into the region other than the light emission regions is reflected by the reflection film to enter the separation wall portion. The upper electrodes are each provided to cover the corresponding one of the organic EL layers, and therefore, the top surface of the separation wall portion is not covered by the upper electrodes. Therefore, the light entering the separation wall portion is transmitted through the separation wall portion without being blocked to enter the sealing substrate, and therefore, is viewed from the outside as an image on the sealing substrate. In other words, by driving a single panel, an image can be displayed on both sides thereof, i.e., the organic EL substrate and the sealing substrate.

According to the first invention, light emitted in a diagonal direction, which is conventionally not effectively used, is used to display an image on the sealing substrate, and therefore, even when double-sided display is performed, the light emission luminance of display on the organic EL substrate is not likely to significantly decrease, and the power consumption is not likely to increase.

In this case, light is transmitted through the separation wall portion corresponding to the region other than the light emission regions to be emitted to the sealing substrate and is therefore viewed as an image on the sealing substrate. Therefore, the large region surrounding the light emission regions is used as a light emission region on the sealing substrate to display an image. Light of the light emission regions is reflected by the reflection film and blended together in the separation wall portion before being displayed on the sealing substrate. Therefore, the boundary between each light emission region on the sealing substrate is less viewable. Therefore, an image can be displayed with high display quality on the sealing substrate as well.

According to the first invention, the second insulating film is provided to cover the reflection film and have a flat surface, i.e., the insulating layer has a flat surface. Therefore, variations in thickness of the organic EL elements including the lower electrode, the organic EL layer, and the upper electrode, which are provided on the insulating layer, are reduced or prevented, resulting in the highly reliable organic EL elements.

According to the first invention, when light generated in the organic EL layers travels toward the organic EL substrate body, the light is propagated through the insulating layer to enter the organic EL substrate body, or is reflected by the reflection film to enter and pass through the separation wall portion 116 directly to the sealing substrate. Therefore, the light does not travel in a gas, and therefore, the loss of the light can be reduced or prevented.

According to the first invention, the upper electrode is formed of a light reflective material and the lower electrode is formed of a light transmissive material. Therefore, an image can be displayed on the sealing substrate without taking into consideration the problem that the color purity or luminance varies depending on the viewing angle due to the influence of interference of light (microcavity effect) which is caused by the light being multiply reflected between the lower and upper electrodes.

A second invention is the first invention in which the reflection film overlaps a circumferential portion of each of the light emission regions.

According to the second invention, the non-transparent upper electrode and the non-transparent reflection film overlap, whereby it is possible to reduce or prevent a reduction in display quality which is caused by external light passing through the organic EL panel and being thereby viewed on the opposite side of the panel. In addition, the reflection film overlaps a circumferential portion of the light emission region. Therefore, the problem that the light emission area of the light emission region significantly decreases and therefore the luminance of image display on the organic EL substrate decreases, does not arise.

A third invention is the first or second invention in which the separation wall portion functions as a spacer which is in contact with and supports the sealing substrate.

According to the third invention, the separation wall portion functions as a spacer which is in contact with and supports the sealing substrate. Therefore, another spacer is not required in addition to the separation wall portion, and therefore, the aperture ratio of the organic EL display device can be increased. The top surface of the separation wall portion is not covered by the upper electrodes, and the separation wall portion itself is in contact with the sealing substrate. Therefore, the sealing substrate can be supported while a distance between the organic EL substrate and the sealing substrate can be maintained constant.

A fourth invention is any one of the first to third inventions in which the first and second insulating films are each formed of a material having the same refractive index.

According to the fourth invention, when light travels through an interface between the first and second insulating films, the light is not refracted, and therefore, the loss of the light can be reduced or prevented, resulting in excellent light extraction efficiency.

A fifth invention is any one of the first to fourth inventions in which the plurality of light emission regions include red light emission regions configured to emit red light, green light emission regions configured to emit green light, and blue light emission regions configured to emit blue light.

A sixth invention is any one of the first to fourth inventions in which the plurality of light emission regions include blue light emission regions. The separation wall portion includes a red conversion portion configured to convert blue light transmitted through the separation wall portion into red light, a green conversion portion configured to convert blue light transmitted through the separation wall portion into green light, and a transparent resin portion configured not to convert a wavelength of light transmitted through the separation wall portion. Blue light generated in the organic EL layers is propagated to the organic EL substrate body to be viewed as a monochromatic image on the organic EL substrate. A portion of the blue light which is diffused into the region other than the light emission regions is reflected by the reflection film toward the sealing substrate, and is then transmitted through the red and green conversion portions and the transparent resin portion to provide red, green, and blue light, respectively, which are then transmitted through the sealing substrate to be viewed as an RGB full color image on the sealing substrate.

According to the sixth invention, the plurality of light emission regions include blue light emission regions, and therefore, a monochromatic blue image can be displayed on the organic EL substrate. On the other hand, a portion of blue light which is reflected by the reflection film toward the sealing substrate is converted by the red and green conversion portions of the separation wall portion into red and green light, respectively, or is transmitted through the transparent resin portion of the separation wall portion. The resulting red, green, and blue light reach the sealing substrate to be viewed as an RGB full color image on the sealing substrate. In other words, according to the sixth invention, in the organic EL display device which performs double-sided display, a monochromatic image can be displayed on one side, while a full color image can be displayed on the other side.

Note that a color conversion filter can also be used to display a monochromatic image having a color other than blue on the organic EL substrate.

A seventh invention is any one of the first to sixth inventions in which the reflection film has an uneven surface.

According to the seventh invention, the reflection film has an uneven surface. Therefore, when light emitted by the organic EL layers is reflected by the reflection film, the light can be scattered in various directions. Therefore, when light reflected by the reflection film is viewed on the sealing substrate, the light contains many light components which travel in a front direction of the substrate, resulting in excellent display quality on the sealing substrate.

An eighth invention is the seventh invention in which the uneven surface is formed by recessed portions provided on the reflection film.

According to the eighth invention, the uneven surface is formed by recessed portions provided on a surface of the reflection film. Therefore, the uneven surface can be easily provided to the reflection film.

A ninth invention is a method for manufacturing an organic EL display device including an organic EL substrate having a plurality of light emission regions arranged in a matrix, and a sealing substrate, the organic EL substrate and the sealing substrate facing each other, and having a frame-like non-display region provided at a circumferential portion of the substrates, and a display region provided on an inner side of the frame-like non-display region. The method includes an organic EL substrate forming step of producing the organic EL substrate by forming a plurality of switching elements on a substrate body, each corresponding to one of the plurality of light emission regions, forming a first insulating layer covering the substrate body and the plurality of switching elements, forming a reflection film on the first insulating film, corresponding to a region other than the light emission regions, forming a second insulating film covering the first insulating film and the reflection film and having a flat surface, forming a plurality of lower electrodes on the second insulating film, each corresponding to one of the plurality of light emission regions, forming a separation wall portion on the second insulating film, corresponding to the region other than the light emission regions, to separate the plurality of light emission regions from each other, forming a plurality of organic EL layers each covering a corresponding one of the plurality of lower electrodes, and forming a plurality of upper electrodes each covering a corresponding one of the plurality of organic EL layers, and a substrate bonding step of disposing the organic EL substrate produced by the organic EL substrate forming step and the sealing substrate to face each other, and bonding the organic EL substrate and the sealing substrate together at the non-display region. In the organic EL substrate forming step, the reflection film is formed so that a portion of light generated in each of the organic EL layers which is diffused into the region other than the light emission regions is reflected by the reflection film, and is then transmitted through the separation wall portion and the sealing substrate to be viewed as an image on the sealing substrate.

According to the ninth invention, the reflection film is formed on the first insulating film, corresponding to the light emission regions. The reflection film is disposed to reflect toward the sealing substrate a portion of light generated in each of the organic EL layers which is diffused into the region other than the light emission regions so that the portion of the light is transmitted through the separation wall portion and the sealing substrate to be viewable as an image on the sealing substrate. Therefore, light generated in the organic EL layers is propagated to the organic EL substrate body to be viewed as an image on the organic EL substrate, while light which is propagated toward the organic EL substrate body and is diffused in a diagonal direction into the region other than the light emission regions is reflected by the reflection film to enter the separation wall portion. The upper electrodes are each provided to cover the corresponding one of the organic EL layers, and therefore, the top surface of the separation wall portion is not covered by the upper electrodes. Therefore, the light entering the separation wall portion is transmitted through the separation wall portion without being blocked to enter the sealing substrate, and therefore, is viewed from the outside as an image on the sealing substrate. In other words, by driving a single panel, an image can be displayed on both sides thereof, i.e., the organic EL substrate and the sealing substrate.

According to the ninth invention, light emitted in a diagonal direction, which is conventionally not effectively used, is used to display an image on the sealing substrate, and therefore, even when double-sided display is performed, the light emission luminance of display on the organic EL substrate is not likely to significantly decrease, and the power consumption is not likely to increase.

In this case, light is transmitted through the separation wall portion corresponding to the region other than the light emission regions to be emitted to the sealing substrate and is therefore viewed as an image on the sealing substrate. Therefore, the large region surrounding the light emission regions is used as a light emission region on the sealing substrate to display an image. Light of the light emission regions is reflected by the reflection film and blended together in the separation wall portion before being displayed on the sealing substrate. Therefore, the boundary between each light emission region on the sealing substrate is less viewable. Therefore, an image can be displayed with high display quality on the sealing substrate as well.

The ninth invention has other advantages similar to those of the first invention.

A tenth invention is the ninth invention in which, in the organic EL substrate forming step, the reflection film is formed to overlap a circumferential portion of each of the light emission regions.

According to the tenth invention, the non-transparent upper electrode and the non-transparent reflection film overlap, whereby it is possible to reduce or prevent a reduction in display quality which is caused by external light passing through the organic EL panel and being thereby viewed on the opposite side of the panel. In addition, the reflection film overlaps a circumferential portion of the light emission region. Therefore, the problem that the light emission area of the light emission region significantly decreases and therefore the luminance of image display on the organic EL substrate decreases, does not arise.

An eleventh invention is the ninth or tenth invention in which, in the substrate bonding step, the sealing substrate and the organic EL substrate are disposed to face each other so that the separation wall portion is in contact with and supports the sealing substrate.

According to the eleventh invention, the sealing substrate and the organic EL substrate are disposed to face each other so that the separation wall portion is in contact with and supports the sealing substrate. Therefore, another spacer is not required in addition to the separation wall portion, and therefore, the aperture ratio of the organic EL display device can be increased. The top surface of the separation wall portion is not covered by the upper electrodes, and the separation wall portion itself is in contact with the sealing substrate. Therefore, the sealing substrate can be supported while a distance between the organic EL substrate and the sealing substrate can be maintained constant.

A twelfth invention is any one of the ninth to eleventh inventions in which, in the organic EL substrate forming step, after the formation of the first insulating film, a recessed portion is formed on at least a surface of a region in which the reflection film is to be formed, and after the formation of the recessed portion, the reflection film is formed on top of the recessed portion formed on the surface of the first insulating film, whereby the reflection film having a recessed portion on a surface thereof is formed.

According to the twelfth invention, after a recessed portion is formed on the surface of the first insulating film, the reflection film is formed on top of the first insulating film. Therefore, a recessed portion is formed on the surface of the reflection film as well, corresponding to the recessed portion of the surface of the first insulating film. Because of the recessed portion formed on the surface of the reflection film, when light emitted by the organic EL layers is reflected by the reflection film, the light can be scattered in various directions. As a result, when light reflected by the reflection film is viewed on the sealing substrate, the light contains many light components which travel in a front direction of the substrate, resulting in excellent display quality on the sealing substrate.

A thirteenth invention is the twelfth invention in which a plurality of recessed portions are formed on the entire surface of the first insulating film.

According to the thirteenth invention, recessed portions are formed on the entire surface of the first insulating film in addition to the region where the reflection film is to be formed. Therefore, recessed portions can be easily formed on the first insulating film irrespective of the region where the reflection film is to be formed. The second insulating film is formed on a portion of the first insulating film in which a recessed portion is formed but the reflection film is not to be formed, whereby the recessed portion is filled with the second insulating film. In particular, when the first and second insulating films are each formed of a material having the same refractive index, then even if light travels through an interface between the recessed portion of the first insulating film and the second insulating film, the loss of the light does not occur, and therefore, the efficiency of light extraction does not decrease.

A fourteenth invention is an organic EL display device including an organic EL substrate having a plurality of light emission regions arranged in a matrix, and a sealing substrate, the organic EL substrate and the sealing substrate facing each other, and having a frame-like non-display region provided at a circumferential portion of the substrates, and a display region provided on an inner side of the frame-like non-display region. The organic EL substrate includes an organic EL substrate body, a plurality of switching elements provided on the organic EL substrate body, each corresponding to one of the plurality of light emission regions, an insulating layer covering the organic EL substrate body and the plurality of switching elements and having a flat surface, a plurality of lower electrodes of a light reflective material provided on the insulating layer, each corresponding to one of the plurality of light emission regions, a separation wall portion of a light transmissive material provided on the insulating layer, corresponding to a region other than the light emission regions, and configured to separate the plurality of light emission regions from each other, a plurality of organic EL layers each covering a corresponding one of the plurality of lower electrodes, and an upper electrode of a light transmissive material or a light semi-transmissive material covering the plurality of organic EL layers. Light generated in the organic EL layers is propagated to the sealing substrate to be viewed as an image on the sealing substrate. There are a plurality of the upper electrodes each covering a corresponding one of the plurality of organic EL layers. A reflection film is provided on a surface closer to the organic EL substrate of the sealing substrate, corresponding to the region other than the light emission regions, and is configured to reflect toward the organic EL substrate a portion of light generated in each of the organic EL layers which is diffused into the region other than the light emission regions so that the portion of the light is transmitted through the separation wall portion and the organic EL substrate body substrate to be viewable as an image on the organic EL substrate.

According to the fourteenth invention, the reflection film is provided on the surface closer to the organic EL substrate of the sealing substrate, corresponding to the region other than the light emission regions, and is disposed to reflect toward the organic EL substrate body a portion of light generated in each of the organic EL layers which is diffused into the region other than the light emission regions so that the portion of the light is transmitted through the separation wall portion and the organic EL substrate body to be viewable as an image on the organic EL substrate. Therefore, light generated in the organic EL layers is propagated to the sealing substrate to be viewed as an image on the sealing substrate, while light which is propagated toward the sealing substrate and is diffused in a diagonal direction into the region other than the light emission regions is reflected by the reflection film to enter the separation wall portion. In this case, because the upper electrodes are each provided to cover the corresponding one of the organic EL layers, i.e., the top surface of the separation wall portion is not covered by the upper electrodes, the light reflected by the reflection film can enter the separation wall portion. The light entering the separation wall portion is transmitted through the separation wall portion without being blocked to enter the organic EL substrate body, and therefore, is viewed from the outside as an image on the organic EL substrate. Therefore, by driving a single panel, an image can be displayed on both sides thereof, i.e., the organic EL substrate and the sealing substrate.

According to the fourteenth invention, light emitted in a diagonal direction, which is conventionally not effectively used, is used to display an image on the organic EL substrate, and therefore, even when double-sided display is performed, the light emission luminance of display on the sealing substrate is not likely to significantly decrease, and the power consumption is not likely to increase.

In this case, light is transmitted through the separation wall portion corresponding to the region other than the light emission regions to be emitted to the organic EL substrate body and is therefore viewed as an image on the organic EL substrate. Therefore, the large region surrounding the light emission regions is used as a light emission region on the organic EL substrate to display an image. Light of the light emission regions is reflected by the reflection film and blended together in the separation wall portion before being displayed on the organic EL substrate. Therefore, the boundary between each light emission region on the organic EL substrate is less viewable. Therefore, an image can be displayed with high display quality on the organic EL substrate as well.

A fifteenth invention is the fourteenth invention in which the upper electrode is formed of a light transmissive material.

According to the fifteenth invention, the upper electrode is formed of a light transmissive material. Therefore, an image can be displayed on the sealing substrate without taking into consideration the problem that the color purity or luminance varies depending on the viewing angle due to the influence of interference of light (microcavity effect) which is caused by the light being multiply reflected between the lower and upper electrodes.

A sixteenth invention is the fourteenth or fifteenth invention in which the reflection film overlaps a circumferential portion of each of the light emission regions.

According to the sixteenth invention, the non-transparent lower electrode and the non-transparent reflection film overlap, whereby it is possible to reduce or prevent a reduction in display quality which is caused by external light passing through the organic EL panel and being thereby viewed on the opposite side of the panel. In addition, the reflection film overlaps a circumferential portion of the light emission region. Therefore, the problem that the light emission area of the light emission region significantly decreases and therefore the luminance of image display on the organic EL substrate decreases, does not arise.

A seventeenth invention is any one of the fourteenth to sixteenth inventions in which a space between the organic EL substrate and the sealing substrate is filled with a transparent resin.

According to the seventeenth invention, when light emitted by the organic EL layer travels toward the sealing substrate, the light is transmitted through the transparent resin, but not through a gas, to enter the sealing substrate, or is reflected by the reflection film to enter the separation wall portion. Therefore, compared to the case where light travels in a gas when the space between the two substrates is not filled with a transparent resin, the loss of the light can be reduced or prevented.

Advantages of the Invention

According to the present invention, an image displayed on the sealing substrate or the organic EL substrate is formed using light which is emitted in a diagonal direction from the organic EL elements. In an organic EL display device having a conventional configuration, light emitted in a diagonal direction from the organic EL elements is confined between the substrates, and absorbed and thermally deactivated by component materials, or emitted from the end facets of the substrates, and therefore, is not effectively used. However, in the present invention, the light emitted in a diagonal direction is used to display an image on the sealing substrate, and therefore, even when double-sided display is performed, the light emission luminance of display on the organic EL substrate or the sealing substrate is not likely to significantly decrease, and the power consumption is not likely to increase. Therefore, the organic EL display device can display an image on both sides of the panel with high display quality and without an increase in power consumption.

BRIEF DESCRIPTION OF THE DRAWINGS

FIG. 1 is a schematic plan view of an organic EL display device according to a first embodiment.

FIG. 2 is a cross-sectional view taken along line II-II of FIG. 1.

FIG. 3 is an enlarged plan view of a display region of the organic EL display device of the first embodiment.

FIG. 4 is a cross-sectional view taken along line IV-IV of FIG. 3.

FIG. 5 is an enlarged plan view of one light emission region of an organic EL substrate of the first embodiment.

FIG. 6 is a cross-sectional view taken along line VI-VI of FIG. 5.

FIG. 7 is a schematic plan view of a layout of color light emission regions and reflection films of the organic EL substrate of the first embodiment.

FIG. 8 is a diagram for describing a shape of a separation wall portion of the organic EL display device of the first embodiment.

FIG. 9 is a diagram for describing another shape of the separation wall portion of the organic EL display device of the first embodiment.

[FIG. 10]

[FIG. 11]

FIG. 12 is a schematic plan view of a layout of color light emission regions and reflection films of an organic EL display device according to Variation 1.

FIG. 13 is a schematic plan view of a layout of color light emission regions and reflection films of an organic EL display device according to Variation 2.

FIG. 14 is a cross-sectional view of the organic EL display device of Variation 2.

FIG. 15 is a schematic plan view of a layout of color light emission regions and reflection films of an organic EL display device according to Variation 3.

FIG. 16 is a schematic plan view of a layout of color light emission regions and reflection films of an organic EL display device according to Variation 4.

FIG. 17 is a schematic plan view of a layout of color light emission regions and a reflection film of an organic EL display device according to Variation 5.

FIG. 18 is a schematic plan view of a layout of color light emission regions and reflection films of an organic EL display device according to Variation 6.

FIG. 19 is a schematic plan view of a layout of color light emission regions and reflection films of an organic EL display device according to Variation 7.

FIG. 20 is a cross-sectional view of an organic EL display device according to a second embodiment.

[FIG. 21]

[FIG. 22] FIG. 22 is a schematic plan view of a layout of the color light emission control regions, the separation wall portion (color conversion portions and transparent resin portions), and the reflection films of the organic EL display device of the second embodiment.

[FIG. 23]

FIG. 24 is a cross-sectional view of an organic EL display device according to Variation 8.

FIG. 25 is a schematic plan view of a layout of color light emission control regions, a separation wall portion (color conversion portions and transparent resin portions), and reflection films of the organic EL display device of Variation 8.

[FIG. 26]

FIG. 27 is a schematic plan view of a layout of the color light emission control regions, the separation wall portion (color conversion portions and transparent resin portions), and the reflection film of the organic EL display device of Variation 9.

[FIG. 28]

FIG. 29 is a schematic plan view of a layout of the color light emission control regions, the separation wall portion (color conversion portions and transparent resin portions), and the reflection film of the organic EL display device of Variation 10.

[FIG. 30]

FIG. 31 is a schematic plan view of a layout of the color light emission control regions, the separation wall portion (color conversion portions and transparent resin portions), and the reflection films of the organic EL display device of Variation 11.

FIG. 32 is a cross-sectional view of an organic EL display device according to Variation 12.

[FIG. 33]

FIG. 34 is a schematic plan view of a layout of the color light emission control regions, the separation wall portion (color conversion portions and transparent resin portions), and the reflection film of the organic EL display device of Variation 12.

FIG. 35 is a cross-sectional view in which a separation structure is provided in Variation 12.

FIG. 36 is a cross-sectional view of an organic EL display device according to Variation 13.

[FIG. 37]

FIG. 38 is a schematic plan view of a layout of the color light emission control regions, the separation wall portion (color conversion portions and transparent resin portions), and the reflection films of the organic EL display device of Variation 13.

FIG. 39 is a cross-sectional view of an organic EL display device according to a third embodiment.

FIG. 40 is a cross-sectional view of an organic EL display device according to a variation of the third embodiment.

FIG. 41 is a cross-sectional view of an organic EL display device according to a fourth embodiment.

FIG. 42 is a cross-sectional view of an organic EL display device according to Variation 14.

FIG. 43 is a cross-sectional view of an organic EL display device according to Variation 15.

FIG. 44 is a cross-sectional view of an example bottom emission type organic EL display device in the conventional art.

FIG. 45 is a cross-sectional view of an example top emission type organic EL display device in the conventional art.

DESCRIPTION OF EMBODIMENTS

Embodiments of the present invention will be described below by way of example with reference to the accompanying drawings.

<<First Embodiment>>

Firstly, an organic EL display device 100 according to a first embodiment will be described.

<Configuration of Organic EL Display Device 100>

Firstly, a configuration of the organic EL display device 100 will be described. The organic EL display device 100 is a display which displays an RGB full color image on both front and back sides thereof. The organic EL display device 100 is used, for example, as a display including a single display panel which serves as both a primary screen (main display) and a secondary screen (sub-display), in a mobile device (e.g., a mobile telephone, a multimedia player, etc.) which has a primary screen (main display) and a secondary screen (sub-display), or a display (e.g., an advertising display panel etc.) which displays an image on both front and back sides thereof.

Figure 1:
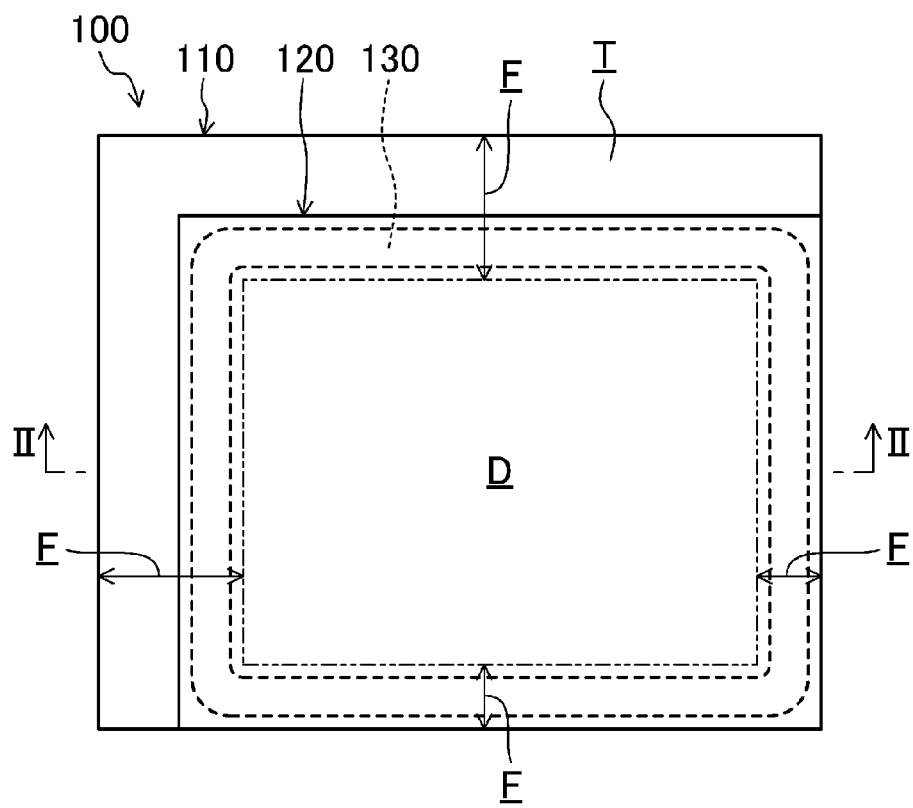
[FIG. 1]
Figure 2:
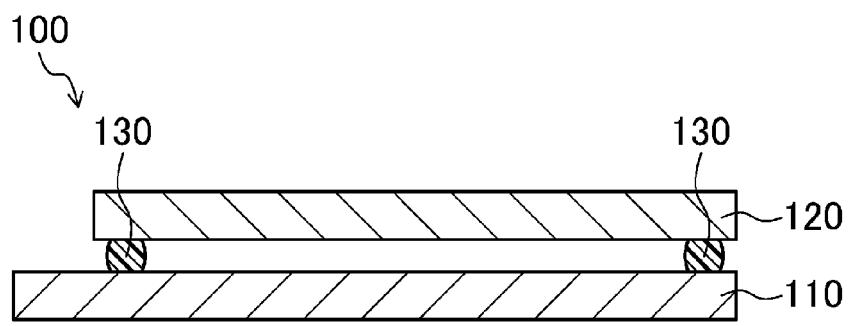
[FIG. 2]

FIGS. 1 and 2 are diagrams schematically showing an overall configuration of the organic EL display device 100. The organic EL display device 100 includes a flat plate-like organic EL substrate 110 and sealing substrate 120 which face each other. The organic EL display device 100 also has a display region D which is provided at a center of the substrate as viewed from above and is used to display an image, and a frame-like non-display region F which is provided at an outer circumferential portion of the substrates, surrounding the display region D. The organic EL substrate 110 and the sealing substrate 120 are bonded together using a sealing resin 130 in the non-display region F, with the sealed space being filled with an inert atmosphere. A polarizing plate may be provided on each of outer surfaces of the organic EL substrate 110 and the sealing substrate 120. The organic EL display device 100 has, for example, a length of 400-500 mm, a width of 300-400 mm, and a thickness of 1-30 mm.

Figure 3:
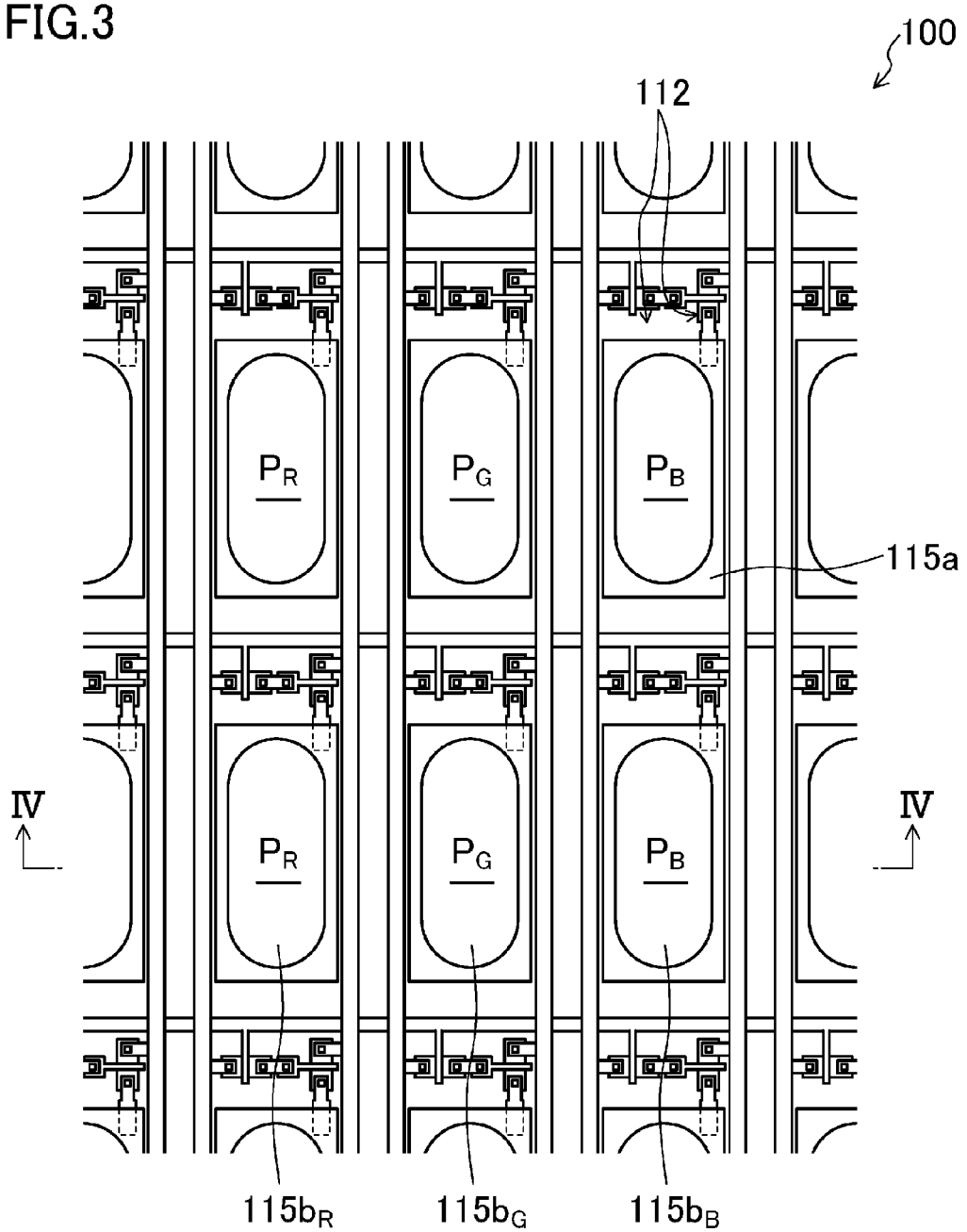
[FIG. 3]
Figure 4:
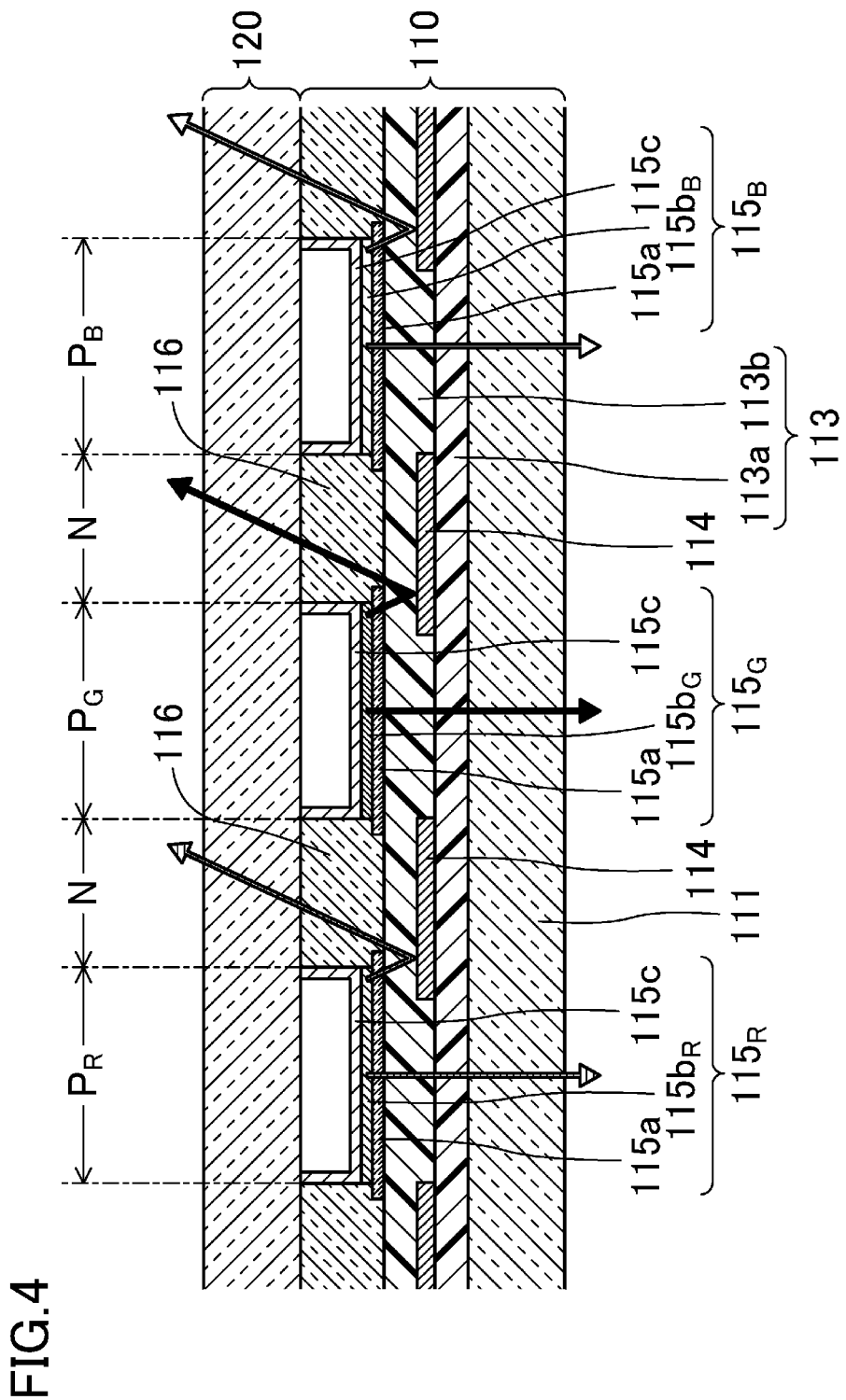
[FIG. 4]

FIGS. 3 and 4 are an enlarged plan view and a cross-sectional view, respectively, of the display region D of the organic EL display device 100. The organic EL display device 100 has, in the display region D, a plurality of red light emission regions $P_R$, green light emission regions $P_G$, and blue light emission regions $P_B$. A predetermined image is displayed in the entire display region D by the light emission regions $P_R$, $P_G$, and $P_B$ being driven independently of each other. The light emission regions $P_R$, $P_G$, and $P_B$ each have, for example, a length of about 200 ↑m and a width of about 50 μm. The light emission regions $P_R$, $P_G$, and $P_B$ are arranged in a matrix, for example, with a spacing of about 100 μm in the length direction and a space of about 50 μm in the width direction between each light emission region. A grid-like region other than the light emission regions $P_R$, $P_G$, and $P_B$ is a non-light emission region N.

—Organic EL Substrate 110—

The organic EL substrate 110 includes, on an organic EL substrate body 111, a plurality of TFTs 112 each provided as a switching element for a corresponding one of the light emission regions $P_R$, $P_G$, and $P_B$, an insulating layer 113 which covers the organic EL substrate body 111 and the TFTs 112, a plurality of red light emission organic EL elements $115_R$, green light emission organic EL elements $115_G$, and blue light emission organic EL elements $115_B$ formed on the insulating layer 113, corresponding to the red light emission regions $P_R$, the green light emission regions $P_G$, and the blue light emission regions $P_B$, and a separation wall portion 116 formed in a grid-like pattern, corresponding to the non-light emission region N, to separate the organic EL elements $115_R$, $115_G$, and $115_B$ from each other. Note that, in the description that follows and the drawings, the red light emission organic EL elements $115_R$, the green light emission organic EL elements $115_G$, and the blue light emission organic EL elements $115_B$ may also be collectively referred to as organic EL elements 115.

—Organic EL Substrate Body 111—

The organic EL substrate body 111 is, for example, an insulating substrate of glass etc. and has, for example, a length of about 320 mm, a width of about 400 mm, and a thickness of about 0.7 mm.

—Insulating Layer 113—

As shown in FIG. 4, the insulating layer 113 includes an interlayer insulating film 113a (first insulating film) closer to the organic EL substrate body 111, and a planarization film 113b (second insulating film) thereabove, which are provided one on top of the other. The interlayer insulating film 113a includes a first interlayer insulating film 113aa, a second interlayer insulating film 113ab, and a third interlayer insulating film 113ac which are provided on top of one another (see FIG. 6). The films included in the insulating layer 113 are each formed of, for example, an insulating film of a transparent material (e.g., silicon nitride etc.), or of a transparent insulating resin (e.g., a photosensitive acrylic resin etc.). The films (the interlayer insulating film 113a, the planarization film 113b, etc.) included in the insulating layer 113 are each preferably formed of a material having the same refractive index. As a result, when light travels through an interface between each film, the light is not refracted, and therefore, the loss of the light can be reduced or prevented.

A plurality of reflection films 114 are provided between the interlayer insulating film 113a and the planarization film 113b, corresponding to the non-light emission region N.

—TFT 112 and Interlayer Insulating Film 113a—

Figure 5:
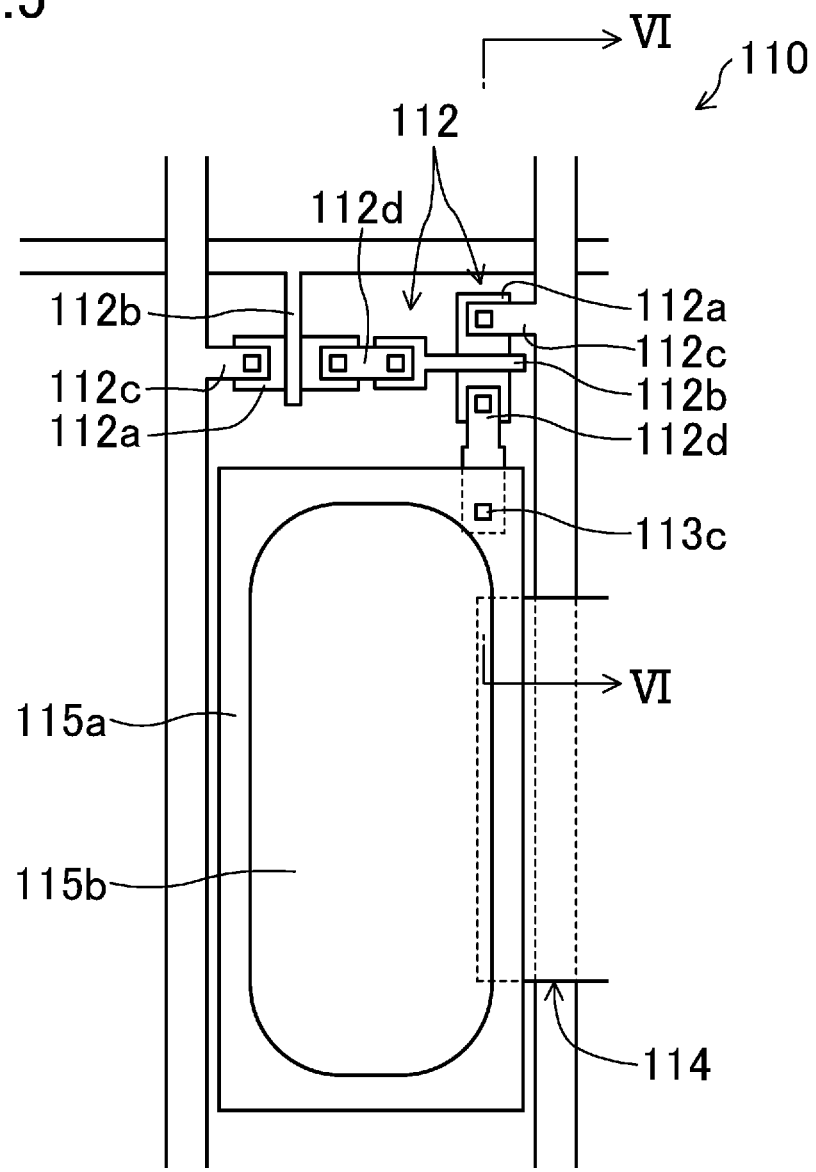
[FIG. 5]
Figure 6:
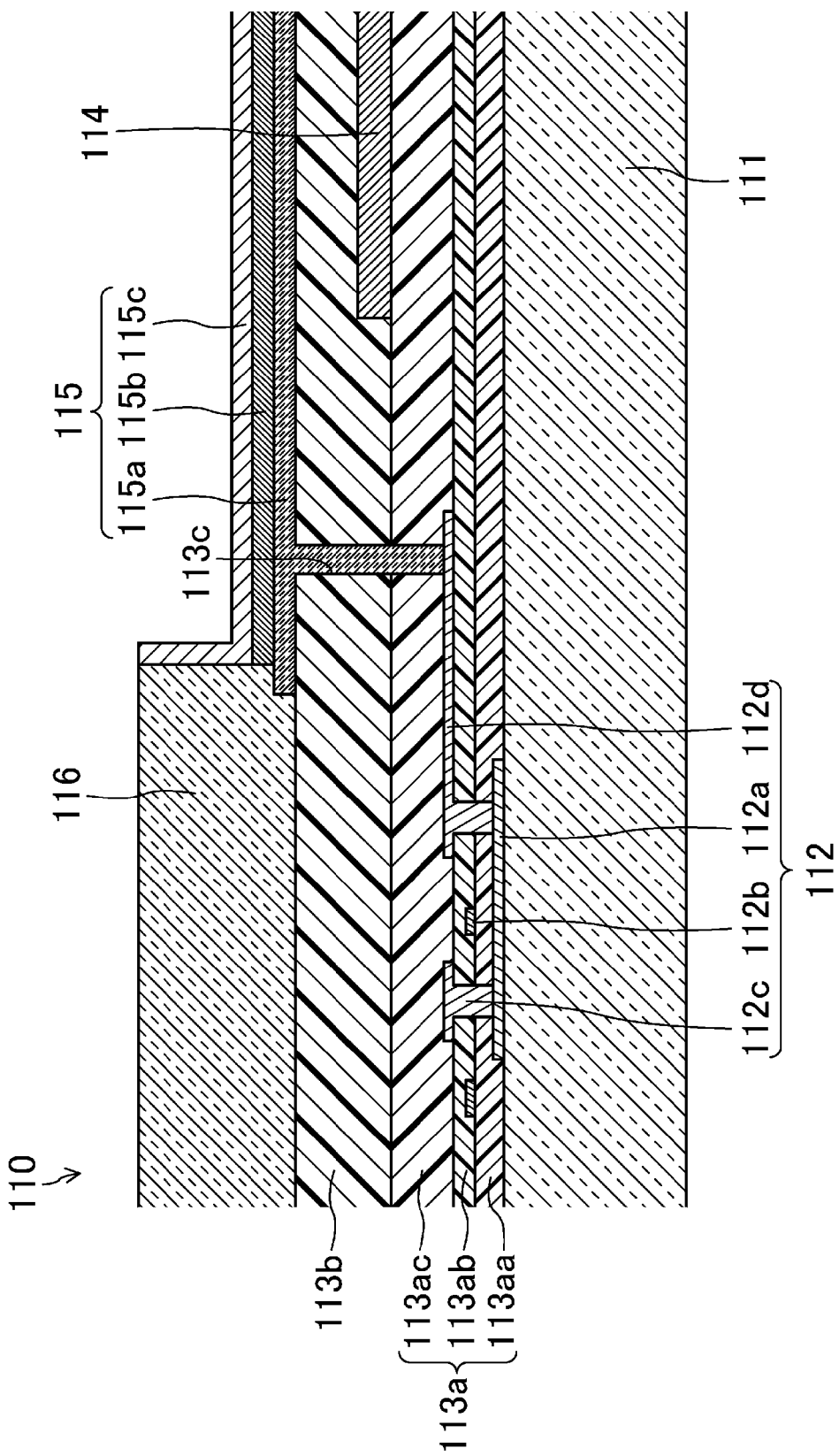
[FIG. 6]

As shown in FIGS. 5 and 6, the TFT 112 includes a semiconductor layer 112a, a gate electrode 112b, a source electrode 112c, and a drain electrode 112d. The semiconductor layer 112a and the gate electrode 112b are insulated from each other by the first interlayer insulating film 113aa. The gate electrode 112b, and the source electrode 112c and the drain electrode 112d, are insulated from each other by the second interlayer insulating film 113ab. The third interlayer insulating film 113ac provided above the first interlayer insulating film 113aa, the second interlayer insulating film 113ab, and the TFTs 112 is provided so that the entire interlayer insulating film 113a has a flat surface. The interlayer insulating film 113a has a thickness of, for example, about 2 μm.

—Reflection Film 114—

The reflection films 114 are formed between the interlayer insulating film 113a and the planarization film 113b, corresponding to the non-light emission region N. The reflection films 114 are disposed to reflect toward the sealing substrate a portion of light generated in each organic EL layer which is diffused in a diagonal direction into the non-light emission region N so that the portion of the light is transmitted through the separation wall portion and the sealing substrate to be viewable as an image on the sealing substrate (see FIG. 4). The reflection films 114 are formed of, for example, a light reflective metal film (an Al film etc.). The reflection films 114 each have a thickness of, for example, about 100 nm.

Figure 7:
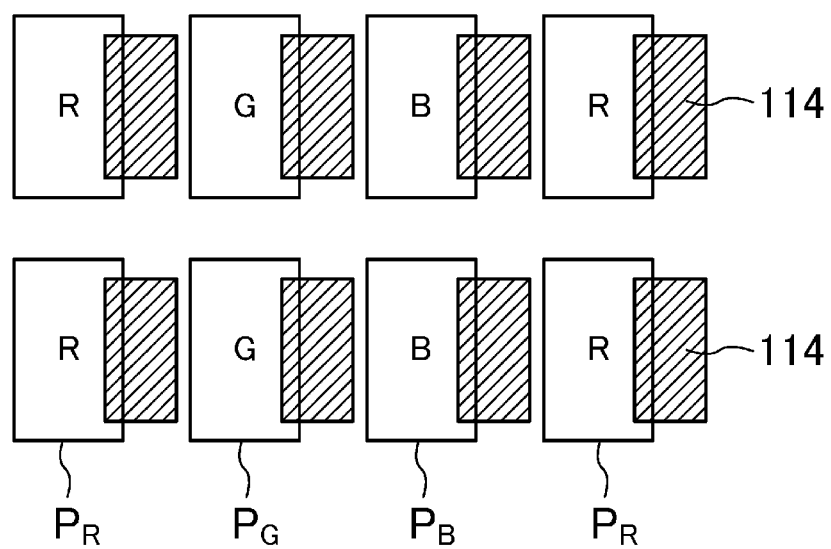
[FIG. 7]

As shown in FIG. 7, the reflection films 114 are formed in an island-like pattern, each corresponding to one of the light emission regions $P_R$, $P_G$, and $P_B$. The reflection films 114 each overlap a circumferential portion of the corresponding one of the light emission regions $P_R$, $P_G$, and $P_B$. If the reflection films 114 do not overlap the light emission regions $P_R$, $P_G$, and $P_B$, external light leaks from gaps between the light emission regions $P_R$, $P_G$, and $P_B$ and the reflection films 114 and is viewed on the opposite side of the panel, likely leading to a decrease in display quality. Such a problem does not arise, because the reflection films 114 overlap the circumferential portions of the light emission regions $P_R$, $P_G$, and $P_B$. In addition, because the reflection films 114 overlap the circumferential portions of the light emission regions $P_R$, $P_G$, and $P_B$, the problem that the areas of the light emission regions $P_R$, $P_G$, and $P_B$ significantly decrease and therefore the luminance of image display on the organic EL substrate decreases, does not arise. The overlap between the reflection film 114 and the light emission region $P_R$, $P_G$, or $P_B$ preferably has a width of about 5-10 μm.

—Planarization Film 113b—

The planarization film 113b is provided on an entire surface of the substrate, covering the interlayer insulating film 113a and the reflection films 114. Because the planarization film 113b is provided to cover the reflection films 114, the insulating layer 113 can have a flat surface without unevenness which would otherwise be caused by the reflection films 114. The planarization film 113b has a thickness of, for example, about 2 μm.

—Organic EL Element 115—

The organic EL element 115 includes a lower electrode 115a, an organic EL layer 115b, and an upper electrode 115c which are successively formed on top of one another (the lower electrode 115a is the closest to the organic EL substrate body 111). Note that, in the red light emission organic EL element $115_R$, a red light emission organic EL layer $115b_R$ is provided as the organic EL layer 115b. In the green light emission organic EL element $115_G$, a green light emission organic EL layer $115b_G$ is provided as the organic EL layer 115b. In the blue light emission organic EL element $115_B$, a blue light emission organic EL layer $115b_B$ is provided as the organic EL layer 115b. Note that, in the description that follows and the drawings, the red light emission organic EL layer $115b_R$, the green light emission organic EL layer $115b_G$, and the blue light emission organic EL layer $115b_B$ may also be collectively referred to as the organic EL layers 115b.

Specifically, the organic EL layer 115b includes a hole transporting layer, a light emitting layer, and an electron injection layer which are successively formed on top of one another (the hole transporting layer is the closest to the lower electrode 115a). When a voltage is applied between the lower electrode 115a and the upper electrode 115c, holes are injected from the lower electrode 115a through the hole transporting layer into the light emitting layer, while electrons are injected from the upper electrode 115c through the electron injection layer into the light emitting layer. The holes and electrons recombine in the light emitting layer to emit light.

—Lower Electrode 115a—

The lower electrode 115a is preferably formed of a material having a high work function. Examples of such a material include metal films of gold (Au), nickel (Ni), platinum (Pt), etc., transparent conductive films of indium oxide-tin oxide alloy (ITO), indium oxide-zinc oxide alloy ($In_2O_3$—ZnO), zinc oxide (ZnO), etc., etc. The lower electrode 115a has a thickness of, for example, about 100 nm. The lower electrode 115a is electrically connected to the drain electrode 112d so that a potential is applied thereto from the TFT 112.

—Organic EL Layer 115b—

The hole transporting layer, the light emitting layer, and the electron injection layer may be formed of materials which are commonly used in the art. Specifically, examples of the material for the hole transporting layer include porphyrin derivatives, aromatic tertiary amine compounds, styryl amine derivatives, polyvinylcarbazole, poly-P-phenylene vinylene, polysilane, triazole derivatives, oxadiazole derivatives, imidazole derivatives, polyarylalkane derivatives, pyrazoline derivatives, pyrazolone derivatives, fluorenone derivatives, hydrogenated amorphous silicon, hydrogenated amorphous silicon carbide, zinc sulfide, and zinc selenide. Examples of the material for the light emitting layer include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, perylene derivatives, perinone derivatives, rodamine derivatives, phenoxazone, quinacridone derivatives, rubrene, poly-P-phenylene vinylene, polysilane, etc. Examples of the material for the electron injection layer include tris(8-hydroxyquinoline) aluminum, oxadiazole derivatives, triazole derivatives, phenylquinoxaline derivatives, silole derivatives, etc.

Note that the light emitting layer of the organic EL layer 115b of the organic EL element 115 in the red light emission region $P_R$ is a red light emitting layer which contains a red light emission material. The light emitting layer of the organic EL layer 115b of the organic EL element 115 in the green light emission region $P_G$ is a green light emitting layer which contains a green light emission material. The light emitting layer of the organic EL layer 115b of the organic EL element 115 in the blue light emission region $P_B$ is a blue light emitting layer which contains a blue light emission material. The organic EL layer 115b needs to include at least a light emitting layer, and may include any other layers that are suitably selected, depending on the purpose of the product. As layers other than the light emitting layer, a hole injection layer, an electron transporting layer, an electron blocking layer, etc. may be optionally provided on top of one another in addition to the hole transporting layer and the electron injection layer.

—Upper Electrode 115c—

The upper electrodes 115c each cover the corresponding one of the organic EL layers 115b. Examples of a material for the upper electrode 115c include materials having a low work function, such as metal materials (e.g., silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), etc.), alloys (e.g., lithium fluoride (LiF)/calcium (Ca)/aluminum (Al), etc.), etc. A predetermined common potential is applied to the upper electrodes 115c. Note that interconnects (not shown) for the upper electrodes may be provided on the organic EL substrate body 111, and through holes (not shown) which reach the upper electrode interconnects may be provided in the separation wall portion 116, whereby the common potential can be applied to the upper electrodes 115c. Alternatively, a transparent conductive paste or a transparent conductive film may be provided on the bonding surface of the sealing substrate 120 to be in contact with the upper electrodes 115c. In the non-display region F, a common potential interconnect may be connected to the transparent conductive member. As a result, the common potential can be applied to the upper electrodes 115c.

—Separation Wall Portion 116—

The separation wall portion 116 is provided in a grid-like pattern, corresponding to the non-light emission region N, to separate the light emission regions $P_R$, $P_G$, and $P_B$ from each other. The separation wall portion 116 provided in the non-light emission region N insulates the organic EL elements 115 from each other. The separation wall portion 116 is formed of, for example, a light transmissive insulating material, such as silicon dioxide ($SiO_2$), silicon nitride film ($SiN_x$), silicon oxide film ($SiO_x$), silicon oxynitride film (SiNO), acrylic resin, polyimide resin, etc. The separation wall portion 116 has a grid width of, for example, about 50 μm. The separation wall portion 116 has a height of, for example, about 10 μm.

The separation wall portion 116 also functions as a spacer which is in contact with and supports the sealing substrate 120. As a result, another spacer is not required in addition to the separation wall portion 116, and therefore, the aperture ratio of the organic EL display device 100 can be increased. The top surface of the separation wall portion 116 is not covered by the upper electrodes 115c, and the separation wall portion 116 itself is in contact with the sealing substrate. Therefore, the sealing substrate 120 can be supported while a distance between the organic EL substrate 110 and the sealing substrate 120 can be maintained constant.

Figure 8:
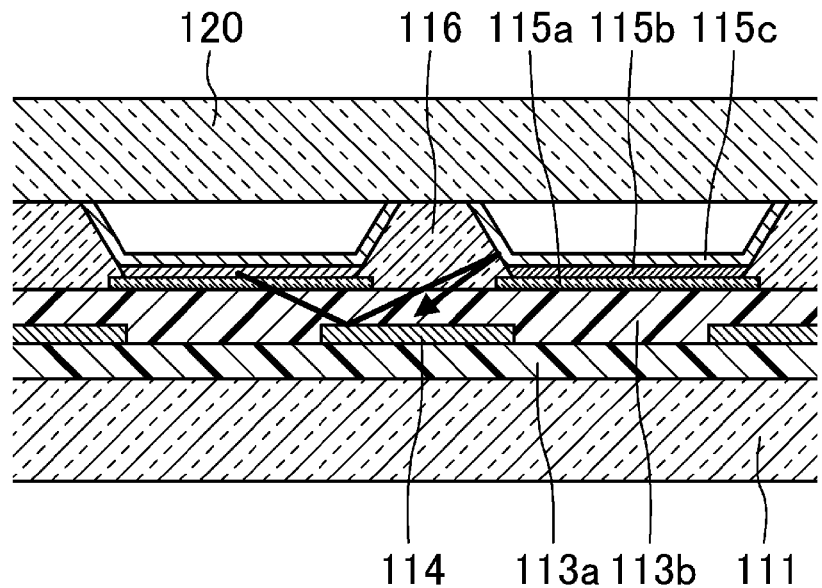
[FIG. 8]
Figure 9:
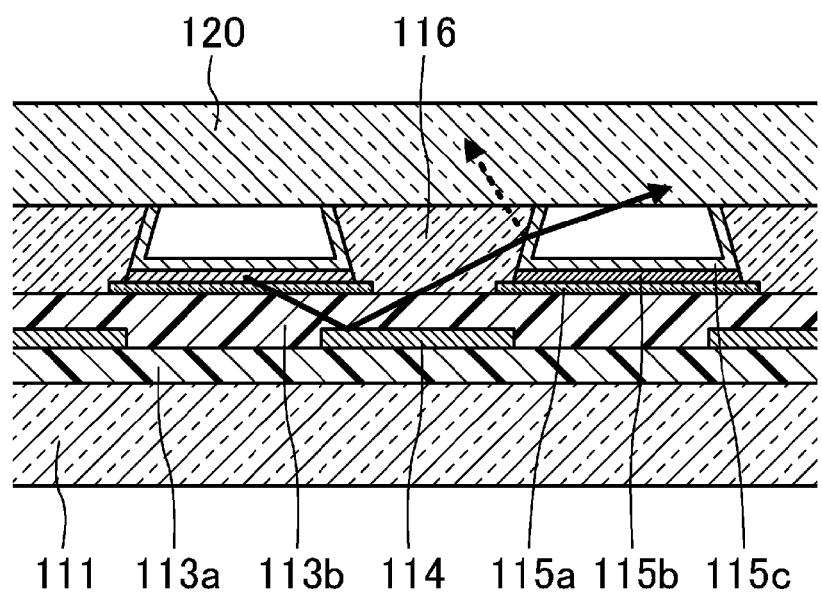
[FIG. 9]

Although FIG. 4 shows that the separation wall portion 116 has a wall surface perpendicular to the organic EL substrate body 111, as shown in FIG. 8 the separation wall portion 116 may have a forward taper shape which protrudes with the width becoming gradually narrower. Alternatively, as shown in FIG. 9, the separation wall portion 116 may have a backward taper shape which protrudes with the width becoming gradually wider.

Note that when, as shown in FIG. 8, the separation wall portion 116 has the forward taper shape, light which is reflected by the reflection films 114 and then travels toward the sealing substrate 120 is likely to be reflected by the wall surface of the separation wall portion 116 and then travel back toward the organic EL substrate body 111 (see an arrow in FIG. 8). In this case, the efficiency of extraction of light from the sealing substrate 120 decreases, and therefore, it is preferable that the separation wall portion 116 should not have the forward taper shape. When, as shown in FIG. 9, the separation wall portion 116 has the backward taper shape, the upper electrode 115c is likely to fail to be formed on the wall surface of the separation wall portion 116. Therefore, in this case, a portion of light passing through the separation wall portion 116 is not reflected by the wall surface and passes through the wall surface in a diagonal direction (see a solid line arrow in FIG. 9; note that a dashed line arrow indicates light reflected by the wall surface of the separation wall portion 116), and therefore, a displayed image is likely be become cloudy. Therefore, it is preferable that the separation wall portion 116 should not have a backward taper shape which has such a large taper angle that the upper electrode cannot be formed on the wall surface.

—Sealing Substrate 120—

The sealing substrate 120 includes a glass substrate etc.

<Method for Manufacturing Organic EL Display Device 100>

Next, a method for manufacturing the organic EL display device 100 of the first embodiment will be described with reference to FIGS. 10 and 11. The manufacturing method of the organic EL display device 100 includes an organic EL substrate forming step followed by a substrate bonding step.

(Organic EL Substrate Forming Step)

—TFT 112 and Interlayer Insulating Film 113a—

Initially, the organic EL substrate body 111 is prepared. The semiconductor layer 112a, the first interlayer insulating film 113aa, the gate electrode 112b, the second interlayer insulating film 113ab, the source electrode 112c, and the drain electrode 112d are formed using known techniques to form each of the TFTs 112 corresponding to the light emission regions $P_R$, $P_G$, and $P_B$ (the TFTs 112 are not shown in FIG. 10; see FIG. 6). Thereafter, for example, a photosensitive acrylic film is applied by spin coating etc., and then exposed (e.g., the exposure amount is about 360 mJ/cm$^2$) and developed (e.g., development with an alkaline developer), to form the third interlayer insulating film 113ac. As a result, a surface of the TFT 112 is planarized, and the interlayer insulating film 113a is formed. The interlayer insulating film 113a is cured by baking under conditions that, for example, the baking temperature is about 220° C. and the baking time is about one hour, and thereafter, a contact hole (e.g., a diameter of about 5 μm) extending from a surface of the interlayer insulating film 113a to the drain electrode 112d is formed.

—Reflection Film 114—

Next, an Al film etc. is formed by, for example, sputtering etc., and then exposed and developed by photolithography, and then patterned, to form the reflection films 114 corresponding to the non-light emission region N.

—Planarization Film 113b—

Figure 10A:
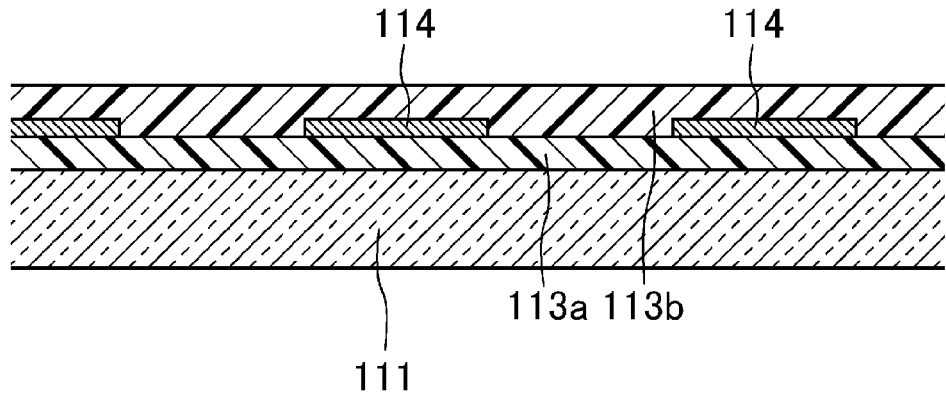
FIGS. 10(a)-10(c) are diagrams for describing a method for manufacturing the organic EL display device of the first embodiment.

Next, for example, a photosensitive acrylic film is applied by spin coating etc., and then exposed and developed, to form the planarization film 113b as shown FIG. 10(a). The planarization film 113b is cured by baking under conditions that, for example, the baking temperature is about 220° C. and the baking time is about one hour. Thereafter, a contact hole is formed at the same position as that of the contact hole provided in the interlayer insulating film 113a. The resulting contact hole is a contact hole 113c which extends from a surface of the planarization film 113b to the drain electrode 112d (see FIG. 6).

—Lower Electrode 115a—

Next, an ITO film is formed by, for example, sputtering etc., and then exposed and developed by photolithography, and then patterned, to form the lower electrodes 115a.

—Separation Wall Portion 116—

Next, a permanent resist (e.g., "SU-8" series manufactured by Nippon Kayaku Co., Ltd., etc.) is formed on the entire surface by a film laminating process or a spin coat applying process, and then exposed and developed by photolithography, and patterned by etching into a grid-like pattern corresponding to the non-light emission region N, to form the separation wall portion 116.

—Organic EL Layer 115b—

Figure 10B:
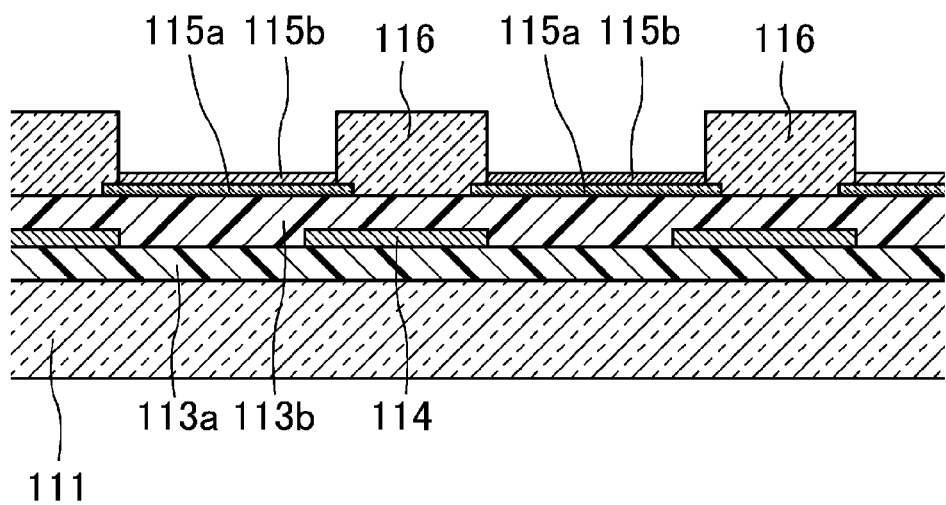

Next, as shown in FIG. 10(b), the hole transporting layer, the light emitting layer, the electron injection layer, etc. are formed in each of the light emission regions $P_R$, $P_G$, and $P_B$ using known techniques to form the organic EL layers 115b. In this case, the red light emission organic EL layer $115b_R$ including the red light emitting layer is formed in the red light emission region $P_R$, the green light emission organic EL layer $115b_G$ including the green light emitting layer is formed in the green light emission region $P_G$, and the blue light emission organic EL layer $115b_B$ including the blue light emitting layer is formed in the blue light emission region $P_B$.

—Upper Electrode 115c—

Figure 10C:
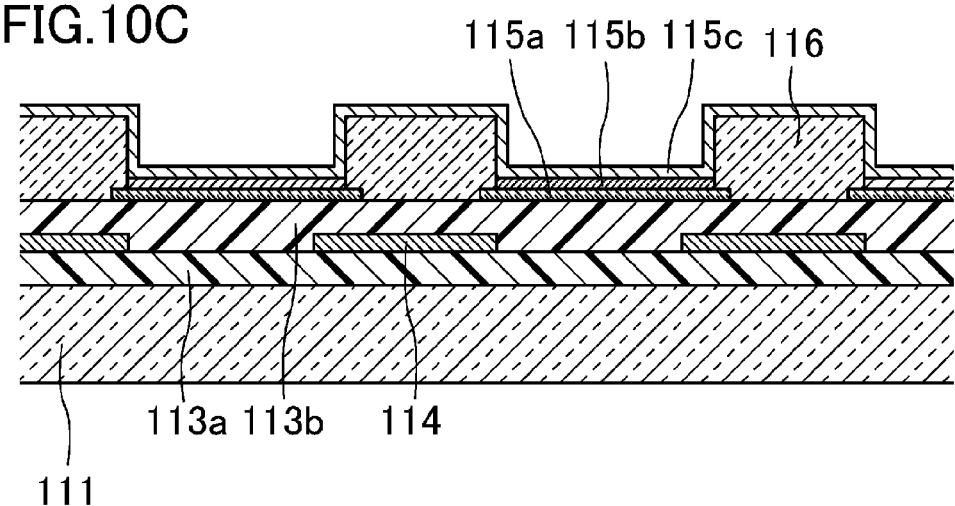
Figure 11A:
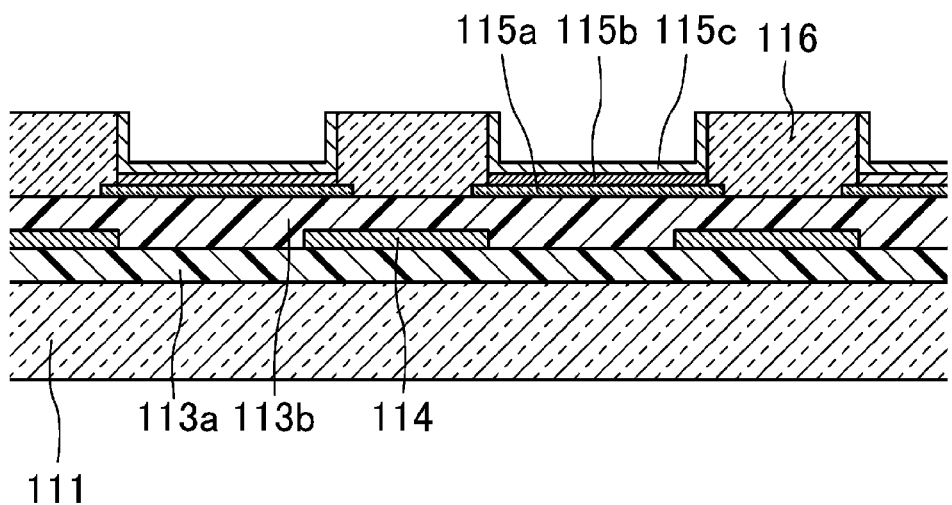
FIGS. 11(a) and 11(b) are diagrams for describing the method for manufacturing the organic EL display device of the first embodiment.

Next, as shown in FIG. 10(c), a metal film, such as an Ag film etc., is formed on the entire surface using a known technique, covering the organic EL layers 115b and the separation wall portion 116. Thereafter, the metal film attached to the top of the separation wall portion 116 is removed, for example, using an adhesive roller to form the upper electrodes 115c corresponding to the light emission regions $P_R$, $P_G$, and $P_B$ as shown in FIG. 11(a). The organic EL substrate 110 is thus produced.

In addition to the method of using an adhesive roller, the metal film on the separation wall portion 116 is removed, for example, as follows: a method of pressing an adhesive film against the top surface of the separation wall portion 116; a method of pressing a substrate on which a substance highly reactive to the metal film is applied, against the top surface of the separation wall portion 116, and allowing the substance to react with the metal film, thereby vaporizing the metal film or causing the metal film to be transparent; a method of scraping the top surface of the separation wall portion 116 while removing chips by suction; etc.

Note that, in addition to the method of forming the upper electrodes 115c by removing the metal film formed on the entire surface from the separation wall portion 116, the upper electrodes 115c may be formed by forming a metal film only in the desired region using an opening mask.

(Substrate Bonding Step)

Figure 11B:
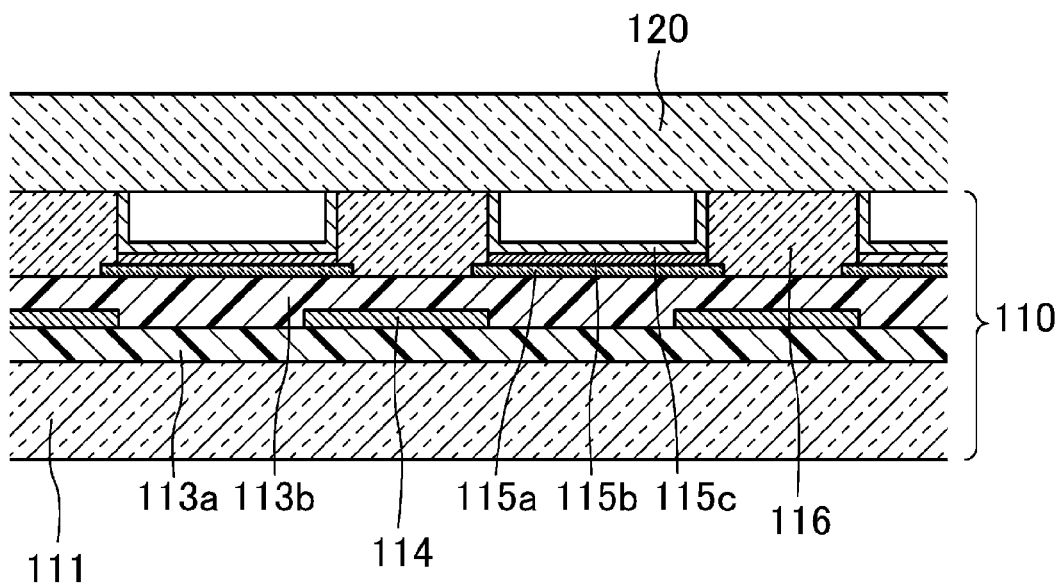

Finally, in an inert gas atmosphere, the organic EL substrate 110 and the sealing substrate 120 are disposed to face each other, and bonded together using a sealing resin for bonding which is applied in a frame-like region of the substrate. As shown in FIG. 11(b), the organic EL display device 100 is thus produced.

<Operation of Organic EL Display Device 100>

In the organic EL display device 100 thus configured, the reflection films 114 corresponding to the non-light emission region N are formed between the interlayer insulating film 113a and the planarization film 113b (see FIG. 4). The reflection films 114 are disposed to reflect toward the sealing substrate 120 a portion of light generated in each organic EL layer 115b which is diffused into the non-light emission region N so that the portion of the light is transmitted through the separation wall portion 116 and the sealing substrate 120 to be viewable as an image on the sealing substrate. Therefore, while light generated in the organic EL layers 115b is propagated toward the organic EL substrate body 111 to be viewed as an image on the organic EL substrate, a portion of light which is propagated toward the organic EL substrate body 111 and is diffused in a diagonal direction into the non-light emission region N is reflected by the reflection films 114 to enter the separation wall portion 116. The upper electrodes 115c are provided to cover the respective corresponding organic EL layers 115b, while the top surface of the separation wall portion 116 is not covered by the upper electrodes 115c. Therefore, light entering the separation wall portion 116 is transmitted through the separation wall portion 116 without being blocked to enter the sealing substrate 120, and therefore, is viewed from the outside as an image on the sealing substrate. In other words, by driving a single panel, an image can be displayed on both sides thereof, i.e., the organic EL substrate and the sealing substrate.

Note that, in this case, the organic EL substrate and the sealing substrate of the organic EL display device 100 display mirror images. In other words, an image on the organic EL substrate and an image on the sealing substrate are mirror-symmetrical to each other.

<Advantages of First Embodiment>

Advantages of the organic EL display device 100 of the first embodiment will be described below.

In the organic EL display device 100 of this embodiment, an image displayed on the sealing substrate is formed using light which is emitted in a diagonal direction from the organic EL elements 115. In an organic EL display device having a conventional configuration, light emitted in a diagonal direction from the organic EL elements is confined between the substrates, and absorbed and thermally deactivated by component materials, or emitted from the end facets of the substrates, and therefore, is not effectively used. However, in this embodiment, the light emitted in a diagonal direction is used to display an image on the sealing substrate, and therefore, even when double-sided display is performed, the light emission luminance of display on the organic EL substrate is not likely to significantly decrease, and the power consumption is not likely to increase. In addition, the reflection films 114 are provided, corresponding to the non-light emission region N, to reflect toward the sealing substrate 120 light emitted in a diagonal direction from the organic EL elements 115. Therefore, it is not likely that the light emission regions $P_R$, $P_G$, and $P_B$ are blocked by the reflection films 114 and therefore the display luminance of the organic EL substrate significantly decreases.

Also, in this case, light is transmitted through the separation wall portion 116 corresponding to the non-light emission region N to be emitted to the sealing substrate 120 and is therefore viewed as an image on the sealing substrate. Therefore, the large region surrounding the light emission regions $P_R$, $P_G$, and $P_B$ can be used as a pixel region of display on the sealing substrate to display an image. Light of the light emission regions $P_R$, $P_G$, and $P_B$ is reflected by the reflection films 114 and blended together in the separation wall portion 116 before being displayed on the sealing substrate. Therefore, the boundary between each pixel region in an image displayed on the sealing substrate 120 is less viewable. Therefore, an image can be displayed with high display quality on the sealing substrate 120 as well.

Therefore, the organic EL display device 100 can display an image on both the organic EL substrate and the sealing substrate without an increase in power consumption and with high display quality.

In the organic EL display device 100 of this embodiment, the planarization film 113b is provided to cover the reflection films 114, and has a flat surface (i.e., the surface of the insulating layer 113 is flat). Therefore, variations in thickness between the organic EL elements 115 including the lower electrode 115a, the organic EL layer 115b, and the upper electrode 115c formed on the insulating layer 113 are reduced or prevented, whereby the organic EL elements 115 have high reliability.

Moreover, in the organic EL display device 100 of this embodiment, when light generated in the organic EL layer 115b travels toward the organic EL substrate body 111, the light is propagated through the insulating layer 113 to enter the organic EL substrate body 111, or is reflected by the reflection films 114 to enter and pass through the separation wall portion 116 directly to the sealing substrate 120. Therefore, the light does not travel in a gas, and therefore, the loss of the light can be reduced or prevented.

In conventional top emission type organic EL display devices which display an image on the sealing substrate, the lower electrode is formed of a light reflective material and the upper electrode is formed of a light semi-transmissive material, and therefore, light is unavoidably multiply reflected between the lower and upper electrodes, leading to the problem that, due to the influence of interference of the light, the color purity or luminance may vary depending on the viewing angle (microcavity effect). However, in the organic EL display device 100 of this embodiment, even though image display is performed on the sealing substrate, the upper electrode 115c is formed of a light reflective material and the lower electrode 115a is formed of a light transmissive material, and therefore, it is not necessary to take the influence of the microcavity effect into consideration. Therefore, the problem that the color purity or luminance varies depending on the viewing angle due to the microcavity effect, does not arise.

<Variations of First Embodiment>

Variations 1-7 of the arrangement of the reflection films 114 included in the organic EL display device 100 of the first embodiment will be described.

(Variations 1-5)

In the first embodiment, as described with reference to FIG. 7, the reflection films 114 are each formed, corresponding to one of the light emission regions $P_R$, $P_G$, and $P_B$. The layout of the reflection films 114 is not limited to this. Alternatively, for example, each reflection film 114 may be provided, corresponding to a plurality of light emission regions $P_R$, $P_G$, and $P_B$.

Figure 12:
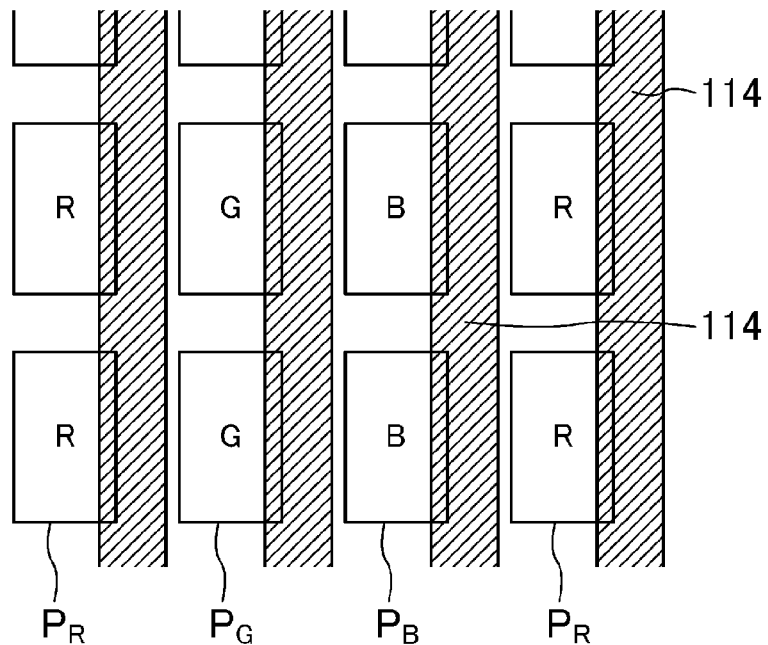
[FIG. 12]
Figure 13:
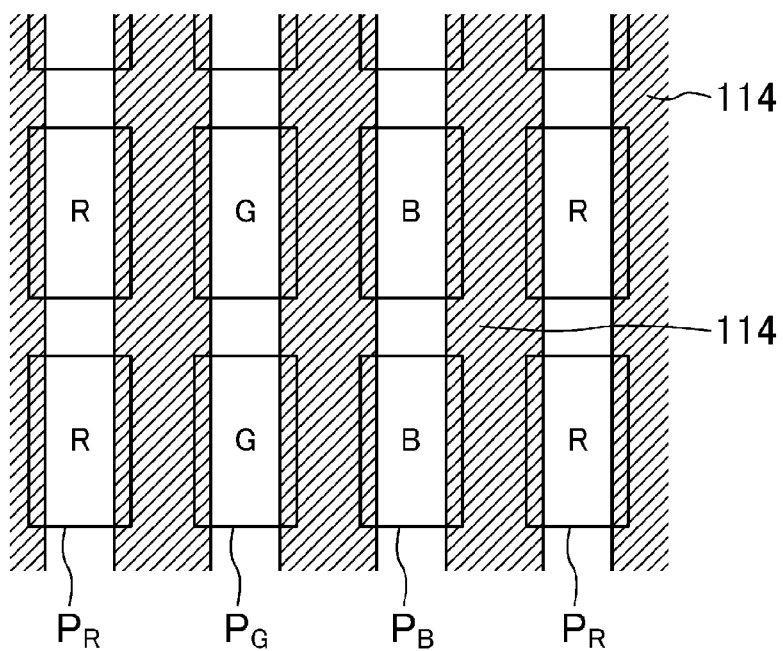
[FIG. 13]
Figure 14:
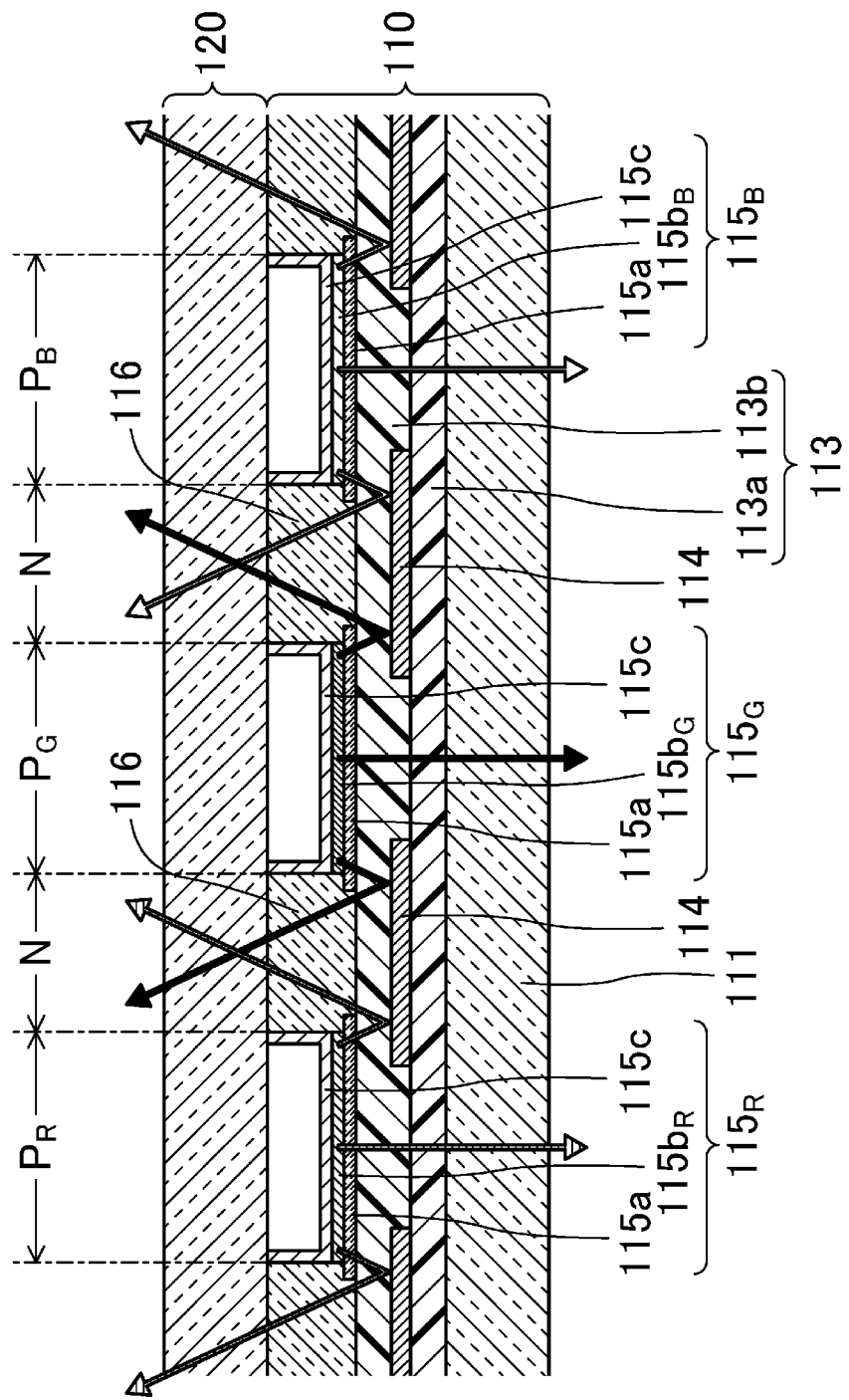
[FIG. 14]
Figure 15:
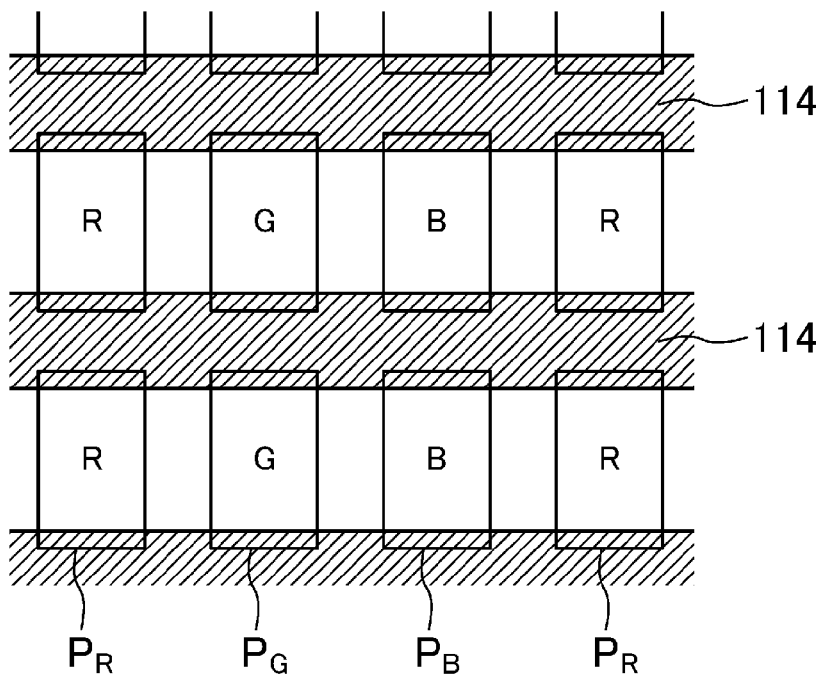
[FIG. 15]

Specifically, as shown in FIG. 12 as Variation 1, each reflection film 114 may be provided, extending along a plurality of light emission regions having the same color. When each reflection film 114 is provided, extending along a plurality of light emission regions having the same color, as shown in FIGS. 13 and 14 as Variation 2 each reflection film 114 may be provided, overlapping circumferential portions of both adjacent light emission regions having different colors (i.e., the red light emission regions $P_R$ and the green light emission regions $P_G$, the green light emission regions $P_G$ and the blue light emission regions $P_B$, or the blue light emission regions $P_B$ and the red light emission regions $P_R$). Alternatively, as shown in FIG. 15 as Variation 3, each reflection film 114 may be provided, extending in a direction perpendicular to the direction along which a plurality of light emission regions having the same color are arranged.

Figure 16:
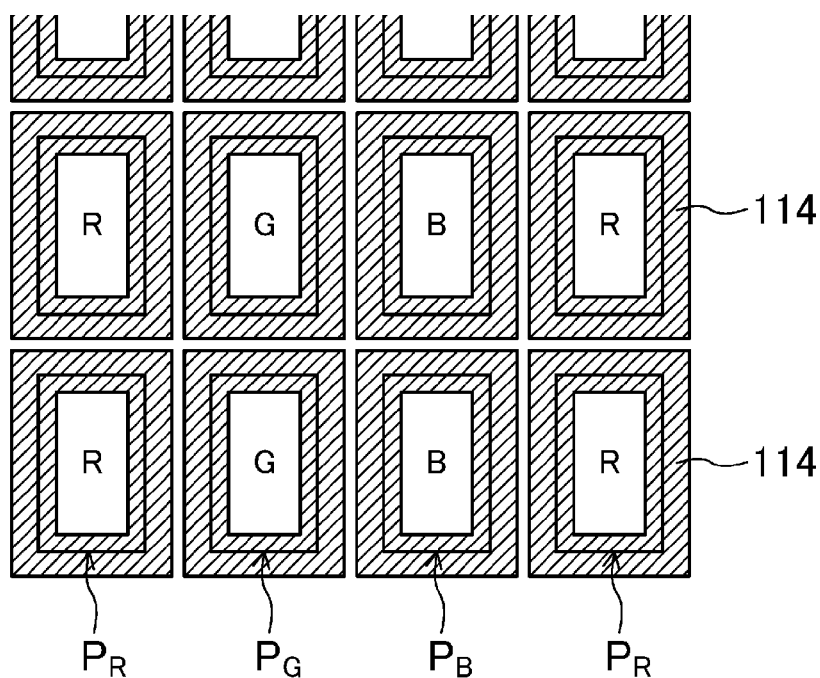
[FIG. 16]
Figure 17:
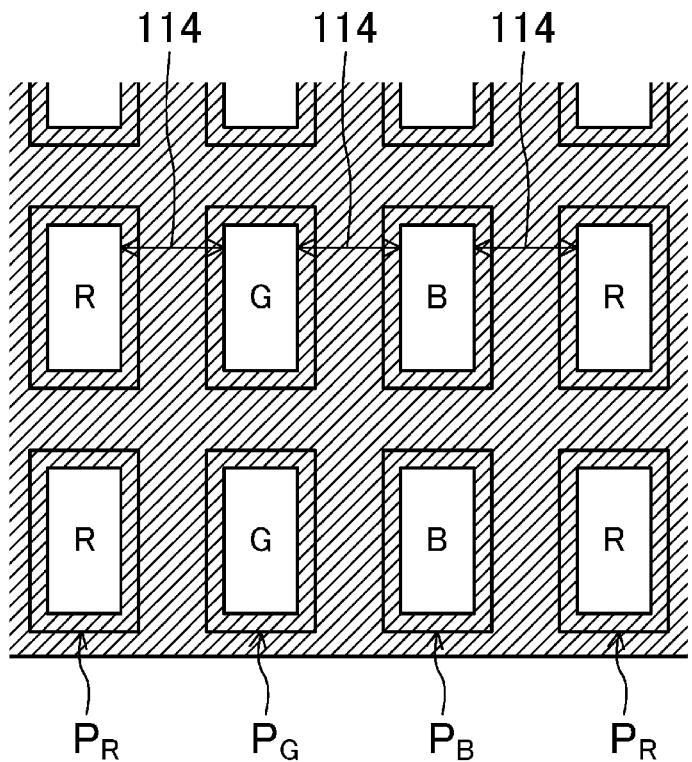
[FIG. 17]

As shown in FIG. 16 as Variation 4, each reflection film 114 may be provided, surrounding the corresponding one of the light emission regions $P_R$, $P_G$, and $P_B$. In this case, as shown in FIG. 17 as Variation 5, a reflection film 114 may be provided, surrounding every one of the light emission regions $P_R$, $P_G$, and $P_B$ and corresponding to the entire non-light emission region N.

Note that the amount of light reflected toward the back side can be adjusted by changing the area of the reflection films 114. For example, Variation 1 is compared with Variation 2 in which the area of the reflection films 114 is larger. In Variation 1, light is reflected toward the sealing substrate by the reflection film 114 provided on the right side of each of the light emission regions $P_R$, $P_G$, and $P_B$ (see FIG. 4). In Variation 2, light is reflected toward the sealing substrate by the reflection films 114 provided both the right and left sides of each of the light emission regions $P_R$, $P_G$, and $P_B$ (see FIG. 14). Therefore, on the sealing substrate 120, display having a higher luminance can be provided in Variation 2 in which the area of the reflection films 114 is larger, than in Variation 1.

(Variation 6)

Figure 18:
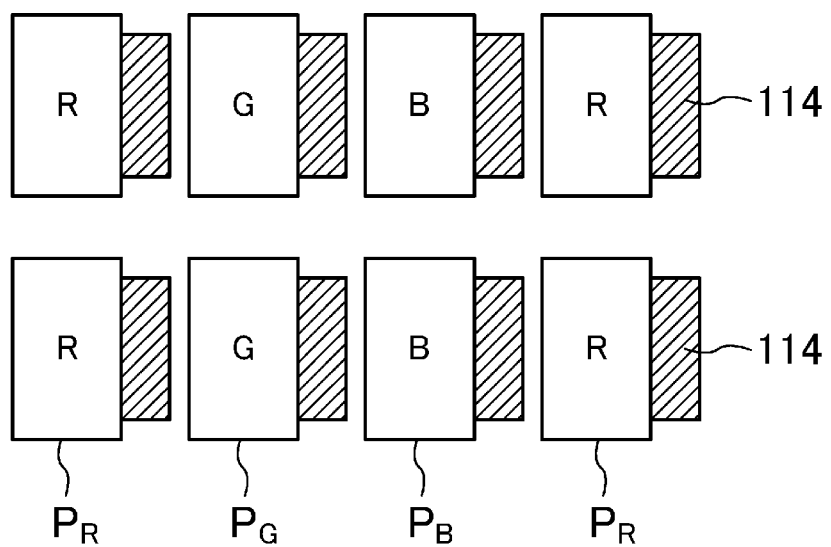
[FIG. 18]

In the first embodiment and Variations 1-5, the light emission regions $P_R$, $P_G$, and $P_B$ and the reflection films 114 overlap. Alternatively, as shown in FIG. 18 as Variation 6, the light emission regions $P_R$, $P_G$, and $P_B$ and the reflection film 114 may not overlap.

(Variation 7)

Figure 19:
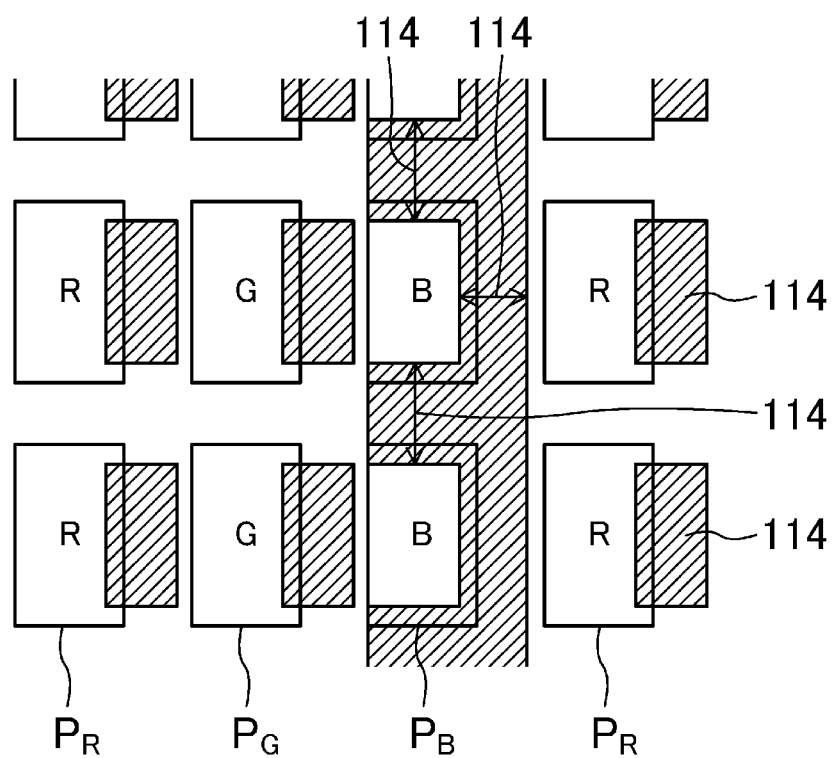
[FIG. 19]

In the first embodiment and Variations 1-6, the reflection films 114 have the same layout with respect to the light emission regions $P_R$, $P_G$, and $P_B$. Alternatively, the reflection films 114 may have different layouts corresponding to characteristics of the respective organic EL elements $115_R$, $115_G$, and $115_B$. For example, as shown in FIG. 19 as Variation 7, the reflection film 114 may have an island-like pattern with respect to the red light emission region $P_R$ and the green light emission region $P_G$, while the reflection film 114 may have a U shape surrounding the blue light emission region $P_B$ at a portion corresponding to the blue light emission region $P_B$. In this case, a portion of light which is emitted from the blue light emission region $P_B$ in a diagonal direction toward the non-light emission region N, can be more efficiently reflected toward the back side than light which is emitted from the red light emission region $P_R$ and the green light emission region $P_G$. It is known that, of organic EL light emission materials, blue light emission materials have a lower light emission efficiency and a shorter light emission life than those of red light emission materials and green light emission materials. Therefore, by arranging the reflection films 114 as shown in FIG. 19, blue light can be more effectively used, whereby the current density of the blue light emission region $P_B$ can be reduced and therefore the light emission life of the blue light emission region $P_B$ can be increased. Note that the amount of light emitted from the blue light emission region $P_B$ toward the organic EL substrate can be adjusted by providing a light emission area different from those of the other colors.

Note that, in the first embodiment, the organic EL display device 100 displays an RGB full color image on both sides thereof. Alternatively, for example, a yellow light emission region may be provided as an additional light emission region to display an RGBY full color image. Alternatively, a monochromatic image may be displayed.

<<Second Embodiment>>

Next, an organic EL display device 200 according to the second embodiment will be described.

<Configuration of Organic EL Display Device 200>

Firstly, a configuration of the organic EL display device 200 will be described. The organic EL display device 200 is a display which displays an image on both front and back sides thereof, where a monochromatic image is displayed on one of the sides (a side on which an organic EL substrate 210 is provided) and an RGB full color image is displayed on the other side (a side on which a sealing substrate 220 is provided). The organic EL display device 200 is used, for example, as a display including a single display panel which serves as both a primary screen (main display) and a secondary screen (sub-display), in a mobile device (e.g., a mobile telephone, a multimedia player, etc.) having a primary screen (main display) and a secondary screen (sub-display), or a display (e.g., an advertisement display panel etc.) which displays an image on both front and back sides thereof.

As in the first embodiment, the organic EL display device 200 includes the flat panel-like organic EL substrate 210 and sealing substrate 220 which face each other. The sealing substrate 220 has a configuration similar to that of the sealing substrate 120 of the first embodiment.

Figure 20:
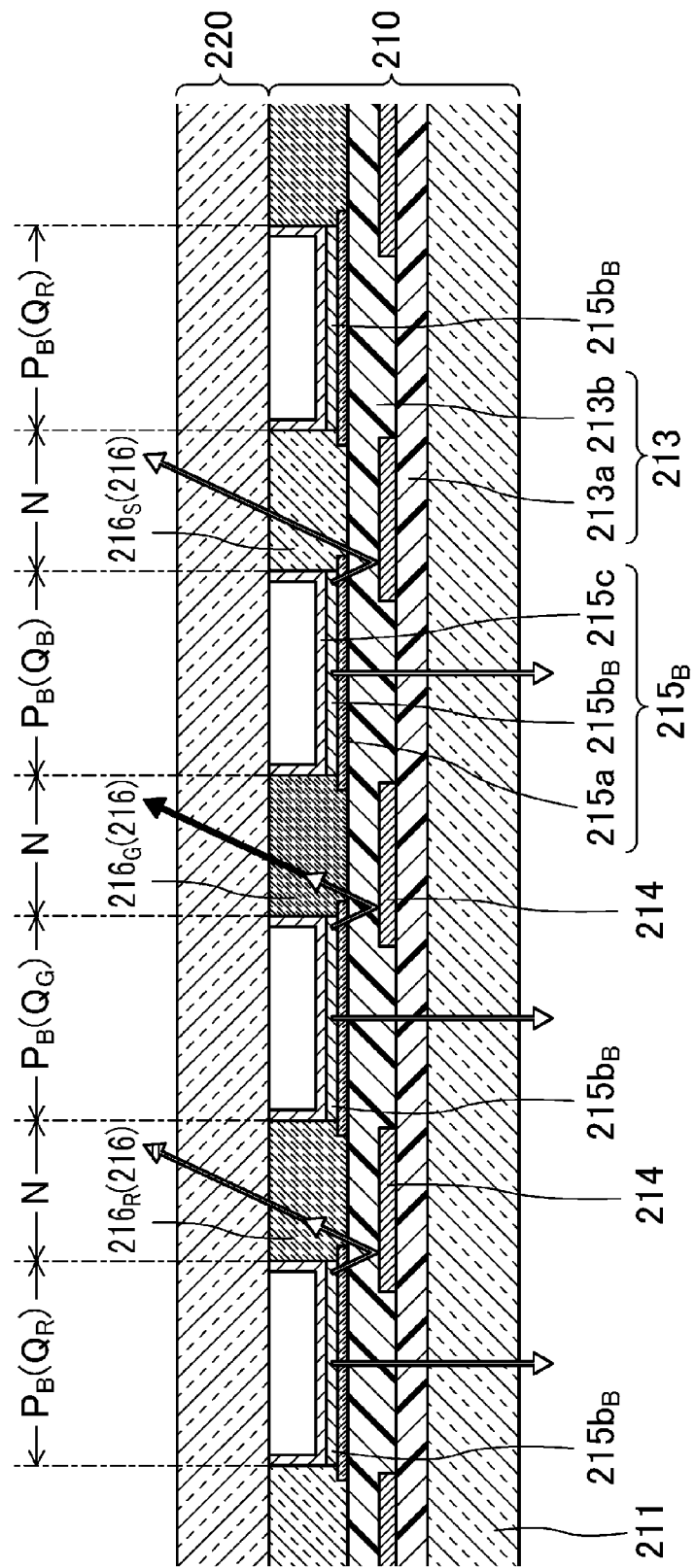
[FIG. 20]

FIG. 20 is a cross-sectional view of a display region D of the organic EL display device 200. The organic EL display device 200 includes a plurality of blue light emission regions $P_B$ arranged in a matrix. A predetermined image is displayed in the entire display region D by the blue light emission regions $P_B$ being driven independently of each other.

Note that one third of the blue light emission regions $P_B$ are red light emission control regions $Q_R$ which are pixels which emit red light and are used to display a full color image on the sealing substrate 220. Similarly, one third of the blue light emission regions $P_B$ are green light emission control regions $Q_G$ which emit green light and are used to display a full color image on the sealing substrate 220. One third of the blue light emission regions $P_B$ are blue light emission control region $Q_B$ which emit blue light and are used to display a full color image on the sealing substrate 220. A grid-like region other than the blue light emission regions $P_B$ is a non-light emission region N.

—Organic EL Substrate 210—

The organic EL substrate 210 includes, on an organic EL substrate body 211, a plurality of TFTs (not shown) each provided as a switching element for a corresponding one of the blue light emission regions $P_B$, an insulating layer 213 which covers the organic EL substrate body 211 and the TFTs, a plurality of blue light emission organic EL elements $215_B$ provided on the insulating layer 213, corresponding to the blue light emission regions $P_B$, and a separation wall portion 216 formed in a grid-like pattern, corresponding to the non-light emission region N, to separate the blue light emission organic EL elements $215_B$ from each other. The insulating layer 213 includes an interlayer insulating film 213a (first insulating film) closer to the organic EL substrate body 211, and a planarization film 213b (second insulating film) thereabove, which are provided one on top of the other. A plurality of reflection films 214 are provided between the interlayer insulating film 213a and the planarization film 213b, corresponding to the non-light emission region N. The organic EL substrate body 211, the TFT, the insulating layer 213, and the blue light emission organic EL element $215_B$ have configurations similar to those of the organic EL display device 100 of the first embodiment.

—Separation Wall Portion 216—

The separation wall portion 216 is provided in a grid-like pattern, corresponding to the non-light emission region N, to separate the blue light emission regions $P_B$ from each other. The separation wall portion 216 provided in the non-light emission region N insulates the organic EL elements 215 from each other.

The separation wall portion 216 also functions as a spacer which is in contact with and supports the sealing substrate 220. As a result, another spacer is not required in addition to the separation wall portion 216, and therefore, the aperture ratio of the organic EL display device 200 can be increased. The top surface of the separation wall portion 216 is not covered by upper electrodes 215c, and the separation wall portion 216 itself is in contact with the sealing substrate. Therefore, the sealing substrate 220 can be supported while a distance between the organic EL substrate 210 and the sealing substrate 220 can be maintained constant.

The separation wall portion 216 includes red conversion portions $216_R$, green conversion portions $216_G$, and transparent resin portions $216_S$. The red conversion portion $216_R$ has a function of converting the wavelength of blue light transmitted therethrough (stokes shift) and thereby extracting light having a red wavelength. The red conversion portion $216_R$ is formed of a transparent resin (e.g., an acrylic resin etc.) doped with a fluorescent material (e.g., a silicate-based fluorescent material manufactured by Nemoto & Co., Ltd., etc.). The green conversion portion $216_G$ has a function of converting the wavelength of blue light transmitted therethrough and thereby extracting light having a green wavelength. The green conversion portion $216_G$ is formed of a transparent resin (e.g., an acrylic resin etc.) doped with a fluorescent material (e.g., a silicate-based fluorescent material manufactured by Nemoto & Co., Ltd., etc.). The transparent resin portion $216_S$ does not convert the wavelength of blue light transmitted through the separation wall portion 216. The transparent resin portion $216_S$ is formed of a transparent resin (e.g., an acrylic resin etc.), similar to the separation wall portion 116 of the first embodiment.

Figure 21A:
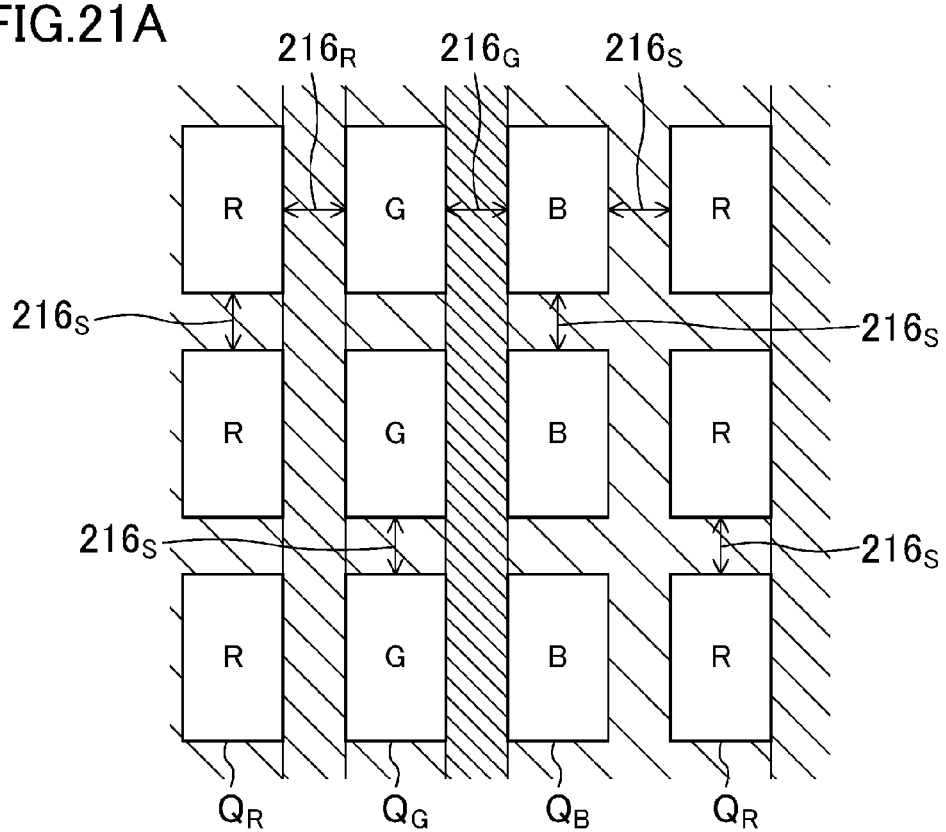
FIG. 21(a) is a schematic plan view of a layout of color light emission control regions and a separation wall portion (color conversion portions and transparent resin portions) of the organic EL display device of the second embodiment.

The red conversion portions $216_R$, the green conversion portions $216_G$, and the transparent resin portions $216_S$ are arranged as shown in FIG. 21(a). Specifically, the red conversion portion $216_R$ is a band-like portion of the separation wall portion 216 which is provided on the right side of the red light emission control regions $Q_R$ arranged in the length direction. The green conversion portion $216_G$ is a band-like portion of the separation wall portion 216 which is provided on the right side of the green light emission control regions $Q_G$ arranged in the length direction. The transparent resin portion $216_S$ is a portion of the separation wall portion 216 which excludes the red conversion portion $216_R$ and the green conversion portion $216_G$.

Figure 21B:
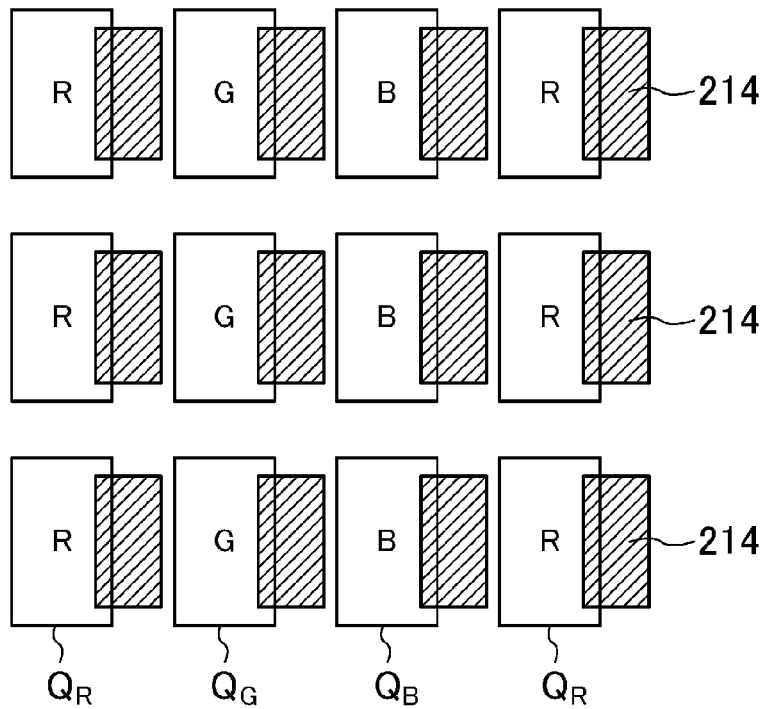
FIG. 21(b) is a schematic plan view of a layout of light emission regions and reflection films of the organic EL display device of the second embodiment.

Here, as shown in FIG. 21(b), the reflection films 214 are formed in an island-like pattern, corresponding to the blue light emission regions $P_B$ (the red conversion portions $216_R$, the green conversion portions $216_G$, and the transparent resin portions $216_S$). The reflection films 214 are disposed so that a portion of blue light generated in the red light emission control regions $Q_R$ which is diffused in a diagonal direction into the non-light emission region N is reflected by the reflection films 214 toward the sealing substrate 220 to enter the red conversion portions $216_R$ of the separation wall portion 216. The reflection films 214 are also disposed so that a portion of blue light generated in the green light emission control regions $Q_G$ which is diffused in a diagonal direction into the non-light emission region N is reflected by the reflection films 214 toward the sealing substrate 220 to enter the green conversion portions $216_G$ of the separation wall portion 216. The reflection films 214 are also disposed so that a portion of blue light generated in the blue light emission control region $Q_B$ which is diffused in a diagonal direction into the non-light emission region N is reflected by the reflection films 214 toward the sealing substrate 220 to enter the transparent resin portions $216_S$ of the separation wall portion 216.

The color conversion portions $216_R$ and $216_G$ and the transparent resin portions $216_S$ preferably have the same height. In this case, the separation wall portion 216 can function as a spacer for supporting the sealing substrate 220 at the color conversion portions $216_R$ and $216_G$ and the transparent resin portions $216_S$.

Note that, for example, in order to adjust the efficiency of color conversion of the color conversion portions $216_R$ and $216_G$, the heights of the color conversion portions $216_R$ and $216_G$ can be suitably changed as long as they are lower than the height of the transparent resin portions $216_S$. In this case, only the transparent resin portions $216_S$ of the separation wall portion 216 function as a spacer for supporting the sealing substrate 220. Note that the color conversion efficiency etc. may be adjusted, for example, when the thickness of the color conversion portion is increased in order to improve the color purity or when the thickness of the color conversion portion is decreased in order to obtain red light and green light having a high luminance.

The transparent resin portions $216_S$ and the color conversion portions $216_R$ and $216_G$ may overlap at a portion which is a boundary therebetween. In this case, the separation wall portion 216 has a largest height at the overlap region, and therefore, is in contact with and supports the sealing substrate 220 at the overlap region.

<Method for Manufacturing Organic EL Display Device 200>

Next, a method for manufacturing the organic EL display device 200 will be described. The manufacturing method of the organic EL display device 200 includes an organic EL substrate forming step followed by a substrate bonding step.

(Organic EL Substrate Forming Step)

—TFT-Lower Electrode 215a—

As in the first embodiment, the TFTs, the interlayer insulating film 213a, the reflection films 214, the planarization film 213b, and the lower electrodes 215a are formed on the organic EL substrate body 211.

—Separation Wall Portion 216—

Next, a permanent resist is formed on the entire surface by a film laminating process or a spin coat applying process, and then exposed and developed by photolithography, and etched, to form the transparent resin portions $216_S$. Similarly, the red conversion portions $216_R$ and the green conversion portions $216_G$ are formed. Note that the red conversion portion $216_R$, the green conversion portion $216_G$, and the transparent resin portion $216_S$ may be formed in any sequence.

—Organic EL Layer 215b—

Next, the hole transporting layer, the blue light emitting layer, the electron injection layer, etc. are formed using known techniques, corresponding to each of the blue light emission regions $P_B$, to form a blue organic EL layer $215b_B$. In this case, the blue light emitting layer containing a blue light emission material may be formed in all light emission regions as light emitting layers. Therefore, the organic EL layers 215b can be easily formed.

—Upper Electrode 215c—

After the formation of the organic EL layers 215b, the upper electrodes 215c are formed on the organic EL layers 215b in a manner similar to that of the first embodiment.

(Substrate Bonding Step)

Finally, the organic EL substrate 210 and the sealing substrate 220 thus obtained are bonded together to obtain the organic EL display device 200.

<Operation of Organic EL Display Device 200>

In the organic EL display device 200, all the light emission regions are the blue light emission region $P_B$, and all the organic EL elements 215 are the blue organic EL element $215_B$. Therefore, light generated in the blue light emission organic EL layers $215b_B$ is propagated to the organic EL substrate body 211 to be viewed as a monochromatic blue image on the organic EL substrate.

On the other hand, a portion of light generated in each blue light emission organic EL layer $215b_B$ which is diffused in a diagonal direction into the non-light emission region N is reflected toward the sealing substrate 220 by the corresponding reflection film 214 formed between the interlayer insulating film 213a and the planarization film 213b. The light reflected by the reflection films 214 travels through the separation wall portion 216 to be viewed as an image on the sealing substrate. In this case, the way in which the light travels will be described in detail for each of the light emission control regions $Q_R$, $Q_G$, and $Q_B$.

As shown in FIGS. 21 and 22, the reflection films 214 are disposed so that a portion of blue light generated in the red light emission control regions $Q_R$ which is diffused in a diagonal direction into the non-light emission region N is reflected by the reflection films 214 toward the sealing substrate 220 to enter the red conversion portions $216_R$ of the separation wall portion 216. Therefore, blue light generated in the red light emission control regions $Q_R$ is converted into red light when the blue light is transmitted through the red conversion portions $216_R$. The resulting light is viewed as red light included in an image on the sealing substrate. Similarly, blue light generated in the green light emission control regions $Q_G$ is converted into green light when the blue light is transmitted through the green conversion portions $216_G$. The resulting light is viewed as green light included in an image on the sealing substrate. Blue light generated in the blue light emission control region $Q_B$ is transmitted through the transparent resin portions $216_S$ to be viewed as blue light included in an image on the sealing substrate. Therefore, on the sealing substrate 220, blue light obtained in the red light emission control regions $Q_R$ is viewed as red light, blue light obtained in the green light emission control regions $Q_G$ is viewed as green light, and blue light generated in the blue light emission control regions $Q_B$ is viewed as blue light.

Here, the principle that blue light generated in the red light emission control region $Q_R$ enters the red conversion portion $216_R$, blue light generated in the green light emission control region $Q_G$ enters the green conversion portion $216_G$, and blue light generated in the blue light emission control region $Q_B$ enters the transparent resin portion $216_S$, will be described.

Referring to FIG. 22, in order to allow blue light generated in the red light emission control region $Q_R$ to be reflected by the reflection film 214 and then enter the red conversion portion $216_R$, the blue light from the red light emission control region $Q_R$ needs to be reflected by the reflection film 214 provided on the right side of the red light emission control region $Q_R$. In other words, while blue light generated in the blue light emission organic EL layer $215b_B$ of the red light emission control region $Q_R$ travels toward the organic EL substrate body 211, and at the same time, is equally diffused in a diagonal right direction and a diagonal left direction, it is necessary to cause the light diffused in a diagonal left direction to reach the reflection film 214 but not to reach the sealing substrate 220, or to reach the reflection film 214 but not to be reflected toward the sealing substrate 220. On the other hand, it is necessary to cause the light diffused in a diagonal right direction to reach the reflection film 214 and then be reflected toward the sealing substrate 220.

On the right side of the red light emission control region $Q_R$, the reflection film 214(R) is disposed to overlap a circumferential portion of the red light emission control region $Q_R$. Therefore, as shown in FIG. 23(*a*), light diffused in a diagonal right direction with respect to the red light emission control region $Q_R$ is reflected by the reflection film 214(R) to enter the red conversion portion $216_R$.

Figure 23A:
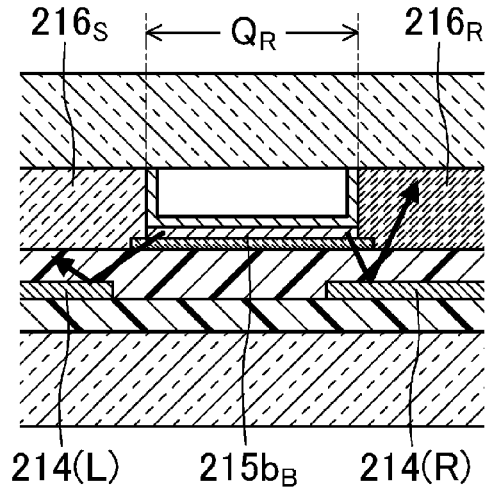
FIGS. 23(a)-23(c) are diagrams for describing paths of light reflected by reflection films.
Figure 23B:
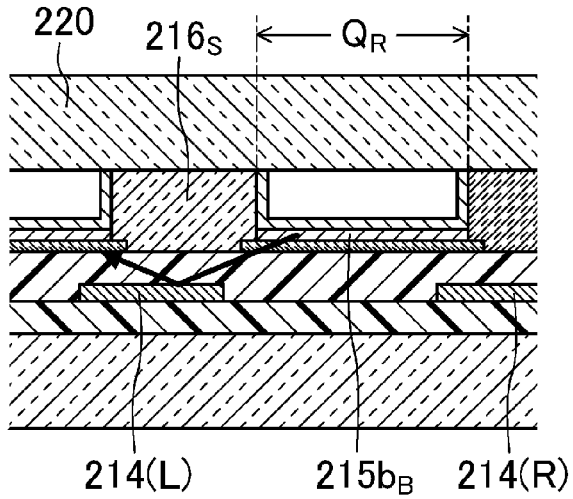
Figure 23C:
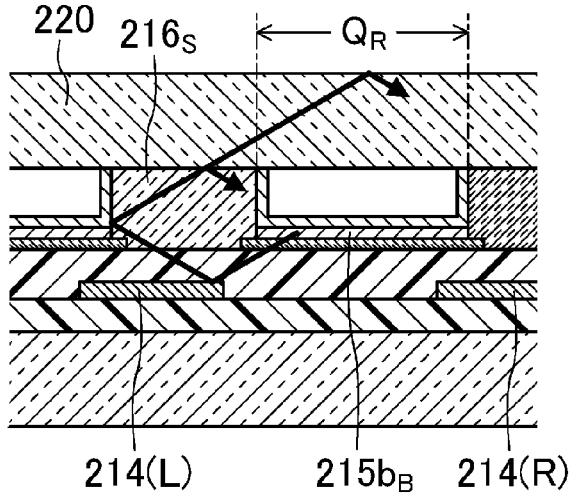

On the other hand, on the left side of the red light emission control region $Q_R$, the red light emission control region $Q_R$ and the reflection film 214(L) do not overlap and are separated from each other by a predetermined distance as viewed from above (note that, in FIG. 23, the distance between the reflection film 214(L) and the red light emission control region $Q_R$ is exaggerated (i.e., not to scale)). Therefore, as shown in FIG. 23(*a*), light diffused in a diagonal left direction with respect to the red light emission control region $Q_R$ is reflected by the reflection film 214(L) at a larger reflection angle than when light is reflected by the reflection film 214(R) on the right side. The larger reflection angle causes the reflected light to have a lower luminance (Lambertian distribution). As shown in FIG. 23(*b*), the large reflection angle of light reflected by the reflection film 214(L) may cause the light reflected by the reflection film 214(L) to fail to enter the separation wall portion 216 (the transparent resin portion $216_S$). As shown in FIG. 23(*c*), even when light reflected by the reflection film 214(L) successfully enters the separation wall portion 216, the large incident angle to the separation wall portion 216 causes the light to be totally reflected by an interface between the separation wall portion 216 and the sealing substrate 220 or to be totally reflected by an interface between the sealing substrate 220 and the outside air, and therefore, the light reflected by the reflection film 214(L) is not viewed on the sealing substrate.

Therefore, blue light generated in the red light emission control region $Q_R$ is allowed to enter the red conversion portion $216_R$, blue light generated in the green light emission control region $Q_G$ is allowed to enter the green conversion portion $216_G$, and blue light generated in the blue light emission control region $Q_B$ is allowed to enter the transparent resin portion $216_S$.

Thus, in the organic EL display device 200, a monochromatic blue image is viewed on the organic EL substrate, while an RGB full color image is viewed on the sealing substrate.

<Advantages of Second Embodiment>

Advantages of the organic EL display device 200 of the second embodiment will be described below.

In the organic EL display device 200 of this embodiment, an image displayed on the sealing substrate is formed using light emitted in a diagonal direction from the organic EL elements 215. Therefore, similar to the organic EL display device 100 of the first embodiment, light emitted in a diagonal direction is used to form an image on the sealing substrate. Therefore, even when double-sided display is performed, the luminance of display on the organic EL substrate is not likely to significantly decrease, and the power consumption is not likely to increase. It is also not likely that the blue light emission regions $P_B$ are blocked by the reflection films 214 and therefore the luminance of display on the organic EL substrate significantly decreases.

In this case, an image is viewed on the sealing substrate because light is emitted through the separation wall portion 216 corresponding to the non-light emission region N toward the sealing substrate 220. Therefore, similar to the organic EL display device 100 of the first embodiment, an image can be displayed with high display quality on the sealing substrate 220 as well.

Therefore, in the organic EL display device 200, both the monochromatic blue image on the organic EL substrate and the RGB full color image on the sealing substrate can be displayed with high display quality and without an increase in power consumption.

Similar to the organic EL display device 100 of the first embodiment, the organic EL display device 200 of the second embodiment has the following advantages in addition to the above advantage.

In the organic EL display device 200, the planarization film 213b having a flat surface is provided to cover the reflection films 214, and therefore, it is easy to control the thickness of each of the organic EL elements 215, resulting in the highly reliable organic EL elements 215. In the organic EL display device 200, similar to the organic EL display device 100 of the first embodiment, light does not travel in a gas, and therefore, the loss of the light can be reduced or prevented. In the organic EL display device 200, even though an image is displayed on the sealing substrate, the problem that the color purity or luminance varies depending on the viewing angle due to the microcavity effect, does not arise.

In addition to the advantages of the organic EL display device 100 of the first embodiment, advantages specific to the organic EL display device 200 are as follows.

In the organic EL display device 200, all the light emission regions are the blue light emission region $P_B$, and therefore, only the blue light emitting layers need to be formed as the light emitting layers. Therefore, the organic EL display device 200 can be more easily fabricated, leading to a higher yield.

In the organic EL display device 200, red light and green light are obtained by the red conversion portion $216_R$ and the green conversion portion $216_G$. Therefore, the red light and the green light can be caused to have a desired chromaticity by adjusting a thickness or color conversion characteristics of the fluorescent material of the color conversion portions $216_R$ and $216_G$, respectively.

<Variations of Second Embodiment>

Variations of the separation wall portion 216, the reflection film 214, etc. included in the organic EL display device 200 of the second embodiment will be described below.

(Variation 8)

Figure 24:
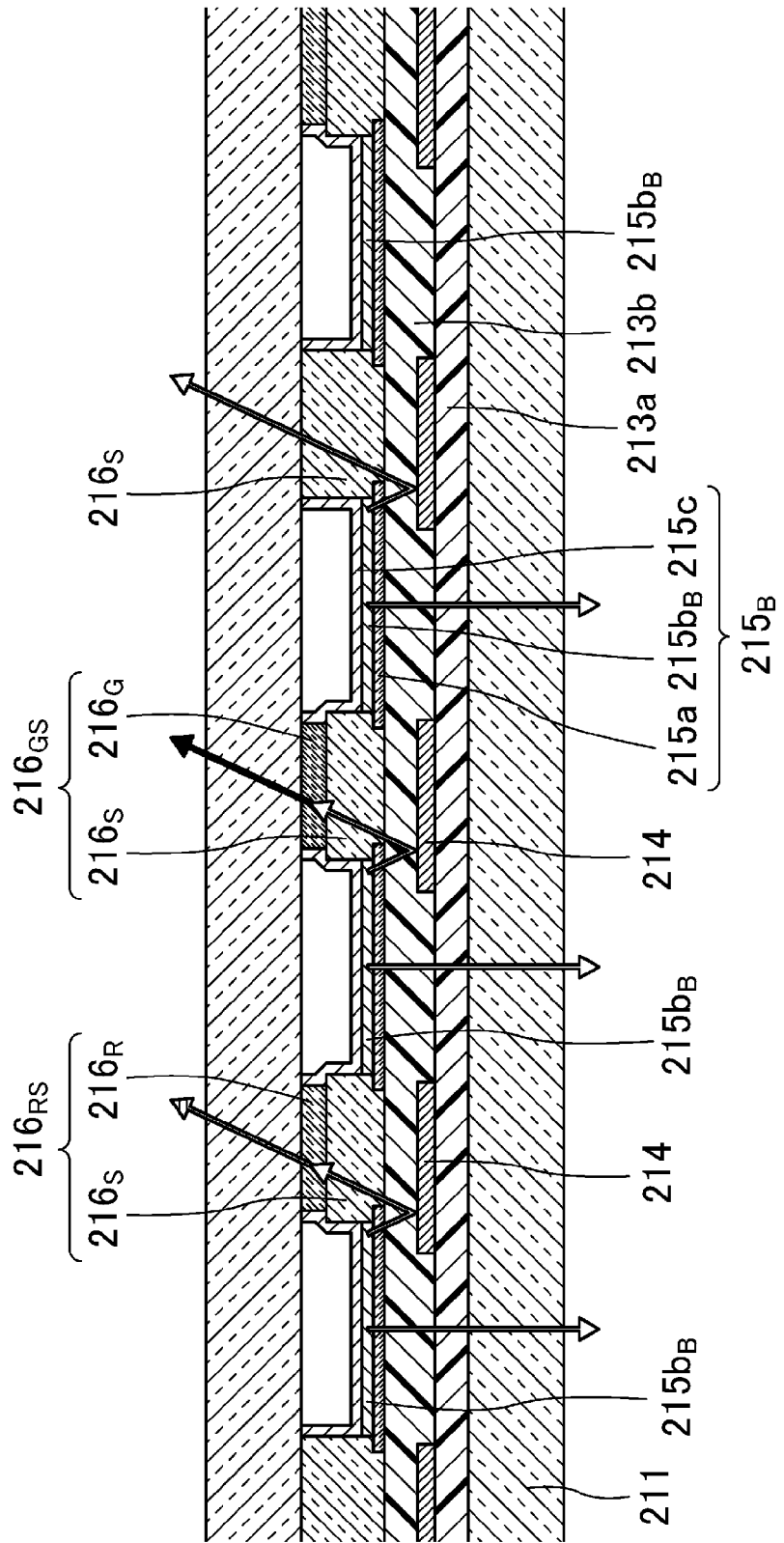
[FIG. 24]
Figure 25:
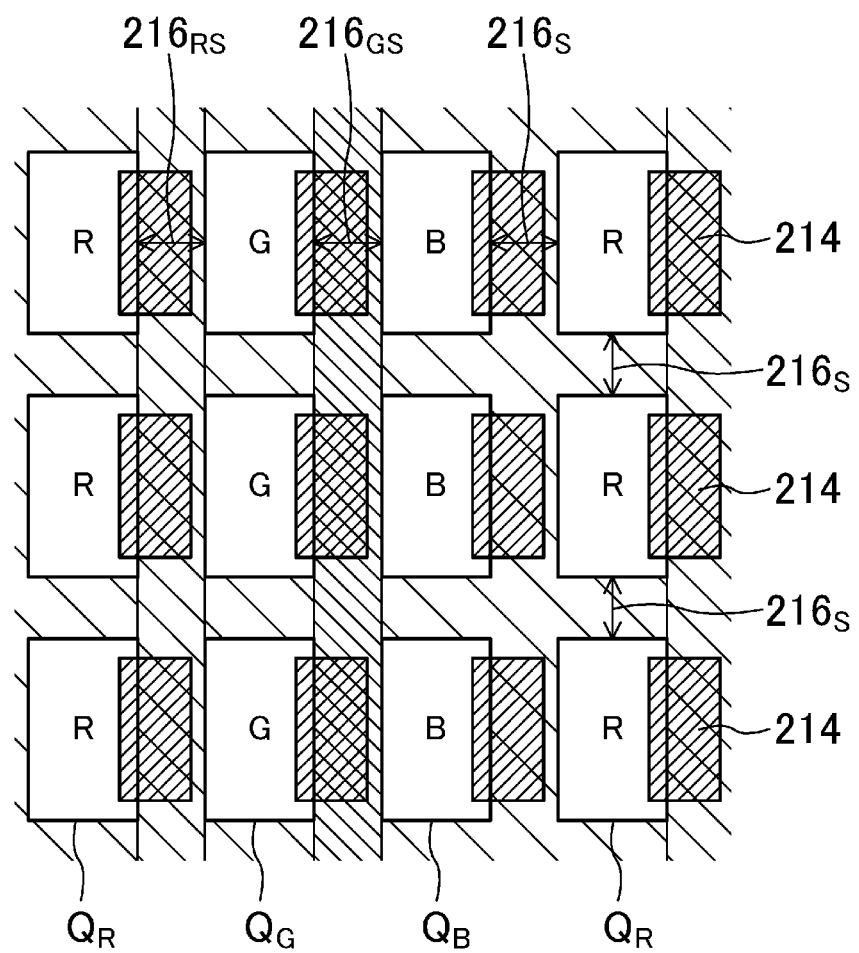
[FIG. 25]

FIG. 24 shows a cross-sectional view of the organic EL display device 200 according to Variation 8. FIG. 25 shows a schematic layout of the color light emission control regions $Q_R$, $Q_G$, and $Q_B$, the separation wall portion 216, and the reflection films 214. Here, in the separation wall portion 216, portions which convert blue light into light having a red wavelength are provided as red conversion portions $216_{RS}$ which are provided by forming the red conversion portions $216_R$ on the transparent resin portions $216_S$. Also, portions which convert blue emitted light into light having a green wavelength are provided as green conversion portions $216_{GS}$ which are provided by forming the green conversion portions $216_G$ on the transparent resin portions $216_S$.

Even when the heights of the color conversion portions $216_R$ and $216_G$ are caused to be smaller than that of the transparent resin portion $216_S$ in order to adjust the tinge of red light and green light extracted from the sealing substrate 220, in the configuration of Variation 8 the smaller heights of the color conversion portions $216_R$ and $216_G$ are compensated for by the transparent resin portion $216_S$, whereby the separation wall portion 216 can have a uniform height in the entire region. Therefore, the function of the separation wall portion 216 as a spacer has higher reliability.

(Variation 9)

Figure 26A:
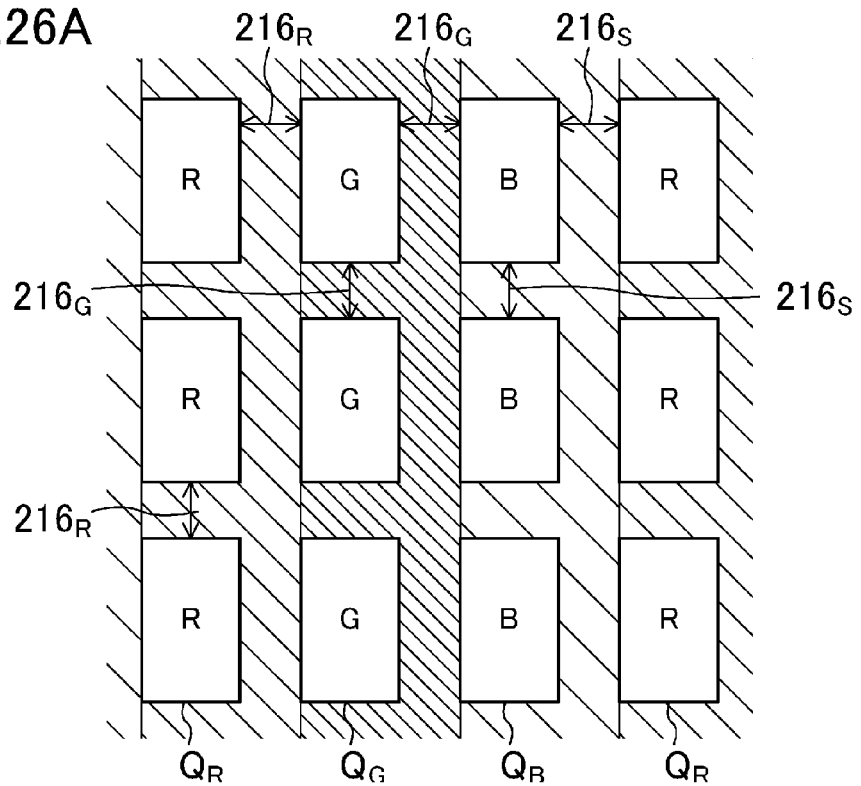
FIG. 26(a) is a schematic plan view of a layout of color light emission control regions and a separation wall portion (color conversion portions and transparent resin portions) of an organic EL display device according to Variation 9.
Figure 26B:
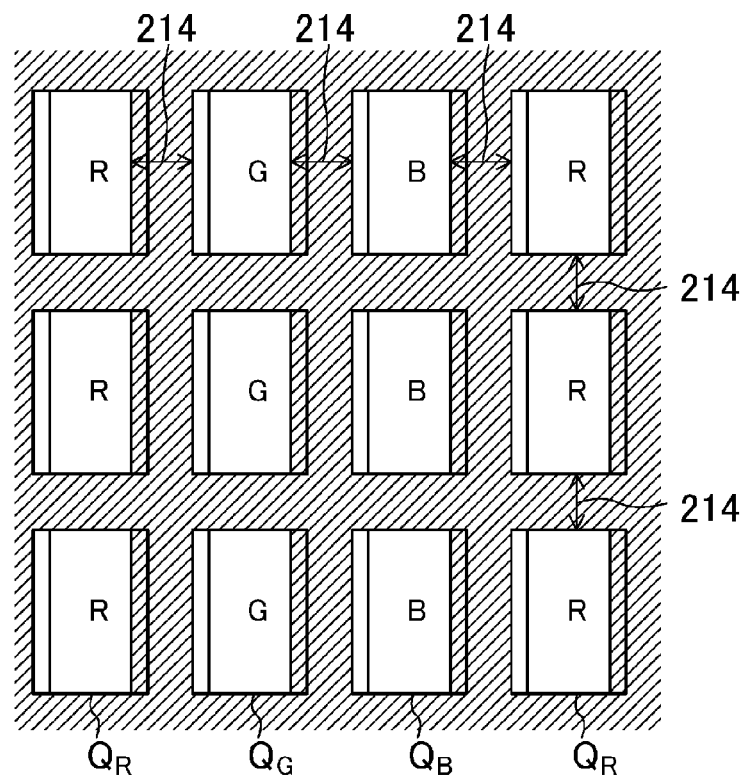
FIG. 26(b) is a schematic plan view of a layout of light emission regions and a reflection film of the organic EL display device of Variation 9.
Figure 27:
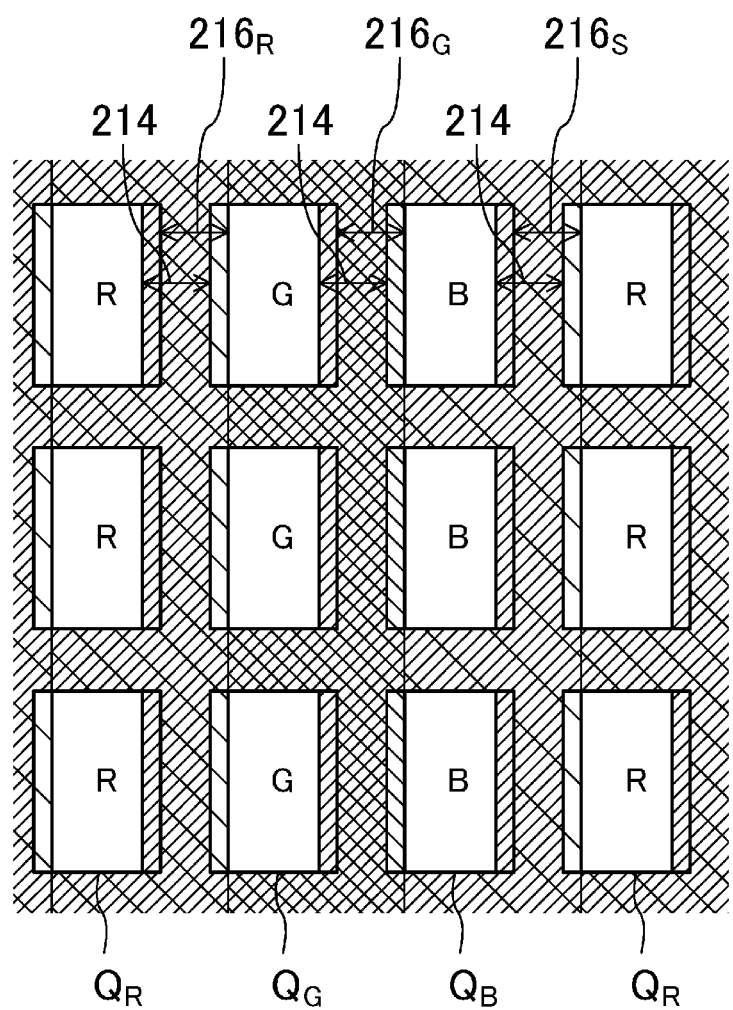
[FIG. 27]

FIGS. 26 and 27 show a schematic layout of the color light emission control regions $Q_R$, $Q_G$, and $Q_B$, the separation wall portion 216, and the reflection films 214 of the organic EL display device 200 according to Variation 9.

In the second embodiment, the red conversion portions $216_R$ and the green conversion portions $216_G$ are provided in a band-like pattern on the right sides of the red light emission control regions $Q_R$ and the green light emission control regions $Q_G$, and the transparent resin portions $216_S$ are provided in regions above and below the red light emission control regions $Q_R$ and the green light emission control regions $Q_G$. Alternatively, as shown in FIG. 26(a), the red conversion portions $216_R$ may also be provided in regions above and below the red light emission control regions $Q_R$, and the green conversion portions $216_G$ may also be provided in regions above and below the green light emission control regions $Q_G$.

In this case, as shown in FIG. 26(b), the reflection film 214 is also provided in regions above and below the color light emission control regions $Q_R$, $Q_G$, and $Q_B$, whereby a portion of blue light generated in the red light emission control regions $Q_R$ which leaks in a diagonal direction is reflected toward the sealing substrate 220 by the reflection film 214 on three sides (the right, upper, and lower sides) of the red light emission control regions $Q_R$. The reflected light travels through the red conversion portions $216_R$ before reaching the sealing substrate 220, so that the light having a blue wavelength is converted into light having a red wavelength. As a result, a red image is obtained on the sealing substrate 220. This holds true for blue light generated in the green light emission control regions $Q_G$ and the blue light emission control regions $Q_B$. Therefore, in addition to light leaking rightward with respect to the color light emission control regions $Q_R$, $Q_G$, and $Q_B$, light leaking in diagonal up and down directions with respect to the color light emission control regions $Q_R$, $Q_G$, and $Q_B$ can be effectively used as an image on the sealing substrate 220, whereby the efficiency of light emission on the sealing substrate 220 can be increased.

(Variations 10 and 11)

Figure 28A:
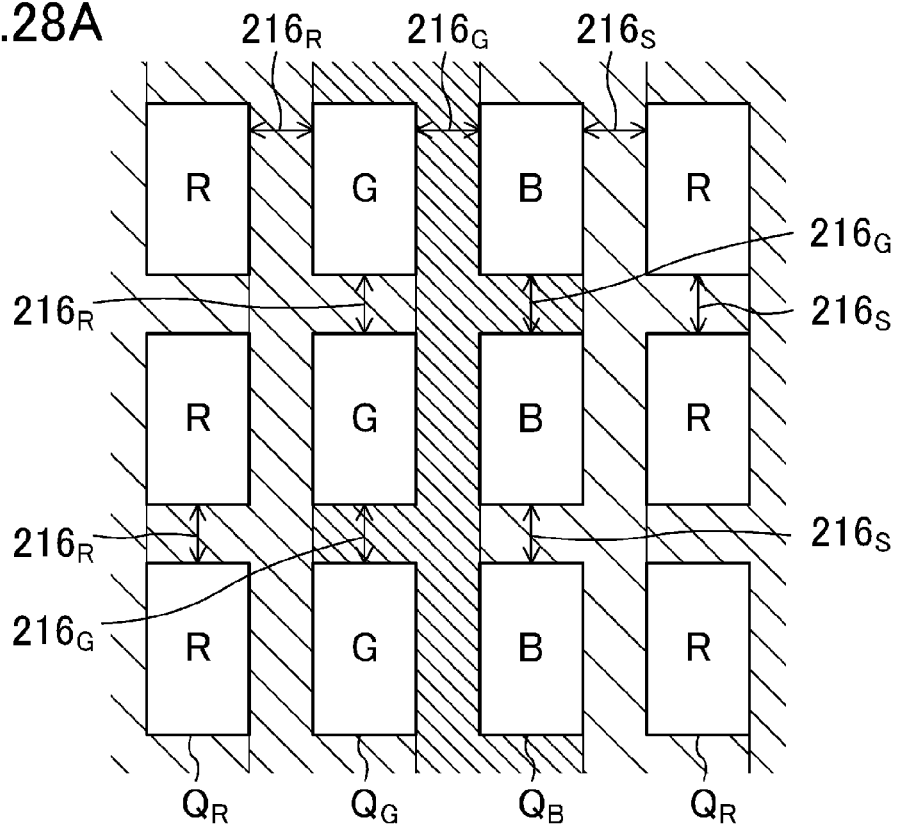
FIG. 28(a) is a schematic plan view of a layout of color light emission control regions and a separation wall portion (color conversion portions and transparent resin portions) of an organic EL display device according to Variation 10.
Figure 28B:
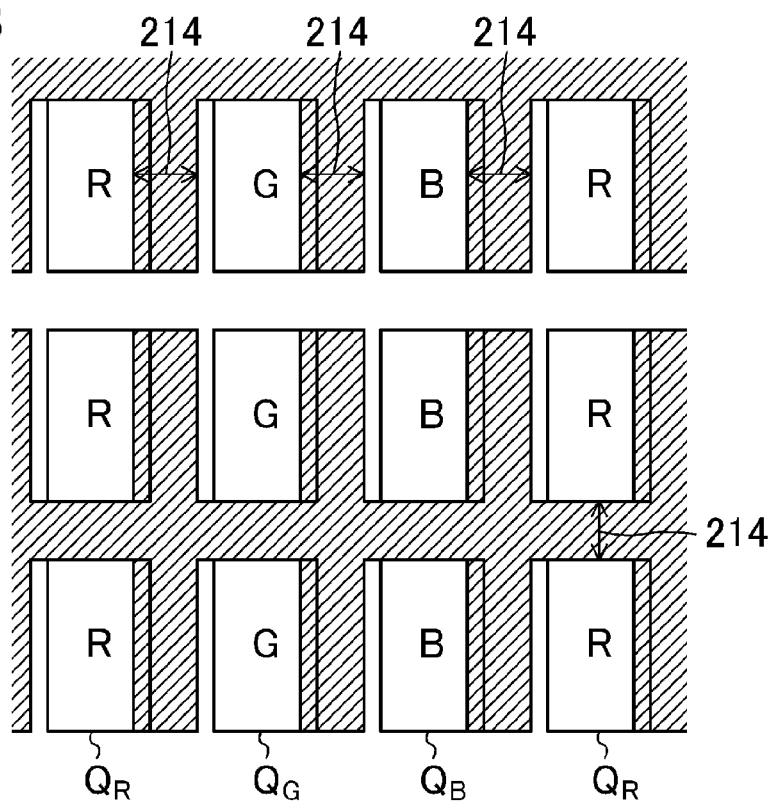
FIG. 28(b) is a schematic plan view of a layout of light emission regions and a reflection film of the organic EL display device of Variation 10.
Figure 29:
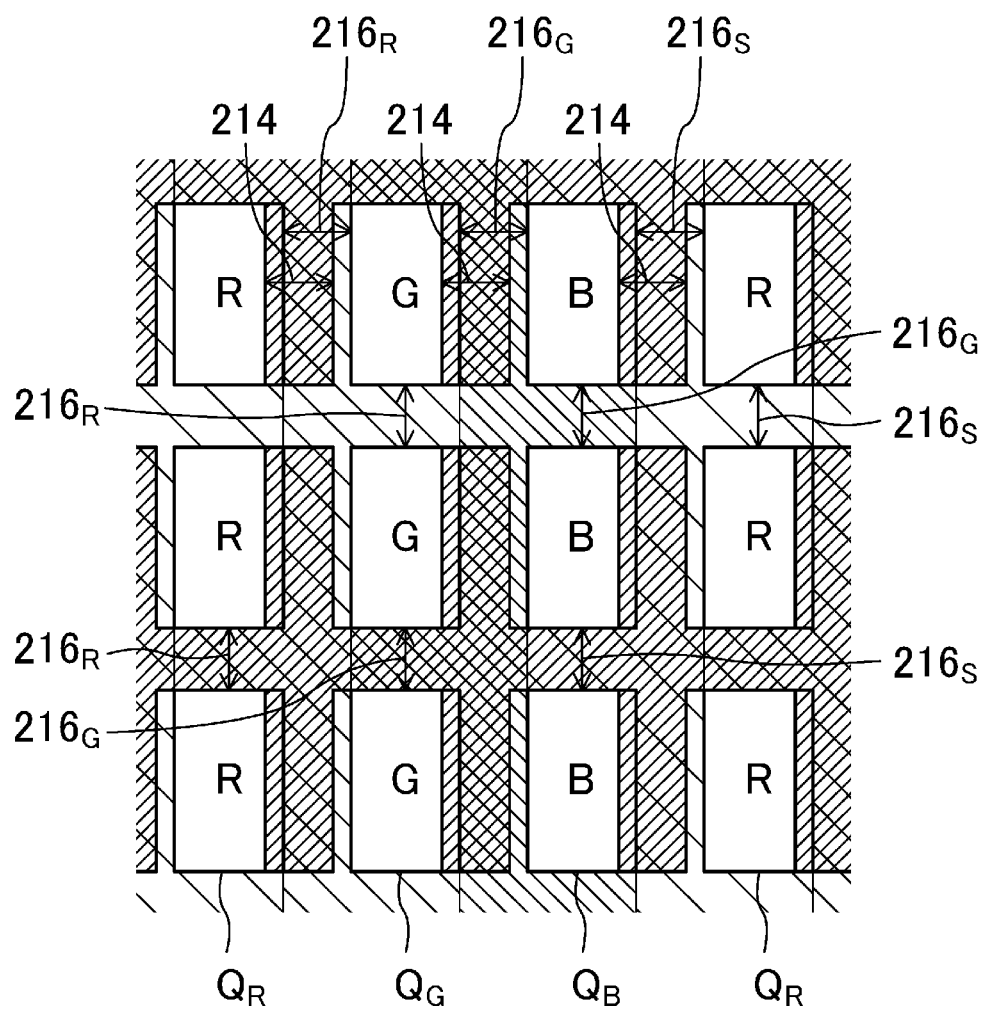
[FIG. 29]
Figure 30A:
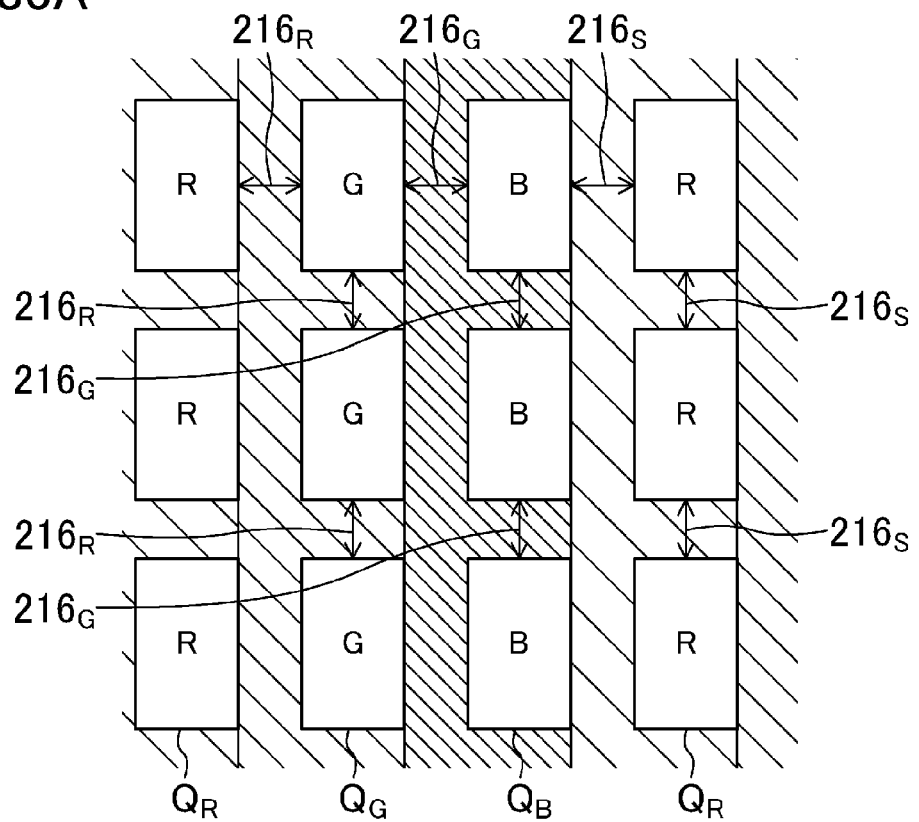
FIG. 30(a) is a schematic plan view of a layout of color light emission control regions and a separation wall portion (color conversion portions and transparent resin portions) of an organic EL display device according to Variation 11.
Figure 30B:
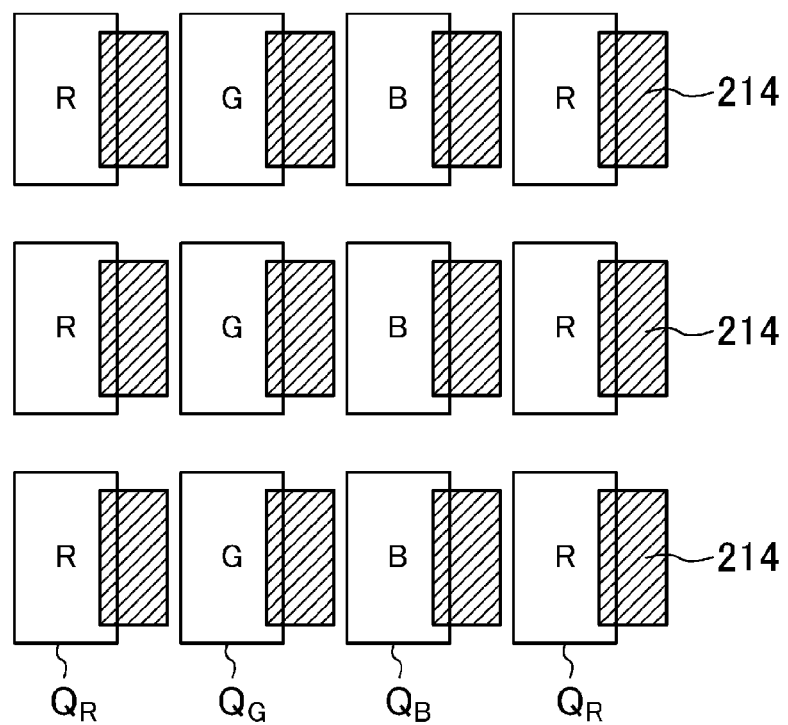
FIG. 30(b) is a schematic plan view of a layout of light emission regions and reflection films of the organic EL display device of Variation 11.
Figure 31:
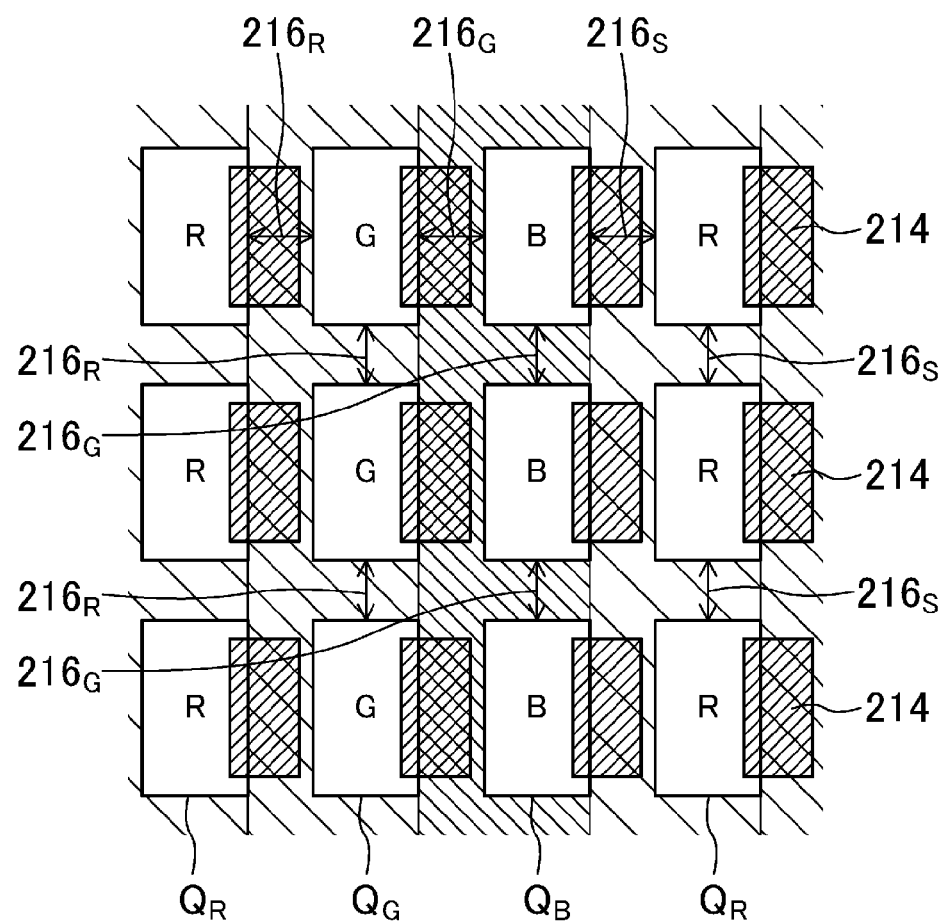
[FIG. 31]

FIGS. 28 and 29 schematically show a layout of the color light emission control regions $Q_R$, $Q_G$, and $Q_B$, the separation wall portion 216, and the reflection films 214 of the organic EL display device 200 according to Variation 10. FIGS. 30 and 31 schematically show a layout of the color light emission control regions $Q_R$, $Q_G$, and $Q_B$, the separation wall portion 216, and the reflection films 214 of the organic EL display device 200 according to Variation 11.

As shown in FIG. 28(a) as Variation 10, the color conversion portions and the transparent resin portions $216_S$ of the separation wall portion 216 may be arranged as follows: the red conversion portions $216_R$ are provided on the right sides and either the upper sides or the lower sides of the red light emission control regions $Q_R$; the green conversion portions $216_G$ are provided on the right sides and either the upper sides or the lower sides of the green light emission control regions $Q_G$; and the transparent resin portions $216_S$ are provided on the right sides and either the upper sides or the lower sides of the blue light emission control regions $Q_B$. Alternatively, as shown in FIG. 30(a) as Variation 11, the red conversion portions $216_R$ may be provided on the right sides of the red light emission control regions $Q_R$, the transparent resin portions $216_S$ may be provided on the upper and lower sides of the red light emission control regions $Q_R$, the green conversion portions $216_G$ may be provided on the right sides of the green light emission control regions $Q_G$, the red conversion portions $216_R$ may be provided on the upper and lower sides of the green light emission control regions $Q_G$, and the transparent resin portions $216_S$ may be provided on the right sides of the blue light emission control regions $Q_B$, and the green conversion portions $216_G$ may be provided on the upper and lower sides of the blue light emission control regions $Q_B$.

In Variation 10, light leaking in two directions (rightward and upward, or rightward and downward) with respect to the color light emission control regions $Q_R$, $Q_G$, and $Q_B$ is reflected by the reflection films 214 toward the sealing substrate 220. In Variation 11, light leaking in a diagonal right direction with respect to the color light emission control regions $Q_R$, $Q_G$, and $Q_B$ is reflected by the reflection films 214 toward the sealing substrate 220. Note that Variation 9 is more preferable in terms of the efficiency of light emission on the sealing substrate 220.

(Variation 12)

Figure 32:
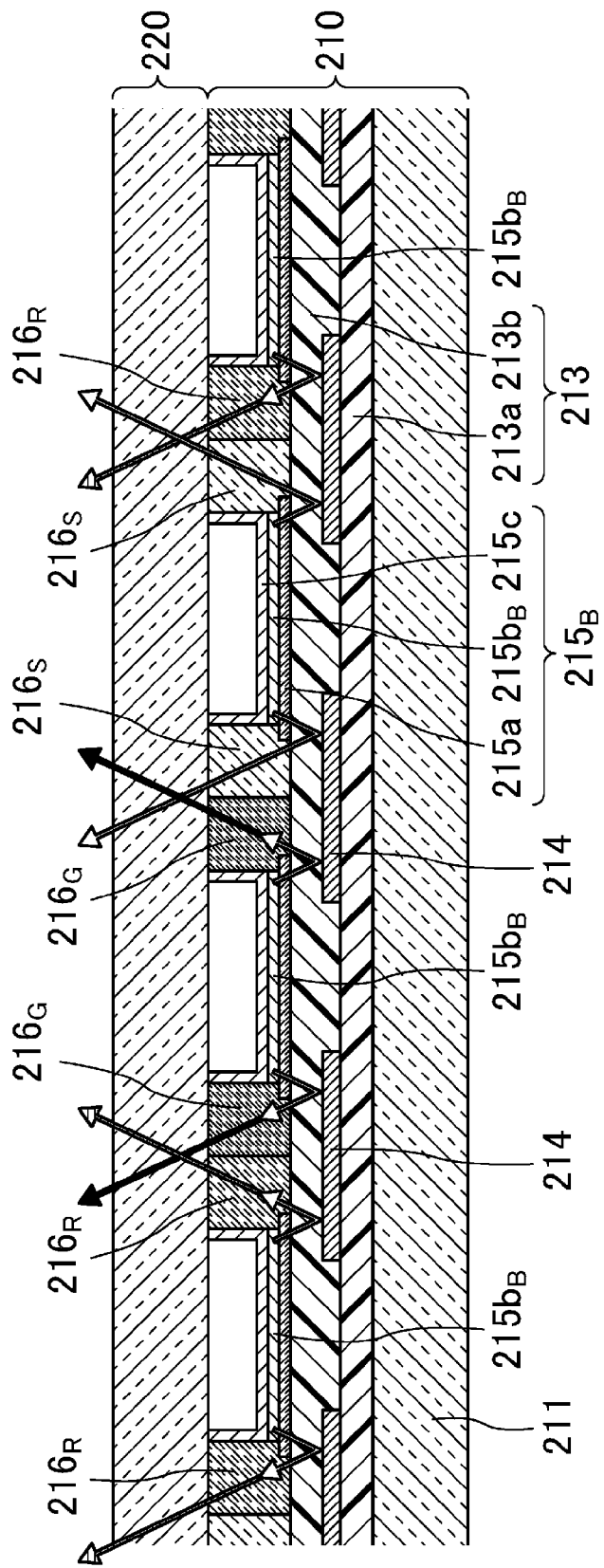
[FIG. 32]

FIG. 32 shows a cross-sectional view of the organic EL display device 200 according to Variation 12. FIGS. 33 and 34 schematically show a layout of the color light emission control regions $Q_R$, $Q_G$, and $Q_B$, the separation wall portion 216, and the reflection films 214 of the organic EL display device 200 of Variation 12.

Figure 33A:
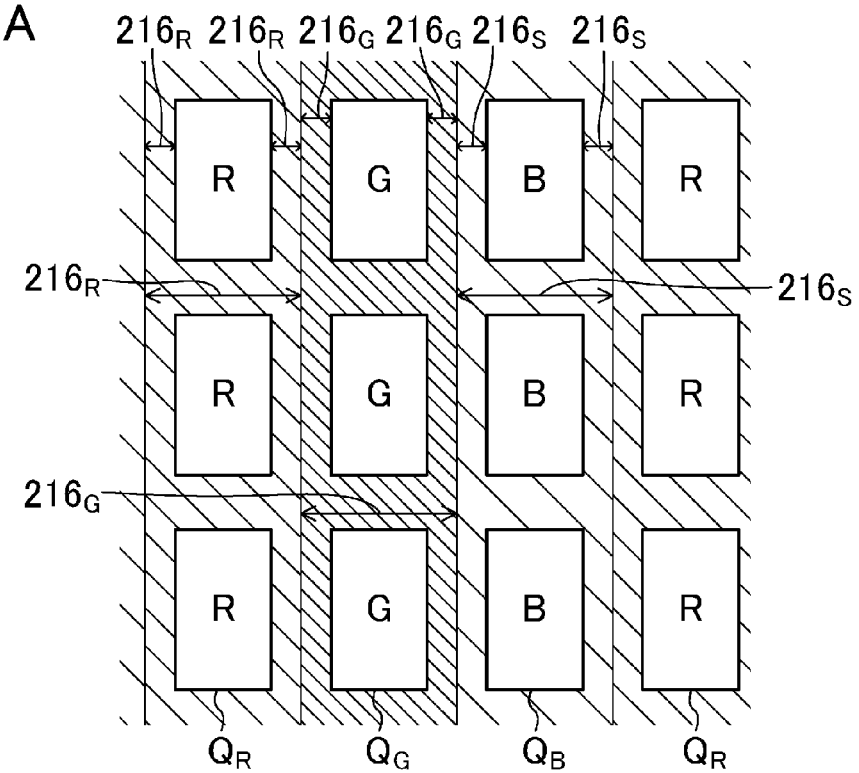
FIG. 33(a) is a schematic plan view of a layout of color light emission control regions and a separation wall portion (color conversion portions and transparent resin portions) of the organic EL display device of Variation 12.
Figure 34:
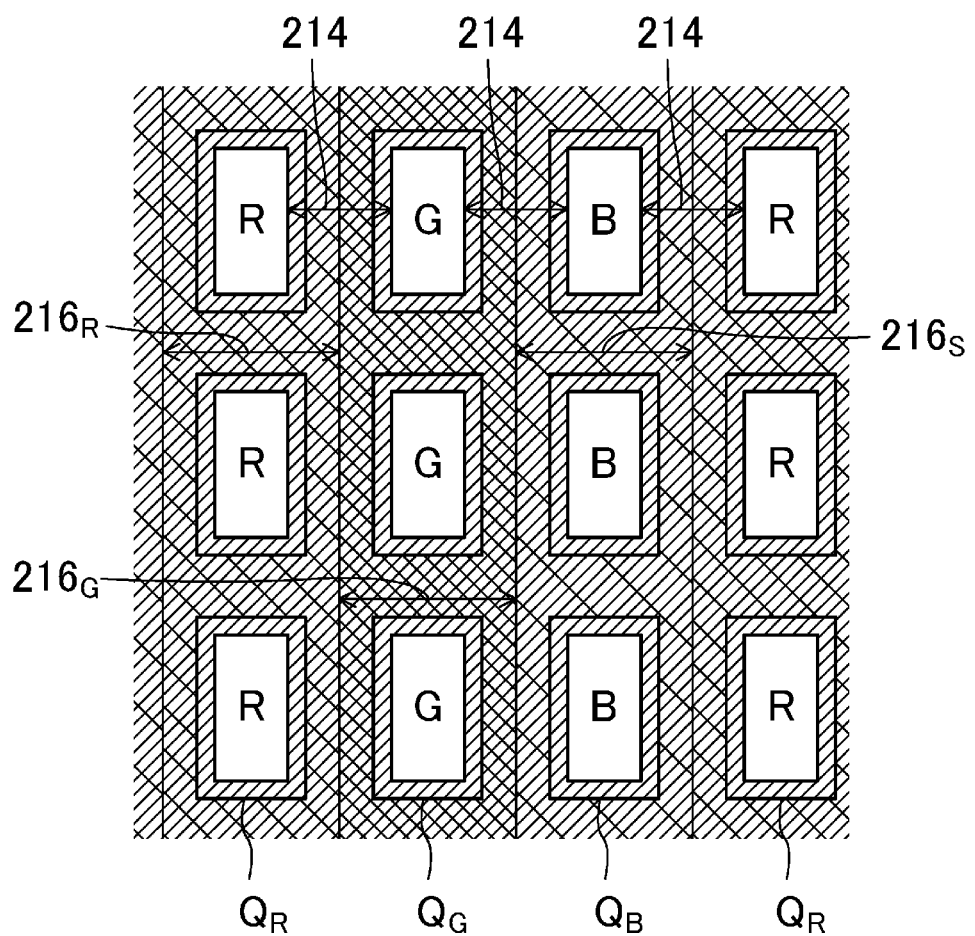
[FIG. 34]

As shown in FIG. 33(a), in the separation wall portion 216 of Variation 12, the red conversion portion $216_R$ is provided between each red light emission control region $Q_R$, the green conversion portion $216_G$ is provided between each green light emission control region $Q_G$, and the transparent resin portion $216_S$ is provided between each blue light emission control region $Q_B$. A region between the red light emission control region $Q_R$ and the green light emission control region $Q_G$ is divided into two in a direction along the edges of the light emission control regions $Q_R$ and $Q_G$. The red conversion portion $216_R$ is provided in the portion closer to the red light emission control region $Q_R$, while the green conversion portion $216_G$ is provided in the portion closer to the green light emission control region $Q_G$. A region between the green light emission control region $Q_G$ and the blue light emission control region $Q_B$ is divided into two in a direction along the edges of the light emission control regions $Q_G$ and $Q_B$. The green conversion portion $216_G$ is provided in the region closer to the green light emission control region $Q_G$, while the transparent resin portion $216_S$ is provided in the portion closer to the blue light emission control region $Q_B$. A region between the blue light emission control region $Q_B$ and the red light emission control region $Q_R$ is divided into two in a direction along the edges of the light emission control regions $Q_B$ and $Q_R$. The transparent resin portion $216_S$ is provided in the portion closer to the blue light emission control region $Q_B$, while the red conversion portion $216_R$ is provided in the portion closer to the red light emission control region $Q_R$.

Figure 33B:
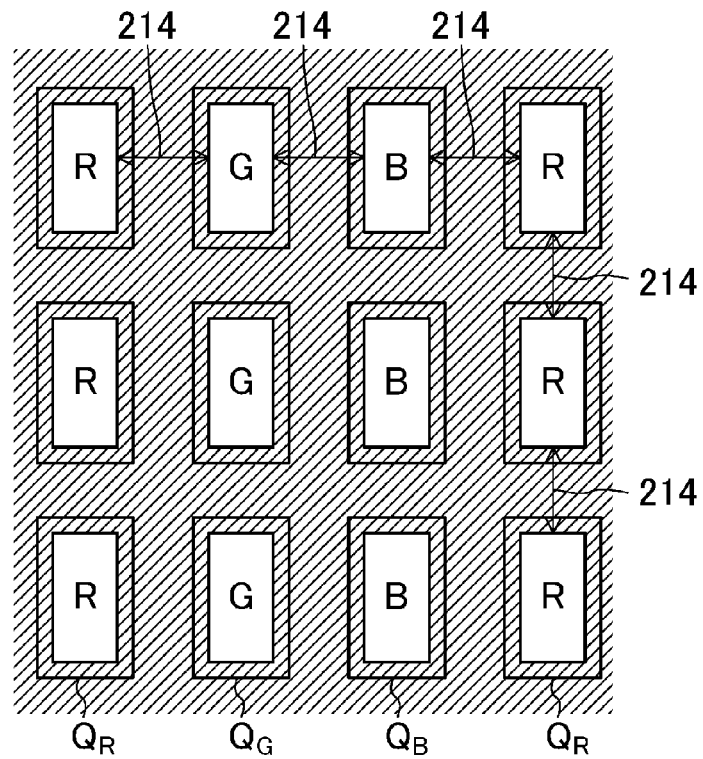
FIG. 33(b) is a schematic plan view of a layout of light emission regions and a reflection film of the organic EL display device of Variation 12.

As shown in FIG. 33(b), the reflection films 214 are provided to surround the color light emission control regions $Q_R$, $Q_G$, and $Q_B$, and overlap the color light emission control regions $Q_R$, $Q_G$, and $Q_B$.

This configuration allows a portion of blue light generated in the red light emission control regions $Q_R$ which leaks in a diagonal direction, to be reflected by the reflection films 214 no matter whether the light leaks in rightward, leftward, upward, or downward with respect to the control regions. The reflected light travels through the red conversion portions $216_R$ provided around the red light emission control regions $Q_R$ before reaching the sealing substrate 220, whereby light having a blue wavelength is converted into light having a red wavelength, and therefore, a red image is obtained on the sealing substrate 220. This holds true for blue light generated in the green light emission control regions $Q_G$ and the blue light emission control regions $Q_B$. Therefore, light leaking in all diagonal right, left, up, and down directions from the color light emission control regions $Q_R$, $Q_G$, and $Q_B$ can be effectively used as an image on the sealing substrate 220, whereby the efficiency of light emission on the sealing substrate 220 can be increased.

Figure 35:
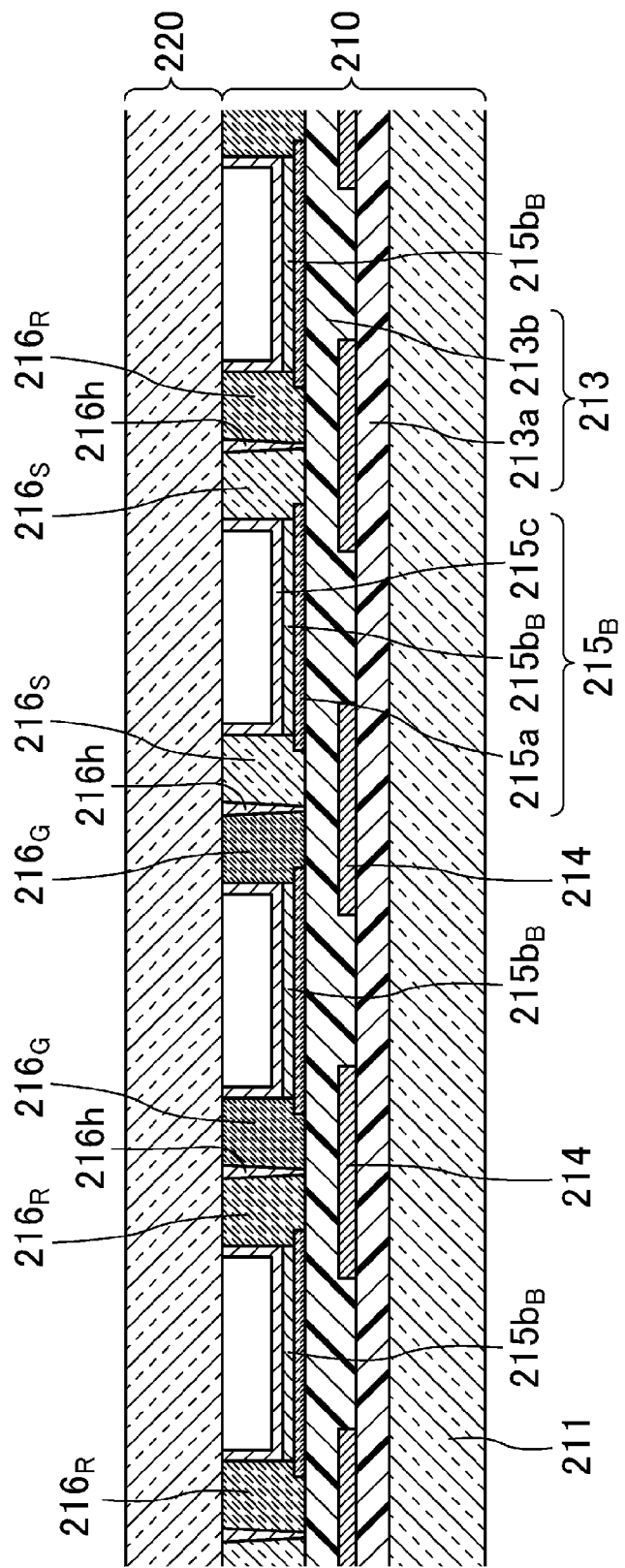
[FIG. 35]

Note that, as shown in FIG. 35, in order to reduce or prevent mixture of the colors, a separation structure 216h may be provided at a boundary between the color conversion portion $216_R$ or $216_G$ and the transparent resin portion $216_S$ of the control regions having the different colors. The separation structure 216h may be formed by providing, in the step of forming the separation wall portion 216, a gap at a boundary portion between the red conversion portion $216_R$ and the green conversion portion $216_G$, at a boundary portion between the red conversion portion $216_R$ and the transparent resin portion $216_S$, and at a boundary portion between the green conversion portion $216_G$ and the transparent resin portion $216_S$. This is because, in the subsequent step of forming the upper electrode 215c, these gaps are filled with the upper electrode material, whereby the separation structure 216h is formed.

(Variation 13)

Figure 36:
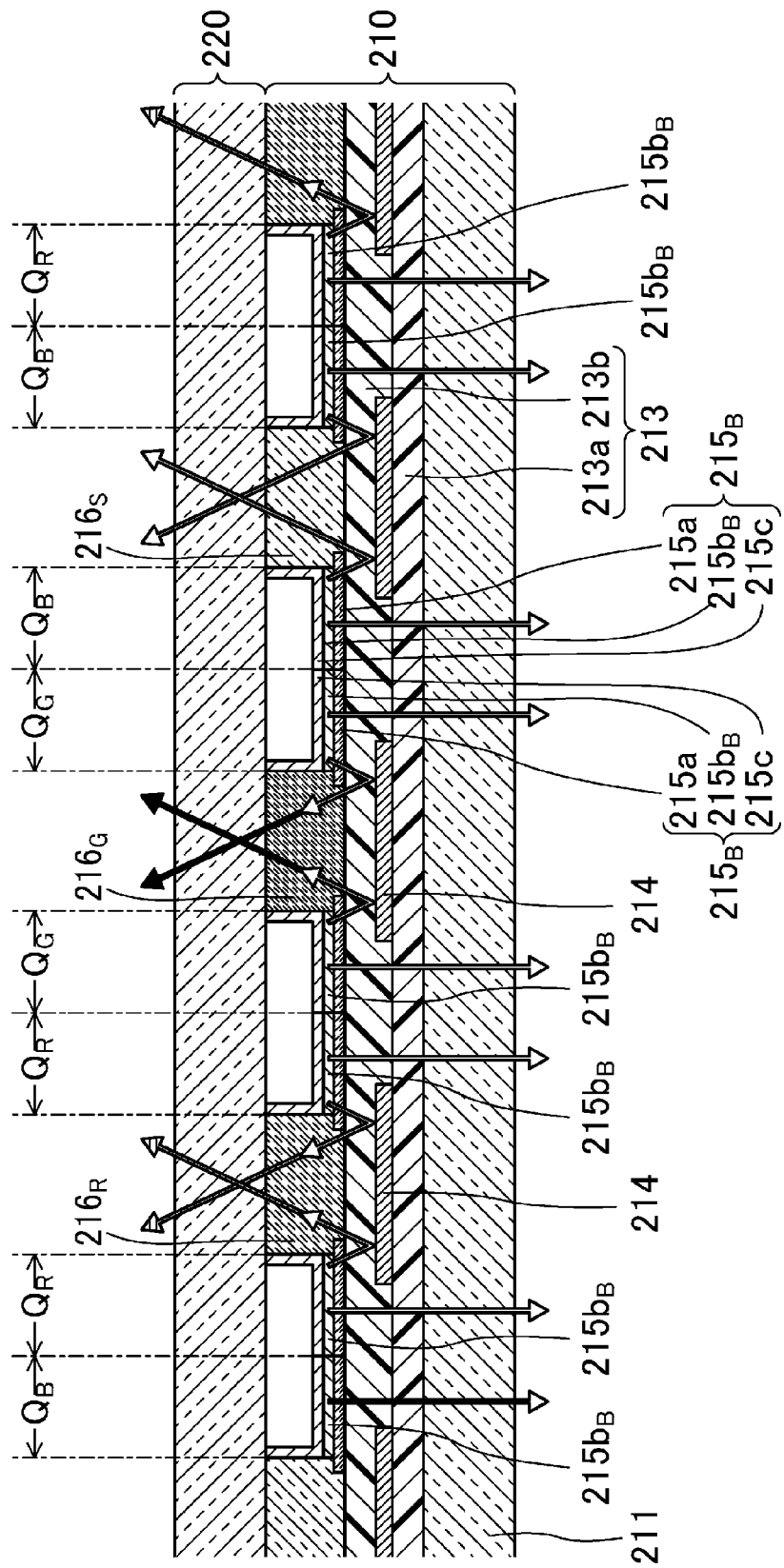
[FIG. 36]
Figure 37A:
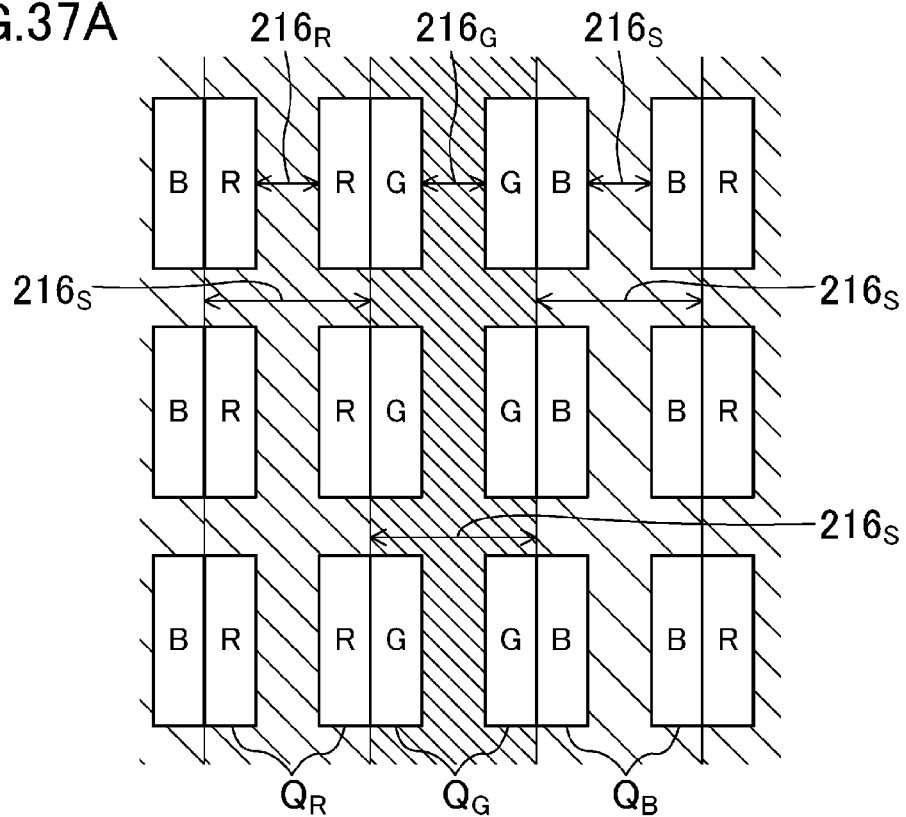
FIG. 37(a) is a schematic plan view of a layout of color light emission control regions and a separation wall portion (color conversion portions and transparent resin portions) of the organic EL display device of Variation 13.

FIG. 36 shows a cross-sectional view of the organic EL display device 200 according to Variation 13. FIGS. 37 and 38 schematically show a layout of the color light emission control regions $Q_R$, $Q_G$, and $Q_B$, the separation wall portion 216, and the reflection films 214 of the organic EL display device 200 of Variation 13.

In Variation 13, the blue light emission regions $P_B$ include the red light emission control regions $Q_R$, the green light emission control regions $Q_G$, and the blue light emission control regions $Q_B$. As shown in FIGS. 36-38, each single blue light emission region $P_B$ includes the red light emission control region $Q_R$ and the green light emission control region $Q_G$, the green light emission control region $Q_G$ and the blue light emission control region $Q_B$, or the blue light emission control region $Q_B$ and the red light emission control region $Q_R$. In other words, one blue light emission region $P_B$ is driven by two independent switching elements. Of the blue light emission region $P_B$, a region adjacent to the red conversion portion $216_R$ of the separation wall portion 216 is disposed to serve as the red light emission control region $Q_R$, a region adjacent to the green conversion portion $216_G$ is disposed to serve as the green light emission control region $Q_G$, and a region adjacent to the transparent resin portion $216_S$ is disposed to serve as the blue light emission control region $Q_B$.

Figure 37B:
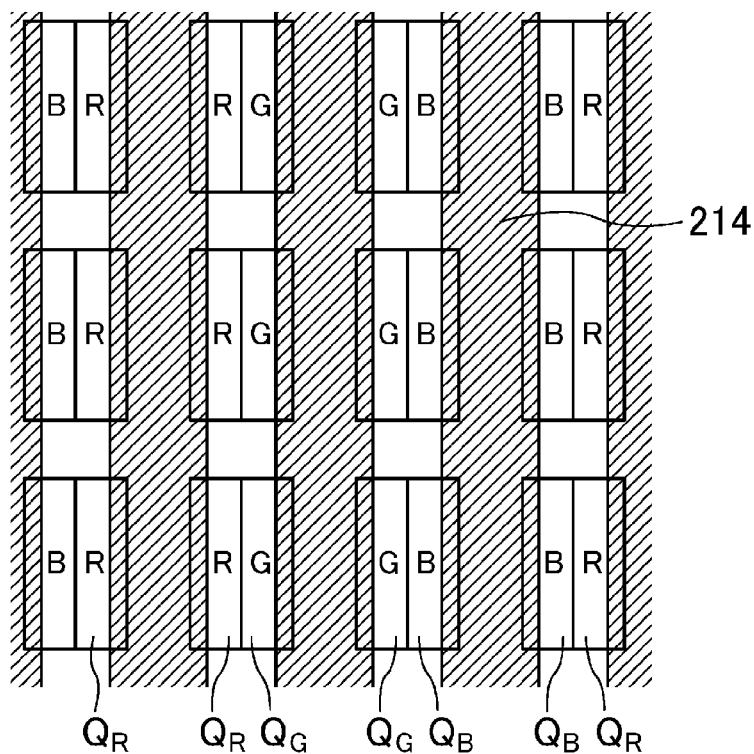
FIG. 37(b) is a schematic plan view of a layout of light emission regions and reflection films of the organic EL display device of Variation 13.
Figure 38:
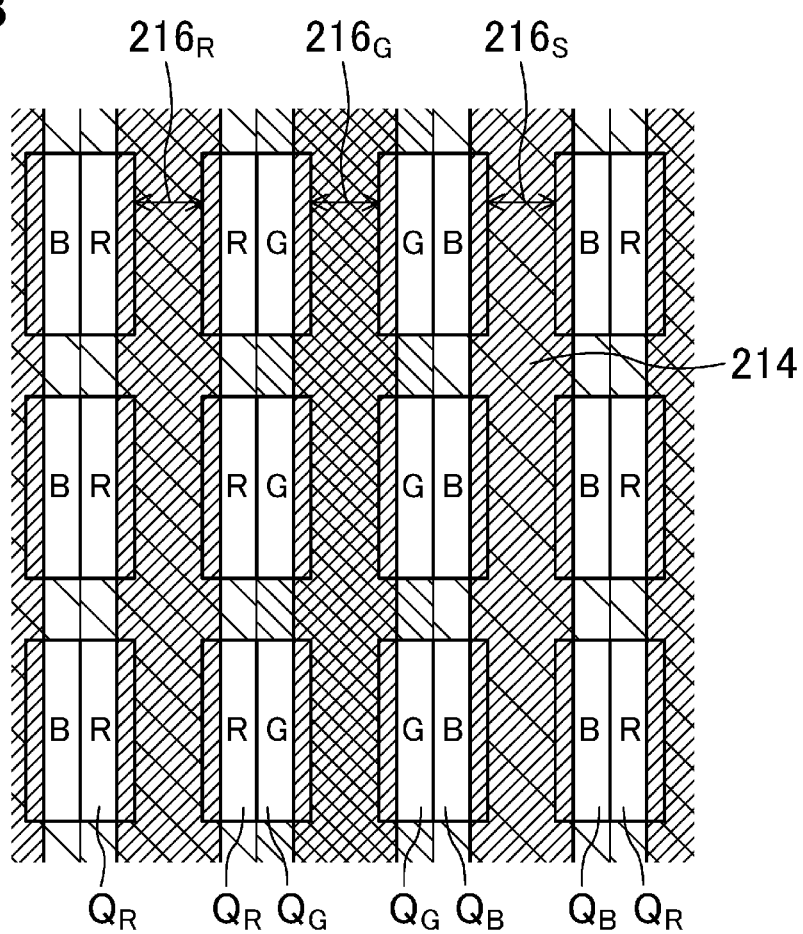
[FIG. 38]

As shown in FIG. 37(b), the reflection films 214 are provided to overlap left and right circumferential portions of the blue light emission regions $P_B$.

With this configuration, in the blue light emission region $P_B$ including the red light emission control region $Q_R$ and the green light emission control region $Q_G$, blue light leaking in a diagonal direction from the red light emission control region $Q_R$ is reflected by the reflection film 214 toward the sealing substrate 220 to enter the red conversion portion $216_R$, so that the light is viewed as red light on the sealing substrate. On the other hand, blue light leaking in a diagonal direction from the green light emission control region $Q_G$ is reflected by the reflection film 214 toward the sealing substrate 220 to enter the green conversion portion $216_G$, so that the light is viewed as green light on the sealing substrate. This holds true for the blue light emission region $P_B$ including the green light emission control region $Q_G$ and the blue light emission control region $Q_B$, and the blue light emission region $P_B$ including the blue light emission control region $Q_B$ and the red light emission control region $Q_R$.

In the second embodiment, a monochromatic blue image is displayed on the organic EL substrate of the organic EL display device 200. Alternatively, a monochromatic image having a color other than blue may be displayed by, for example, allowing light to be viewed through a color conversion filter.

<<Third Embodiment>>

Next, an organic EL display device 300 according to a third embodiment will be described.

<Configuration of Organic EL Display Device 300>

Firstly, a configuration of the organic EL display device 300 will be described. The organic EL display device 300 is a display which displays an RGB full color image on both front and back sides thereof. The organic EL display device 300 is used, for example, as a display including a single display panel which serves as both a primary screen (main display) and a secondary screen (sub-display), in a mobile device (a mobile telephone, a multimedia player, etc.) which has a primary screen (main display) and a secondary screen (sub-display), or a display (an advertising display panel etc.) which displays an image on both front and back sides thereof.

As in the first embodiment, the organic EL display device 300 includes a flat panel-like organic EL substrate 310 and sealing substrate 320 which face each other. The sealing substrate 320 has a configuration similar to that of the sealing substrate 120 of the first embodiment.

Figure 39:
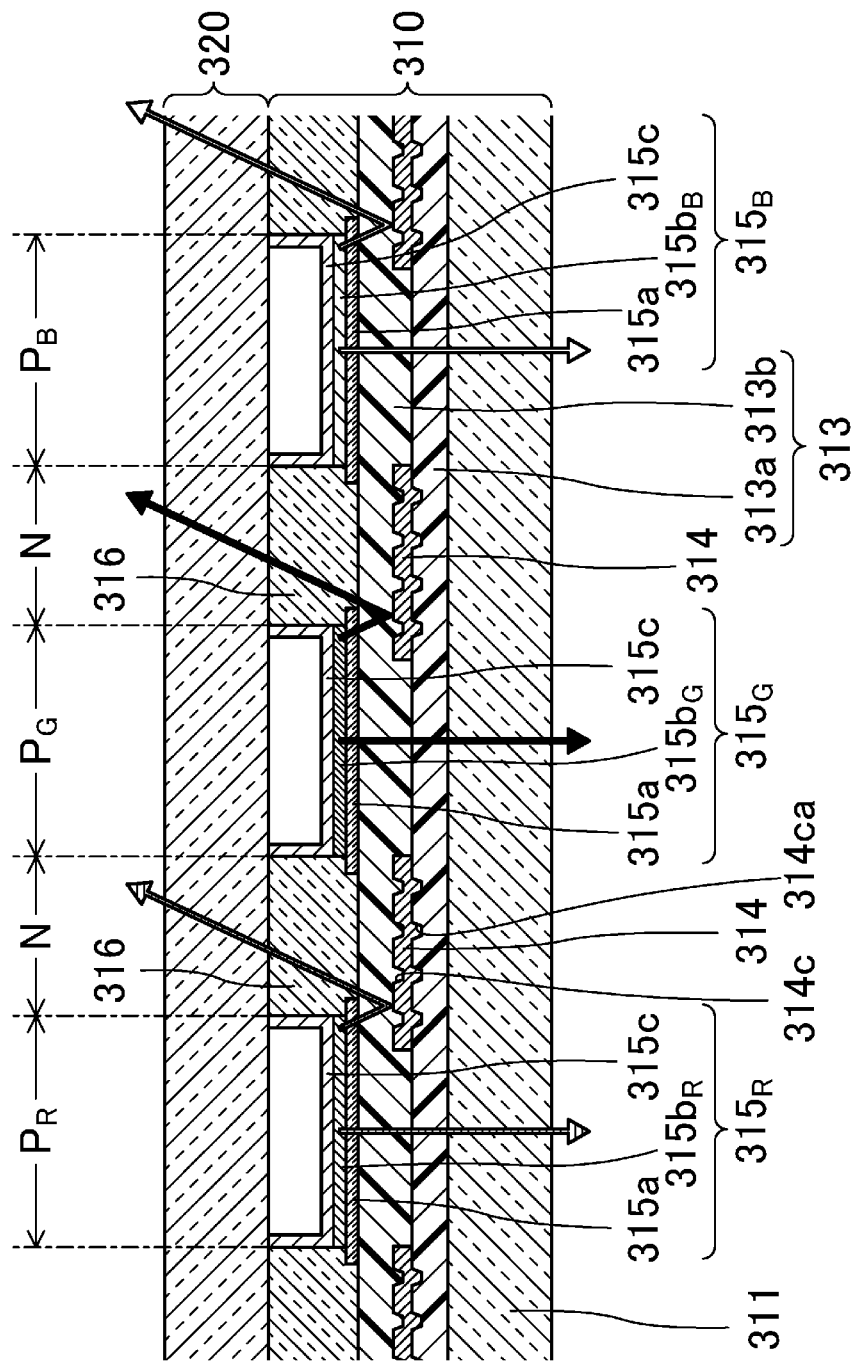
[FIG. 39]

FIG. 39 is a cross-sectional view of a display region D of the organic EL display device 300. The organic EL display device 300 has, in the display region D, a plurality of red light emission regions $P_R$, green light emission regions $P_G$, and blue light emission regions $P_B$ which are arranged in a matrix. A predetermined image is displayed in the entire display region D by the light emission regions $P_R$, $P_G$, and $P_B$ being driven independently of each other. A grid-like region other than the blue light emission regions $P_R$, $P_G$, and $P_B$ is a non-light emission region N.

—Organic EL Substrate 310—

The organic EL substrate 310 includes, on an organic EL substrate body 311, a plurality of TFTs each provided as a switching element for a corresponding one of the light emission regions $P_R$, $P_G$, and $P_B$, an insulating layer 313 which covers the organic EL substrate body 311 and the TFTs, a plurality of red light emission organic EL elements $315_R$, green light emission organic EL elements $315_G$, and blue light emission organic EL elements $315_B$ provided on the insulating layer 313, corresponding to the red light emission regions $P_R$, the green light emission regions $P_G$, and the blue light emission regions $P_B$, and a separation wall portion 316 formed in a grid-like pattern, corresponding to the non-light emission region N, to separate the organic EL elements $315_R$, $315_G$, and $315_B$ from each other. Note that, in the description that follows and the drawings, the red light emission organic EL elements $315_R$, the green light emission organic EL elements $315_G$, and the blue light emission organic EL elements $315_B$ may also be collectively referred to as organic EL elements 315. The organic EL substrate body 311, the TFTs, the insulating layer 313, the organic EL elements 315, and the separation wall portion 316 have configurations similar to those of the organic EL display device 100 of the first embodiment.

—Insulating Layer 313—

As shown in FIG. 39, the insulating layer 313 includes an interlayer insulating film 313a (first insulating film) closer to the organic EL substrate body 311, and a planarization film 313b (second insulating film) thereabove, which are provided one on top of the other. A plurality of reflection films 314 are provided between the interlayer insulating film 313a and the planarization film 313b, corresponding to the non-light emission region N.

—Interlayer Insulating Film 313a—

Similar to the organic EL display device 100 of the first embodiment, the interlayer insulating film 313a includes a first interlayer insulating film, a second interlayer insulating film, and a third interlayer insulating film which are provided on top of one another. A plurality of recessed portions 314ca are formed on a surface of the interlayer insulating film 313a, corresponding to regions in which the reflection films 314 are provided. The recessed portions 314ca will be described along with the reflection films 314.

—Reflection Film 314—

Similar to the reflection films 114 of the organic EL display device 100 of the first embodiment, the reflection films 314 are formed between the interlayer insulating film 313a and the planarization film 313b, corresponding to the non-light emission region N. The reflection films 314 are disposed to reflect toward the sealing substrate a portion of light generated in each organic EL layer 315b which is diffused in a diagonal direction into the non-light emission region N so that the light is transmitted through the separation wall portion 316 and the sealing substrate 320 to be viewed as an image on the sealing substrate. The reflection films 314 are formed in an island-like pattern, each corresponding to one of the light emission regions $P_R$, $P_G$, and $P_B$.

A plurality of recessed portions 314c are formed on surfaces of the reflection films 314, corresponding to the recessed portions 314ca provided on the surface of the interlayer insulating film 313a. The recessed portions 314c each have, for example, a circular shape whose cross-section has a diameter of about 10 μm and a depth of about 1 μm. The recessed portions 314c are arranged with a spacing of about 5

μm between each recessed portion. Note that the recessed portions 314c each have a cross-section having, for example, a rectangular shape, in addition to the circular shape.

Note that the surface of the reflection film 314 may be caused to be uneven by providing a plurality of recessed portions on the surface of the reflection film 314. Alternatively, for example, the surface of the reflection film 314 may be caused to be uneven by providing a plurality of grooves which are arranged side by side, extending in the length and width directions.

—Planarization Film 313b—

The planarization film 313b is provided on the entire surface of the substrate, covering the interlayer insulating film 313a and the reflection films 314. Because the planarization film 313b is provided to cover the reflection films 314, the insulating layer 313 can have a flat surface without unevenness which would otherwise be caused by the reflection films 314.

<Method for Manufacturing Organic EL Display Device 300>

Next, a method for manufacturing the organic EL display device 300 will be described. The manufacturing method of the organic EL display device 300 includes an organic EL substrate forming step followed by a substrate bonding step.

(Organic EL Substrate Forming Step)

—TFT and Interlayer Insulating Film 313a—

The TFTs and the interlayer insulating film 313a are formed on the organic EL substrate body 311 in a manner similar to that of the first embodiment. The recessed portions 314ca are formed by halftone exposure, corresponding to regions of the interlayer insulating film 313a in which the reflection films 314 are to be formed.

—Reflection Film 314—

Next, an Al film etc. is formed by, for example, sputtering etc., and then exposed and developed by photolithography, and patterned by etching, to form the reflection films 314 corresponding to the non-light emission region N. In this case, the recessed portions 314c are formed on the surface of the reflection film 314, corresponding to the recessed portions 314ca formed on the interlayer insulating film 313a.

—Planarization Film 313b—

Next, for example, a photosensitive acrylic film is applied by spin coating etc., and then exposed and developed, to form the planarization film 313b having a flat surface.

—Lower Electrode 315a-Upper Electrode 315c—

The steps of forming, on the planarization film 313b, the lower electrodes 315a, the separation wall portion 316, the organic EL layers 315b, and the upper electrodes 315c are similar to those of the first embodiment.

(Substrate Bonding Step)

Finally, the organic EL substrate 310 and the sealing substrate 320 thus obtained are bonded together to obtain the organic EL display device 300.

Figure 40:
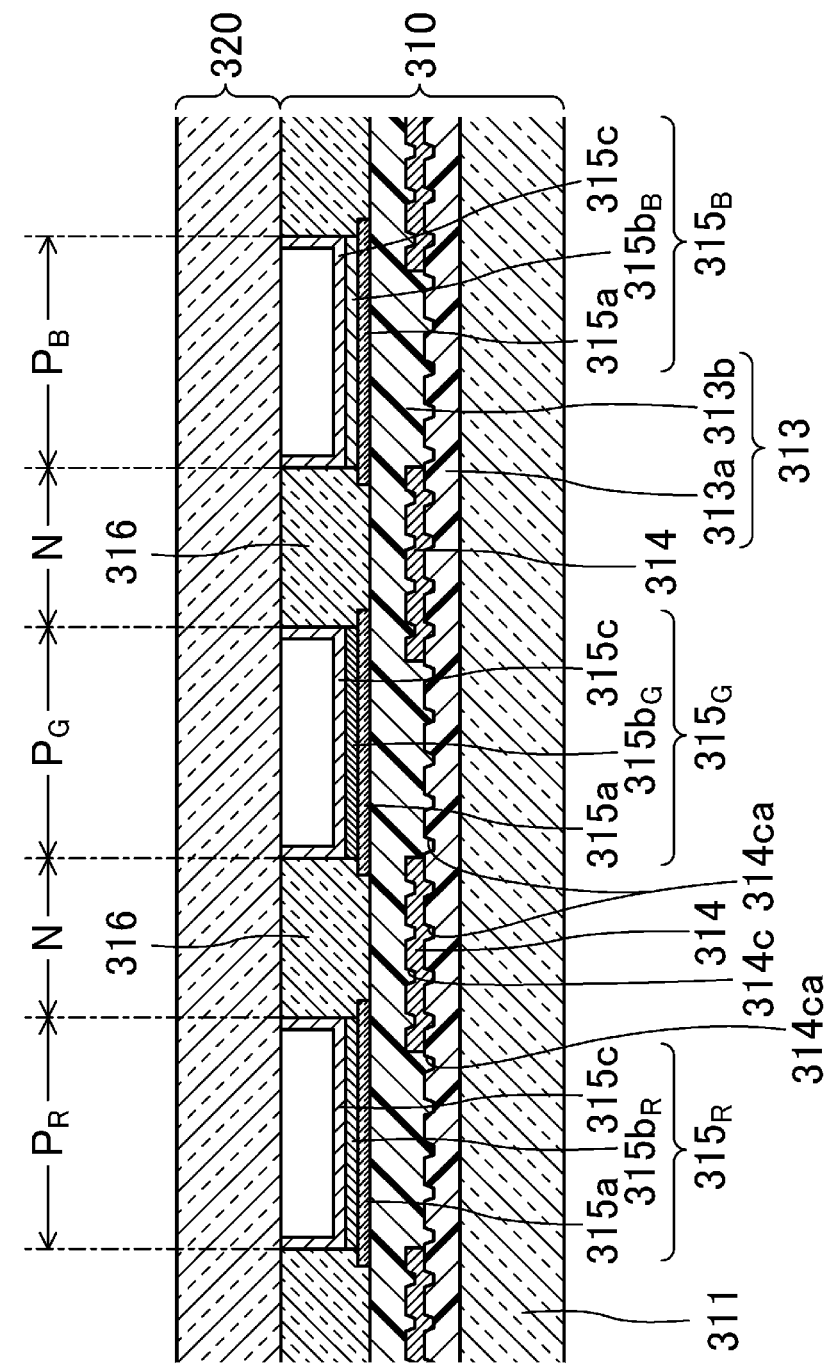
[FIG. 40]

Note that, in the step of forming the recessed portions 314ca on the interlayer insulating film 313a, the recessed portions 314ca may be formed in other regions in addition to the regions in which the reflection films 314 are to be formed. For example, as shown in FIG. 40, a plurality of recessed portions 314ca may be formed on an entire surface of the interlayer insulating film 313a. As a result, a simpler exposure pattern can be used to form the recessed portions 314ca by halftone exposure. When the interlayer insulating film 313a and the planarization film 313b are each formed of a material having the same refractive index, then even if a plurality of recessed portions 314ca are formed on an entire surface of the interlayer insulating film 313a, the planarization film 313b is formed to cover the interlayer insulating film 313a, and therefore, the loss of light does not occur at an interface between the interlayer insulating film 313a and the planarization film 313b, and therefore, display characteristics of the organic EL display device 300 are not affected.

<Operation of Organic EL Display Device 300>

In the organic EL display device 300, the reflection films 314 are formed between the interlayer insulating film 313a and the planarization film 313b, corresponding to the non-light emission region N. The reflection films 314 are disposed to efficiently reflect toward the sealing substrate 320 a portion of light generated in each organic EL layer 315b which is diffused into the non-light emission region N so that the portion of the light is transmitted through the separation wall portion 316 and the sealing substrate 320 to be viewable as an image on the sealing substrate. Therefore, while light generated in the organic EL layers 315b is propagated toward the organic EL substrate body 311 to be viewed as an image on the organic EL substrate, a portion of light which is propagated toward the organic EL substrate body 311 and is diffused in a diagonal direction into the non-light emission region N is reflected by the reflection films 314 to enter the separation wall portion 316. In this case, because the recessed portions 314c are formed on the surface of the reflection films 314, light is diffused and reflected by the reflection films 314 to enter the separation wall portion 316. Thereafter, the light entering the separation wall portion 316 is transmitted through the separation wall portion 316 without being blocked to enter the sealing substrate 320, and therefore, is viewed from the outside as an image on the sealing substrate. In other words, by driving a single panel, an image can be displayed on both sides thereof, i.e., the organic EL substrate and the sealing substrate.

<Advantages of Third Embodiment>

Advantages of the organic EL display device 300 will be described below.

In the organic EL display device 300 of this embodiment, an image displayed on the sealing substrate is formed using light which is emitted in a diagonal direction from the organic EL elements 315. Therefore, similar to the organic EL display device 100 of the first embodiment, the light emitted in a diagonal direction is used to display an image on the sealing substrate, and therefore, even when double-sided display is performed, the light emission luminance of display on the organic EL substrate is not likely to significantly decrease, and the power consumption is not likely to increase. In addition, it is not likely that the light emission regions $P_R$, $P_G$, and $P_B$ are blocked by the reflection films 314 and therefore the display luminance of the organic EL substrate significantly decreases.

In this case, light is transmitted through the separation wall portion 316 corresponding to the non-light emission region N to the sealing substrate 320 to be viewed as an image on the sealing substrate. Therefore, similar to the organic EL display device 100 of the first embodiment, an image can be displayed with high display quality on the sealing substrate 320 as well.

Therefore, in the organic EL display device 300, an image can be displayed on both the organic EL substrate and the sealing substrate with high display quality and without an increase in power consumption.

Similar to the organic EL display device 100 of the first embodiment, the organic EL display device 300 of the second embodiment has the following advantages in addition to the above advantage.

In the organic EL display device 300, similar to the organic EL display device 100 of the first embodiment, light does not travel in a gas, and therefore, the loss of the light can be reduced or prevented. In the organic EL display device 300, even though an image is displayed on the sealing substrate, the problem that the color purity or luminance varies depending on the viewing angle due to the microcavity effect, does not arise.

In addition to the advantages of the organic EL display device 100 of the first embodiment, advantages peculiar to the organic EL display device 300 are as follows.

In the organic EL display device 300, the recessed portions 314c are provided on the surfaces of the reflection films 314. Therefore, when a portion of light generated in each organic EL layer 315b which is emitted in a diagonal direction is reflected by the corresponding reflection film 314, the light is reflected toward the sealing substrate 320 while being scattered by the recessed portions 314c. If the reflection film has a flat surface, light traveling toward the reflection film is reflected at a reflection angle which is equal to the incident angle. In this case, the reflected light contains many components traveling in a diagonal direction with respect to the substrate. Light reflected by the reflection film 314 is scattered by the recessed portions 314c, and therefore, contains many components traveling in a front direction with respect to the substrate. Therefore, the recessed portions 314c formed on the reflection film 314 provide more excellent viewing angle characteristics of display on the sealing substrate.

Even when the recessed portions 314c are formed on the reflection films 314 of the organic EL display device 300, the planarization film 313b is provided to cover the interlayer insulating film 313a and the reflection films 314, and has a flat surface. Therefore, it is easy to control the thickness of each of the organic EL elements 315, resulting in the highly reliable organic EL elements 315.

<<Fourth Embodiment>>

Firstly, an organic EL display device 400 according to a fourth embodiment will be described.

<Configuration of Organic EL Display Device 400>

Firstly, a configuration of the organic EL display device 400 will be described. The organic EL display device 400 is a display which displays an RGB full color image on both front and back sides thereof. The organic EL display device 400 is used, for example, as a display including a single display panel which serves as both a primary screen (main display) and a secondary screen (sub-display), in a mobile device (a mobile telephone, a multimedia player, etc.) which has a primary screen (main display) and a secondary screen (sub-display), or a display (an advertising display panel etc.) which displays an image on both front and back sides thereof.

As in the first embodiment, the organic EL display device 400 includes a flat panel-like organic EL substrate 410 and sealing substrate 420 which face each other.

Figure 41:
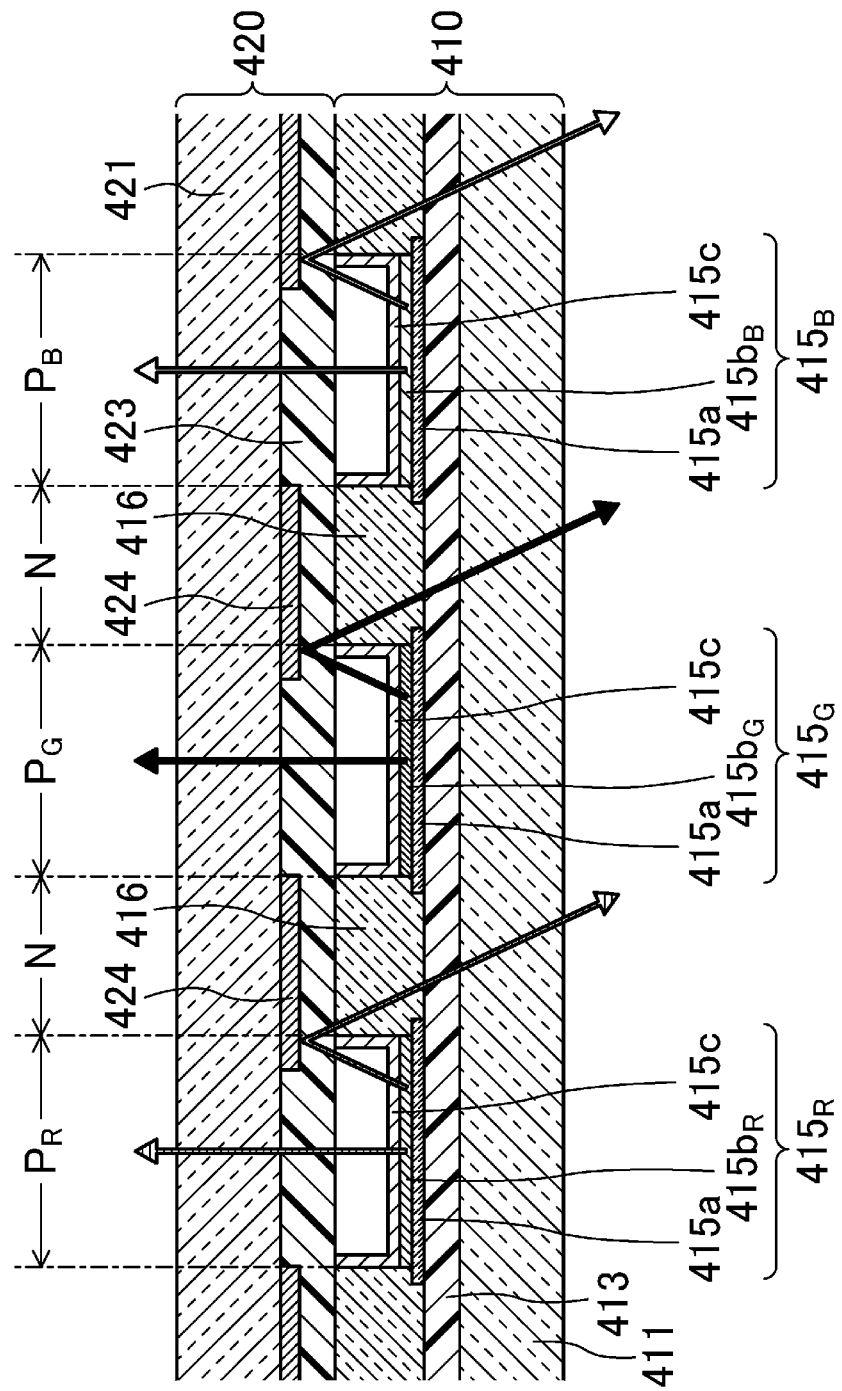
[FIG. 41]

FIG. 41 is a cross-sectional view of a display region D of the organic EL display device 400. The organic EL display device 400 includes a plurality of red light emission regions $P_R$, green light emission regions $P_G$, and blue light emission regions $P_B$. A predetermined image is displayed in the entire display region D by the light emission regions $P_R$, $P_G$, and $P_B$ being driven independently of each other. A grid-like region other than the light emission regions $P_R$, $P_G$, and $P_B$ is a non-light emission region N.

—Organic EL Substrate 410—

The organic EL substrate 410 includes, on an organic EL substrate body 411, a plurality of TFTs each provided as a switching element for a corresponding one of the light emission regions $P_R$, $P_G$, and $P_B$, an insulating layer 413 which covers the organic EL substrate body 411 and the TFTs, a plurality of red light emission organic EL elements $415_R$, green light emission organic EL elements $415_G$, and blue light emission organic EL elements $415_B$ provided on the insulating layer 413, corresponding to the red light emission regions $P_R$, the green light emission regions $P_G$, and the blue light emission regions $P_B$, and a separation wall portion 416 formed in a grid-like pattern, corresponding to the non-light emission region N, to separate the organic EL elements $415_R$, $415_G$, and $415_B$ from each other. Note that, in the description that follows and the drawings, the red light emission organic EL elements $415_R$, the green light emission organic EL elements $415_G$, and the blue light emission organic EL elements $415_B$ may also be collectively referred to as organic EL elements 415. The organic EL substrate body 411, the TFTs, and the separation wall portion 416 have configurations similar to those of the first embodiment.

—Insulating Layer 413—

The insulating layer 413 is provided on the organic EL substrate body 411, covering the organic EL substrate body 411 and the TFTs. The insulating layer 413 is formed of, for example, a transparent insulating resin, such as a photosensitive acrylic resin etc. The insulating layer 413 may be formed of a single film or a plurality of films. The insulating layer 413 is formed to have a flat surface.

—Organic EL Element 415—

The organic EL element 415 includes a lower electrode 415a, an organic EL layer 415b, and an upper electrode 415c which are successively formed on top of one another (the lower electrode 415a is the closest to the organic EL substrate body 411). Note that, in the red light emission organic EL element $415_R$, a red light emission organic EL layer $415b_R$ is provided as the organic EL layer 415b. In the green light emission organic EL element $415_G$, a green light emission organic EL layer $415b_G$ is provided as the organic EL layer 415b. In the blue light emission organic EL element $415_B$, a blue light emission organic EL layer $415b_B$ is provided as the organic EL layer 415b. Note that, in the description that follows and the drawings, the red light emission organic EL layer $415b_R$, the green light emission organic EL layer $415b_G$, and the blue light emission organic EL layer $415b_B$ may also be collectively referred to as the organic EL layers 415b.

Specifically, the organic EL layer 415b includes a hole transporting layer, a light emitting layer, and an electron injection layer which are successively formed on top of one another (the hole transporting layer is the closest to the upper electrode 415c). When a voltage is applied between the lower electrode 415a and the upper electrode 415c, electrons are injected from the lower electrode 415a through the electron injection layer into the light emitting layer, while holes are injected from the upper electrode 415c through the hole transporting layer into the light emitting layer. The electrons and holes recombine in the light emitting layer to emit light.

—Lower Electrode 415a—

The lower electrode 415a is preferably formed of a material having a low work function, such as a metal material (e.g., silver (Ag), aluminum (Al), vanadium (V), cobalt (Co), nickel (Ni), tungsten (W), calcium (Ca), titanium (Ti), yttrium (Y), sodium (Na), ruthenium (Ru), manganese (Mn), indium (In), magnesium (Mg), lithium (Li), ytterbium (Yb), etc.), an alloy (e.g., lithium fluoride (LiF)/calcium (Ca)/aluminum (Al), etc.), etc. The lower electrode 415a is electrically connected to the drain electrode so that a potential is applied thereto from the TFT.

—Organic EL Layer 415b—

The hole transporting layer, the light emitting layer, and the electron injection layer are each formed of a material similar to that illustrated for the organic EL display device 100 of the first embodiment.

—Upper Electrode 415c—

The upper electrodes 415c each cover the correspond one of the organic EL layers 415b. The upper electrode 415c is formed of a light transmissive material, such as a material having a high work function (e.g., indium oxide-tin oxide alloy (ITO), indium oxide-zinc oxide alloy ($In_2O_3$—ZnO), zinc oxide (ZnO), etc.), etc. A predetermined common potential is applied to the upper electrodes 415c.

—Sealing Substrate 420—

The sealing substrate 420 includes, on a surface closer to the organic EL substrate 410 of a sealing substrate body 421 formed of a glass substrate etc., reflection films 424 corresponding to the non-light emission region N, and an insulating layer 423 covering the sealing substrate body 421 and the reflection films 424.

—Reflection Film 424—

The reflection films 424 are formed on the sealing substrate body 421, corresponding to the non-light emission region N. The reflection films 424 are disposed to reflect toward the organic EL substrate 410 a portion of light generated in each organic EL layer 415b which is diffused in a diagonal direction into the non-light emission region N so that the light is transmitted through the separation wall portion and the organic EL substrate body to be viewable as an image on the organic EL substrate. The reflection films 424 are formed of, for example, a light reflective metal film (e.g., an Al film etc.) etc. The reflection films 424 each have a thickness of, for example, about 100 nm.

Similar to the reflection films 114 of the first embodiment, the reflection films 424 are formed in an island-like pattern, corresponding to the light emission regions $P_R$, $P_G$, and $P_B$ (see FIG. 7).

—Insulating Layer 423—

The insulating layer 423 is provided on the organic EL substrate body 411, covering the organic EL substrate body 411 and the reflection films 424. The insulating layer 423 is formed of, for example, a transparent insulating resin, such as a photosensitive acrylic resin etc. The insulating layer 423 may be formed of a single film or a plurality of films. The insulating layer 423 is formed to have a flat surface.

<Method for Manufacturing Organic EL Display Device 400>

Next, a method for manufacturing the organic EL display device 400 will be described. The manufacturing method of the organic EL display device 400 includes an organic EL substrate forming step and a sealing substrate forming step followed by a substrate bonding step.

(Organic EL Substrate Forming Step)

—TFT and Insulating Layer 413—

The TFTs and the insulating layer 413 are formed on the organic EL substrate body 411 in a manner similar to that of the first embodiment.

—Lower Electrode 415a-Organic EL Layer 415b—

Next, the lower electrodes 415a are formed by a known technique. Thereafter, the separation wall portion 416 and the organic EL layers 415b are formed in a manner similar to that of the first embodiment.

—Upper Electrode 415c—

Next, an ITO film is formed by a known technique on the entire surface, covering the organic EL layers 415b and the separation wall portion 416. Thereafter, the ITO film attached to the top of the separation wall portion 416 is removed, for example, using an adhesive roller to form the upper electrodes 415c corresponding to the light emission regions $P_R$, $P_G$, and $P_B$. The organic EL substrate 110 is thus produced. Note that an ITO film may be formed only on the desired region using an opening mask to form the upper electrodes 415c.

(Sealing Substrate Forming Step)

—Reflection Film 424—

Next, the sealing substrate body 421 is prepared. An Al film etc. is formed on the sealing substrate body 421 by, for example, sputtering etc., and then exposed and developed by photolithography, and patterned by etching, to form the reflection films 424 corresponding to the non-light emission region N.

—Insulating Layer 423—

Next, for example, a photosensitive acrylic film is applied by spin coating etc., and exposed and developed, to form the insulating layer 423 covering the sealing substrate body 421 and the reflection films 424. As a result, the sealing substrate 420 is obtained.

(Substrate Bonding Step)

Finally, in an inert gas atmosphere, the organic EL substrate 410 and the sealing substrate 420 are disposed to face each other, and bonded together with a sealing resin for bonding which is applied in a frame-like region of the substrate. In this case, the organic EL substrate 410 and the sealing substrate 420 are accurately positioned so that the light emission regions $P_R$, $P_G$, and $P_B$ are not misaligned between the organic EL substrate 410 and the sealing substrate 420. The organic EL display device 400 is thus produced.

<Operation of Organic EL Display Device 400>

In the organic EL display device 400, the upper electrodes 415c of the organic EL elements 415 are formed of a light transmissive material, and the lower electrodes 415a are formed of a light reflective material. Therefore, light generated in the organic EL layers 415b is extracted through the upper electrodes 415c to be viewed on the sealing substrate. On the other hand, the reflection films 424 are formed on a surface closer to the organic EL substrate 410 of the sealing substrate 420, corresponding to the non-light emission region N. The reflection films 424 are disposed to reflect toward the organic EL substrate 410 a portion of light generated in each organic EL layer 415b which is diffused into the non-light emission region N so that the portion of the light is transmitted through the separation wall portion 416 and the organic EL substrate body 411 to be viewed as an image on the organic EL substrate. Therefore, a portion of light generated in each organic EL layer 415b which is propagated toward the sealing substrate 420 and is diffused in a diagonal direction into the non-light emission region N is reflected by the corresponding reflection film 424 to enter the separation wall portion 416. The light entering the separation wall portion 416 is transmitted through the separation wall portion 416 without being blocked to enter the organic EL substrate body 411, and therefore, is viewed from the outside as an image on the organic EL substrate. In other words, by driving a single panel, an image can be displayed on both sides thereof, i.e., the organic EL substrate and the sealing substrate.

<Advantages of Fourth Embodiment>

Advantages of the organic EL display device 400 will be described below.

In the organic EL display device 400 of this embodiment, an image displayed on the organic EL substrate is formed using light which is emitted in a diagonal direction from the organic EL elements 415. Therefore, as in the first embodiment, even when double-sided display is performed, the light emission luminance of display on the sealing substrate is not likely to significantly decrease, and the power consumption is not likely to increase. In addition, it is not likely that the light emission regions $P_R$, $P_G$, and $P_B$ are blocked by the reflection films 424 and therefore the display luminance of the organic EL substrate significantly decreases.

In this case, light is emitted through the separation wall portion 416 corresponding to the non-light emission region N to the organic EL substrate 411 to be viewed as an image on the organic EL substrate. Therefore, similar to the organic EL display device 100 of the first embodiment, an image can be displayed with high display quality on the organic EL substrate 410 as well.

Therefore, in the organic EL display device 400, an image can be displayed on both the organic EL substrate and the sealing substrate with high display quality and without an increase in power consumption.

In conventional top emission type organic EL display devices which display an image on the sealing substrate, typically, the lower electrode is formed of a light reflective material and the upper electrode is formed of a light semi-transmissive material, and therefore, light is unavoidably multiply reflected between the lower and upper electrodes, leading to the problem that, due to the influence of interference of the light, the color purity or luminance may vary depending on the viewing angle (microcavity effect). Alternatively, the lower electrode may be formed of a light transmissive material and the upper electrode may be formed of a light semi-transmissive material to obtain a double-sided light emitting type organic EL display device. However, irregular luminance is likely to occur due to variations in transmittance or reflectance of the upper electrode. However, in the organic EL display device 400 of this embodiment, the upper electrode 415c may be formed of a light transmissive material, and it is not necessary to take into consideration the influence of the microcavity effect between the lower electrode 415a and the upper electrode 415c. Therefore, the problem that the color purity or luminance varies depending on the viewing angle due to the microcavity effect, does not arise. In addition, the upper electrode 415c is formed of a light transmissive material, and therefore, irregular luminance which is caused due to variations in transmittance or reflectance does not occur.

<Variations of Fourth Embodiment>

Variations of the organic EL display device 400 of the fourth embodiment will be described below.

(Variation 14)

Figure 42:
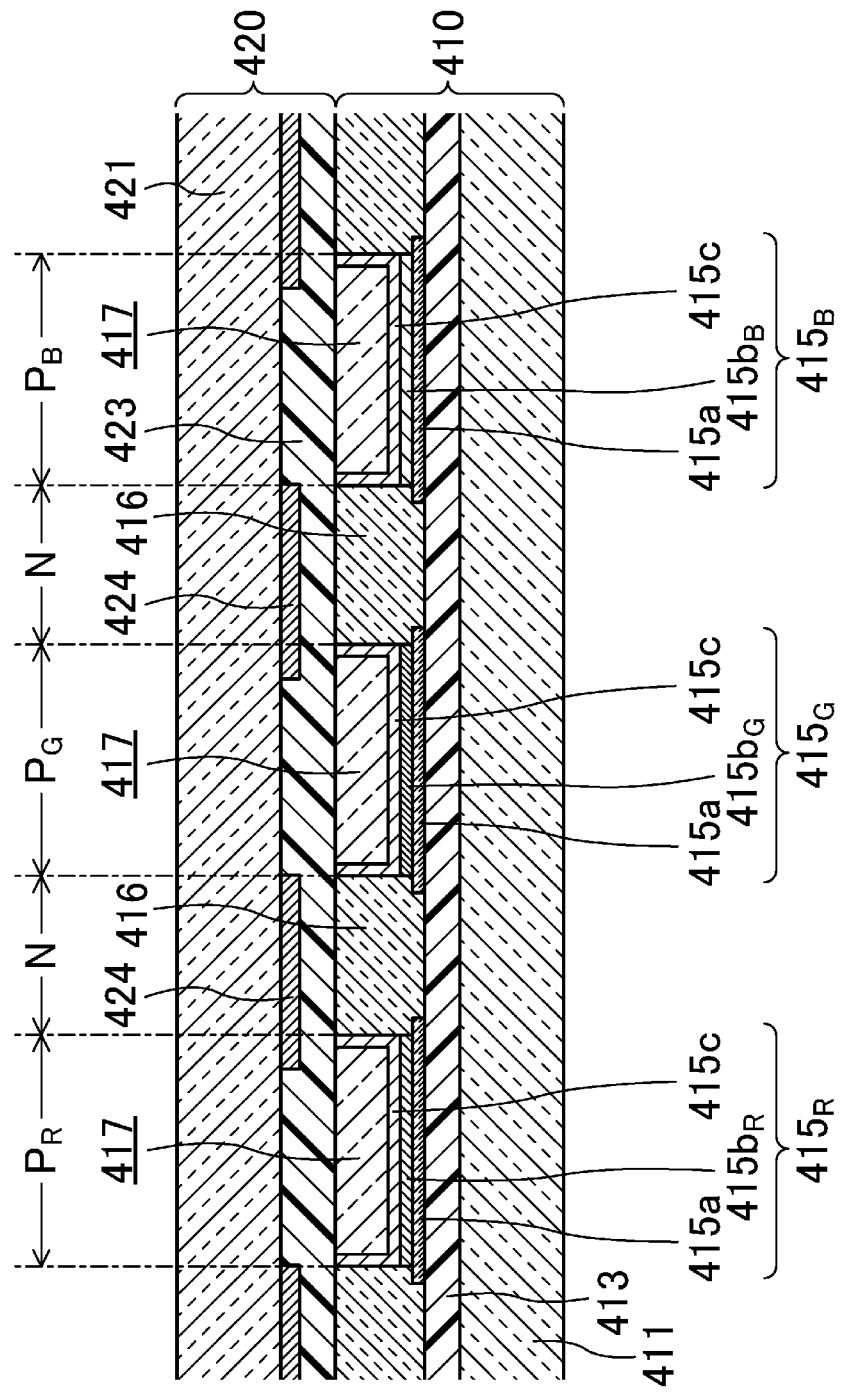
[FIG. 42]

FIG. 42 shows a cross-sectional view of the organic EL display device 400 according to Variation 14. In this organic EL display device 400, in addition to the configuration of the fourth embodiment, a space between the organic EL substrate 410 and the sealing substrate 420 is filled with a transparent resin 417. As a result, when light generated in the organic EL layers 415b is propagated toward the sealing substrate 420, the light does not travel in a gas, and therefore, the loss of the light can be reduced or prevented.

The transparent resin 417 is preferably formed of a material having the same refractive index as that of the insulating layer 423. Such a material is, for example, a solvent-free epoxy resin etc. Note that, in order to reduce or prevent damage to the organic EL elements 415 when the transparent resin 417 is cured by heating or UV light irradiation, a protection film (not shown) is preferably provided to cover the organic EL elements 415. The protection film is formed of, for example, a transparent insulating film, such as a $SiO_x$ film etc.

(Variation 15)

Figure 43:
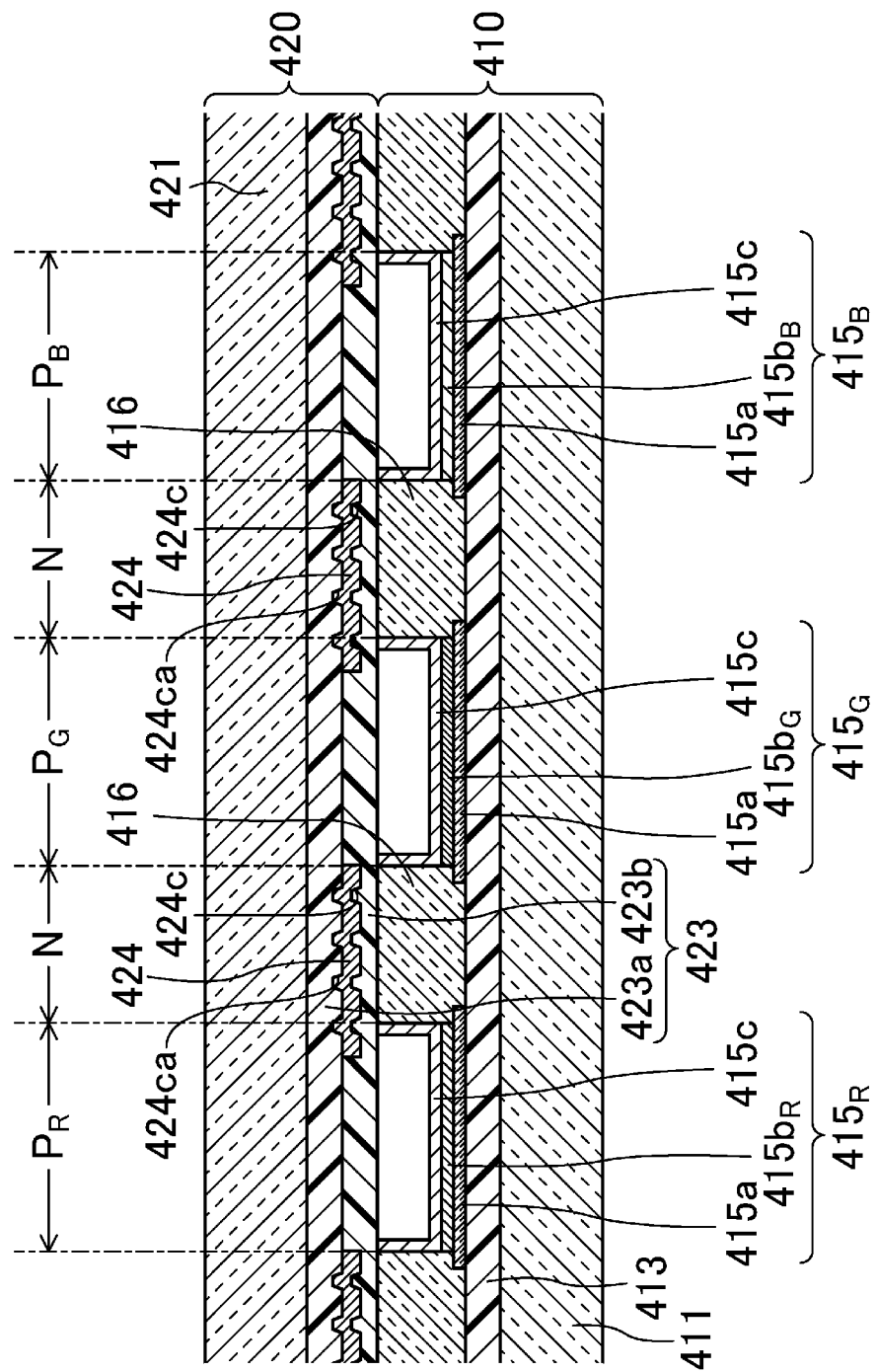
[FIG. 43]
Figure 44:
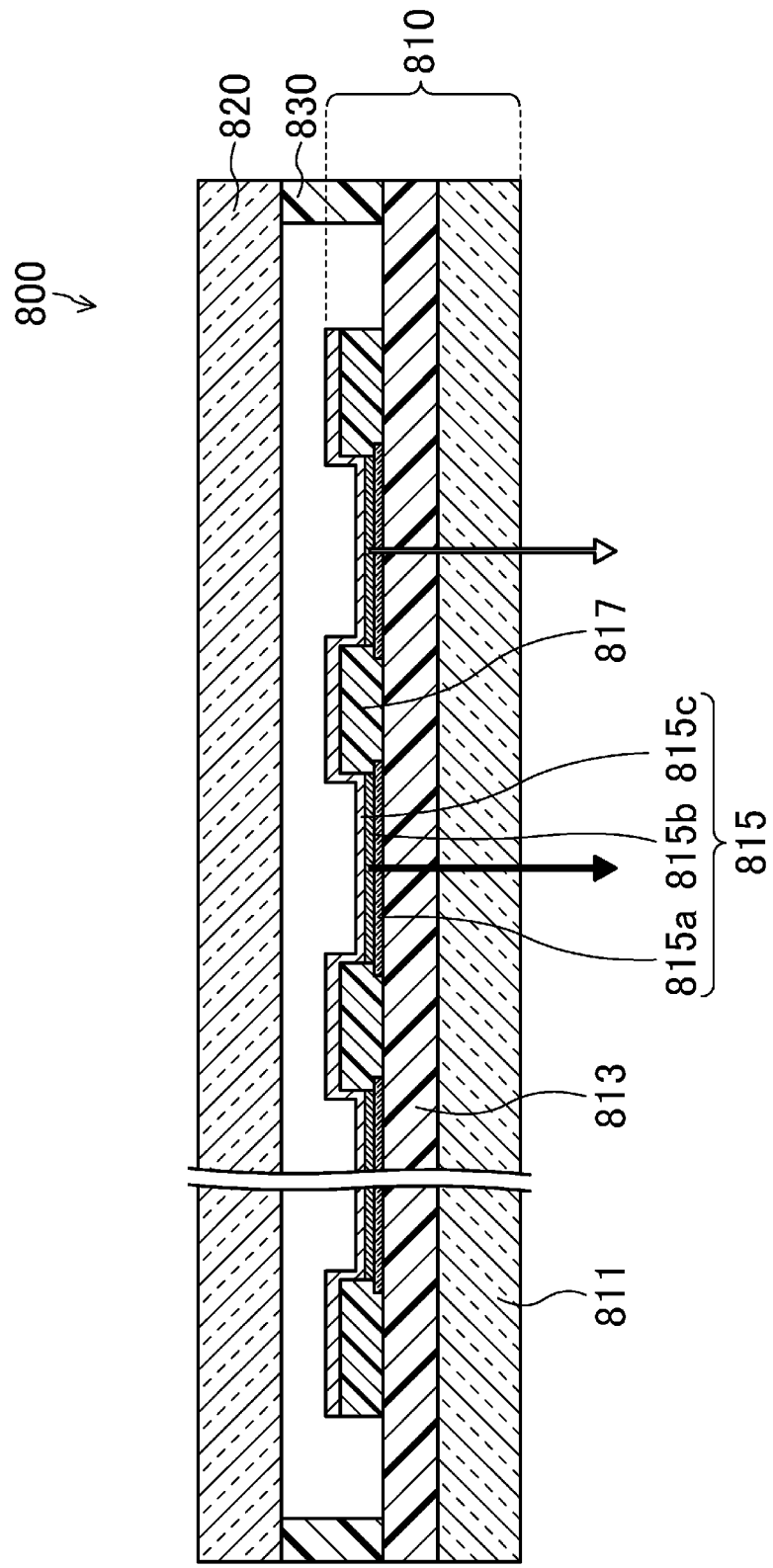
[FIG. 44]
Figure 45:
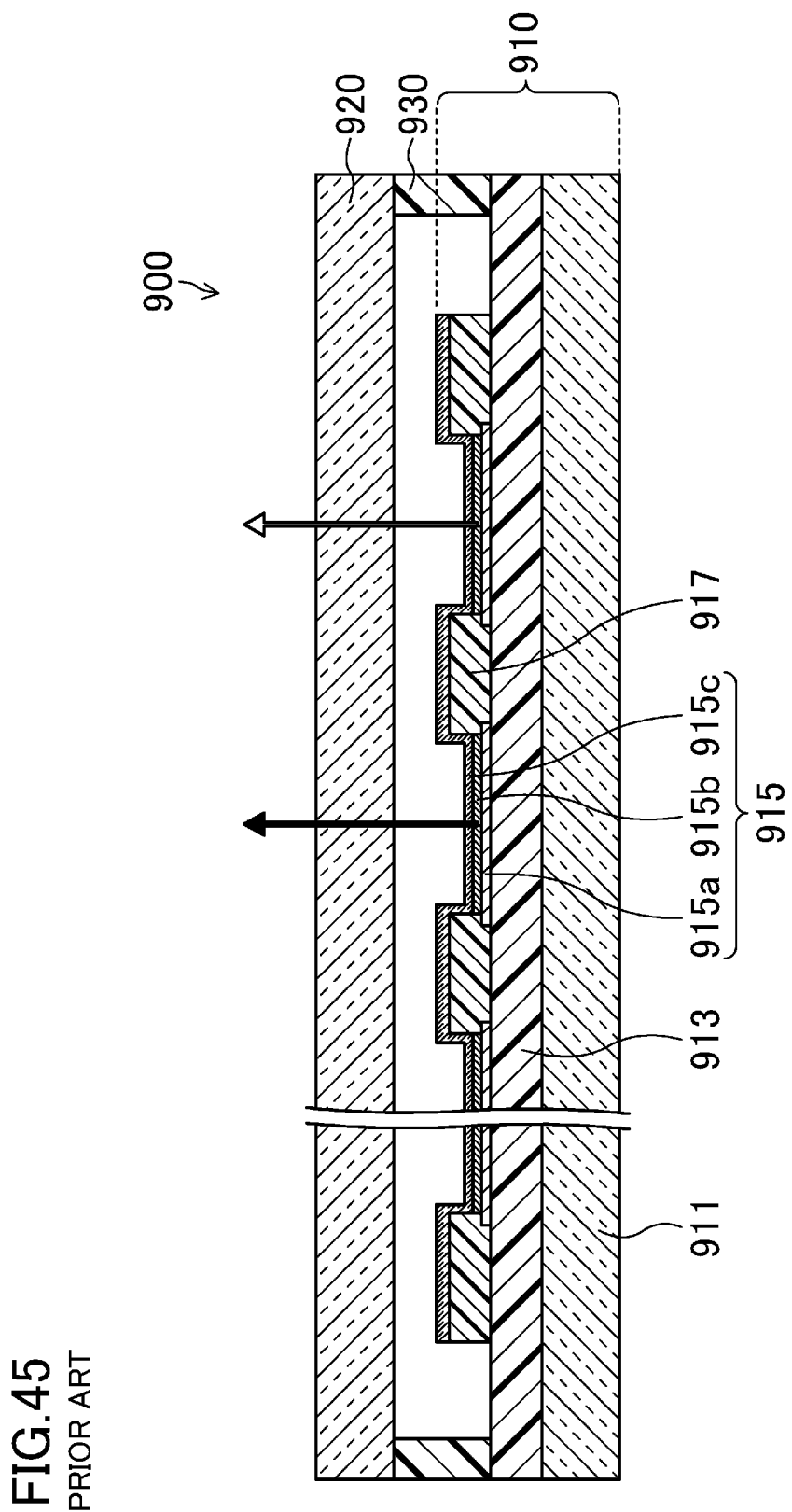
[FIG. 45]

FIG. 43 shows a cross-sectional view of the organic EL display device 400 according to Variation 15. In this organic EL display device 400, a plurality of recessed portions 424c are formed on a surface of each reflection film 424. As a result, as in the third embodiment, when a portion of light generated in each organic EL layer 415b which is emitted in a diagonal direction is reflected by the corresponding reflection film 424, the light is reflected toward the organic EL substrate 410 while being scattered by the recessed portions 424c. Therefore, more excellent viewing angle characteristics of display on the sealing substrate are obtained.

Note that the recessed portions 424c may be formed as follows: a first insulating film 423a is formed on the sealing substrate body 421; a plurality of recessed portions 424ca are formed in regions of a surface of the first insulating film 423a in which the reflection films 424 are to be formed; and thereafter, the reflection films 424 are formed. By forming a second insulating film 423b to cover the reflection films 424 on a surface of which the recessed portions 424c have been formed, the insulating layer 423 is caused to have a flat surface.

INDUSTRIAL APPLICABILITY

The present invention is useful for double-sided display type organic EL display devices which display an image on both sides of a panel thereof, and methods for manufacturing such display devices.

Description of Reference Characters

D DISPLAY REGION
F NON-DISPLAY REGION
$P_R$ RED LIGHT EMISSION REGION
$P_G$ GREEN LIGHT EMISSION REGION
$P_B$ BLUE LIGHT EMISSION REGION
100, 200, 300, 400 ORGANIC EL DISPLAY DEVICE
110, 210, 310, 410 ORGANIC EL SUBSTRATE
111, 211, 310, 411 ORGANIC EL SUBSTRATE BODY
112 TFT (SWITCHING ELEMENT)
113, 213, 313, 413 INSULATING LAYER
113a, 213a, 313a INTERLAYER INSULATING FILM (FIRST INSULATING FILM)
113b, 213b, 313b PLANARIZATION FILM (SECOND INSULATING FILM)
114, 214, 314, 424 REFLECTION FILM
115a, 215a, 315a, 415a LOWER ELECTRODE
115b, 215b, 315b, 415b ORGANIC EL LAYER
115c, 215c, 315c, 415c UPPER ELECTRODE
116, 216, 316, 416 SEPARATION WALL PORTION
120, 220, 320, 420 SEALING SUBSTRATE
$216_G$ GREEN CONVERSION PORTION
$216_R$ RED CONVERSION PORTION
$216_S$ TRANSPARENT RESIN PORTION
314c RECESSED PORTION
417 TRANSPARENT RESIN

The invention claimed is:

1. An organic EL display device comprising an organic EL substrate having a plurality of light emission regions arranged in a matrix, and a sealing substrate, the organic EL substrate and the sealing substrate facing each other, and having a frame-like non-display region provided at a circumferential portion of the substrates, and a display region provided on an inner side of the frame-like non-display region,
wherein
the organic EL substrate includes
an organic EL substrate body,
a plurality of switching elements provided on the organic EL substrate body, each corresponding to one of the plurality of light emission regions,
an insulating layer covering the organic EL substrate body and the plurality of switching elements and having a flat surface, a plurality of lower electrodes of a light transmissive material provided on the insulating layer, each corresponding to one of the plurality of light emission regions, a separation wall portion of a light transmissive material provided on the insulating layer, corresponding to a region other than the light emission regions, and configured to separate the plurality of light emission regions from each other, a plurality of organic EL layers each covering a corresponding one of the plurality of lower electrodes, and an upper electrode of a light reflective material covering the plurality of organic EL layers, and light generated in the organic EL layers is propagated to the organic EL substrate body to be viewed as an image on the organic EL substrate, the insulating layer includes a first insulating film and a second insulating film provided thereabove, there are a plurality of the upper electrodes each covering a corresponding one of the plurality of organic EL layers, and a reflection film is provided between the first and second insulating films, corresponding to the region other than the light emission regions, and is configured to reflect toward the sealing substrate a portion of light generated in each of the organic EL layers which is diffused into the region other than the light emission regions so that the portion of the light is transmitted through the separation wall portion and the sealing substrate to be viewable as an image on the sealing substrate.

2. The organic EL display device of claim 1, wherein the reflection film overlaps a circumferential portion of each of the light emission regions.

3. The organic EL display device of claim 1, wherein the separation wall portion functions as a spacer which is in contact with and supports the sealing substrate.

4. The organic EL display device of claim 1, wherein the first and second insulating films are each formed of a material having the same refractive index.

5. The organic EL display device of claim 1, wherein the plurality of light emission regions include red light emission regions configured to emit red light, green light emission regions configured to emit green light, and blue light emission regions configured to emit blue light.

6. The organic EL display device of claim 1, wherein the plurality of light emission regions include blue light emission regions, the separation wall portion includes
a red conversion portion configured to convert blue light transmitted through the separation wall portion into red light,
a green conversion portion configured to convert blue light transmitted through the separation wall portion into green light, and
a transparent resin portion configured not to convert a wavelength of light transmitted through the separation wall portion, and blue light generated in the organic EL layers is propagated to the organic EL substrate body to be viewed as a monochromatic image on the organic EL substrate, and a portion of the blue light which is diffused into the region other than the light emission regions is reflected by the reflection film toward the sealing substrate, and is then transmitted through the red and green conversion portions and the transparent resin portion to provide red, green, and blue light, respectively, which are then transmitted through the sealing substrate to be viewed as an RGB full color image on the sealing substrate.

7. The organic EL display device of claim 1, wherein the reflection film has an uneven surface.

8. The organic EL display device of claim 7, wherein the uneven surface is formed by recessed portions provided on the reflection film.

9. A method for manufacturing the organic EL display device of claim 1, the method comprising:

an organic EL substrate forming step of producing the organic EL substrate by
forming the plurality of switching elements on the organic EL substrate body, each corresponding to one of the plurality of light emission regions,
forming the first insulating layer covering the organic EL substrate body and the plurality of switching elements,
forming the reflection film on the first insulating film, corresponding to a region other than the light emission regions,
forming the second insulating film covering the first insulating film and the reflection film and having a flat surface,
forming the plurality of lower electrodes on the second insulating film, each corresponding to one of the plurality of light emission regions,
forming the separation wall portion on the second insulating film, corresponding to the region other than the light emission regions, to separate the plurality of light emission regions from each other,
forming the plurality of organic EL layers each covering a corresponding one of the plurality of lower electrodes, and
forming the plurality of upper electrodes each covering a corresponding one of the plurality of organic EL layers, and a substrate bonding step of disposing the organic EL substrate produced by the organic EL substrate forming step and the sealing substrate to face each other, and bonding the organic EL substrate and the sealing substrate together at the non-display region, wherein in the organic EL substrate forming step, the reflection film is formed so that a portion of light generated in each of the organic EL layers which is diffused into the region other than the light emission regions is reflected by the reflection film, and is then transmitted through the separation wall portion and the sealing substrate to be viewed as an image on the sealing substrate.

10. The method of claim 9, wherein
in the organic EL substrate forming step, the reflection film is formed to overlap a circumferential portion of each of the light emission regions.

11. The method of claim 9, wherein
in the substrate bonding step, the sealing substrate and the organic EL substrate are disposed to face each other so that the separation wall portion is in contact with and supports the sealing substrate.

12. The method of claim 9, wherein
in the organic EL substrate forming step,
after the formation of the first insulating film, a recessed portion is formed on at least a surface of a region in which the reflection film is to be formed, and
after the formation of the recessed portion, the reflection film is formed on top of the recessed portion formed on the surface of the first insulating film, whereby the reflection film having a recessed portion on a surface thereof is formed.

13. The method of claim 12, wherein
a plurality of recessed portions are formed on the entire surface of the first insulating film.

14. An organic EL display device comprising an organic EL substrate having a plurality of light emission regions arranged in a matrix, and a sealing substrate, the organic EL substrate and the sealing substrate facing each other, and having a frame-like non-display region provided at a circumferential portion of the substrates, and a display region provided on an inner side of the frame-like non-display region, wherein
the organic EL substrate includes
an organic EL substrate body,
a plurality of switching elements provided on the organic EL substrate body, each corresponding to one of the plurality of light emission regions,
an insulating layer covering the organic EL substrate body and the plurality of switching elements and having a flat surface,
a plurality of lower electrodes of a light reflective material provided on the insulating layer, each corresponding to one of the plurality of light emission regions,
a separation wall portion of a light transmissive material provided on the insulating layer, corresponding to a region other than the light emission regions, and configured to separate the plurality of light emission regions from each other,
a plurality of organic EL layers each covering a corresponding one of the plurality of lower electrodes, and
an upper electrode of a light transmissive material or a light semi-transmissive material covering the plurality of organic EL layers, and
light generated in the organic EL layers is propagated to the sealing substrate to be viewed as an image on the sealing substrate,
there are a plurality of the upper electrodes each covering a corresponding one of the plurality of organic EL layers, and
a reflection film is provided on a surface closer to the organic EL substrate of the sealing substrate, corresponding to the region other than the light emission regions, and is configured to reflect toward the organic EL substrate a portion of light generated in each of the organic EL layers which is diffused into the region other than the light emission regions so that the portion of the light is transmitted through the separation wall portion and the organic EL substrate body to be viewable as an image on the organic EL substrate.

15. The organic EL display device of claim 14, wherein the upper electrode is formed of a light transmissive material.

16. The organic EL display device of claim 14, wherein the reflection film overlaps a circumferential portion of each of the light emission regions.

17. The organic EL display device of claim 14, wherein a space between the organic EL substrate and the sealing substrate is filled with a transparent resin.

* * * * *